United States Patent
Or-Bach et al.

(10) Patent No.: US 9,613,844 B2
(45) Date of Patent: Apr. 4, 2017

(54) 3D SEMICONDUCTOR DEVICE HAVING TWO LAYERS OF TRANSISTORS

(71) Applicant: Monolithic 3D Inc., San Jose, CA (US)

(72) Inventors: Zvi Or-Bach, San Jose, CA (US);
Brian Cronquist, San Jose, CA (US);
Deepak C. Sekar, San Jose, CA (US);
Zeev Wurman, Palo Alto, CA (US);
Israel Beinglass, Sunnyvale, CA (US)

(73) Assignee: Monolithic 3D Inc., San Jose, CA (US)

( * ) Notice: Subject to any disclaimer, the term of this patent is extended or adjusted under 35 U.S.C. 154(b) by 0 days.

(21) Appl. No.: 14/821,683

(22) Filed: Aug. 7, 2015

(65) Prior Publication Data

US 2015/0348945 A1 Dec. 3, 2015

Related U.S. Application Data

(63) Continuation-in-part of application No. 13/492,395, filed on Jun. 8, 2012, now Pat. No. 9,136,153, which
(Continued)

(51) Int. Cl.
*H01L 25/065* (2006.01)
*H01L 23/48* (2006.01)
(Continued)

(52) U.S. Cl.
CPC .......... *H01L 21/6835* (2013.01); *G11C 8/16* (2013.01); *H01L 21/743* (2013.01); *H01L 21/76254* (2013.01); *H01L 21/76898* (2013.01); *H01L 21/8221* (2013.01); *H01L 21/823828* (2013.01); *H01L 21/84* (2013.01); *H01L 23/481* (2013.01); *H01L 23/5252* (2013.01); *H01L 23/544* (2013.01); *H01L 27/0207* (2013.01); *H01L 27/0688* (2013.01); *H01L 27/088* (2013.01); *H01L 27/092* (2013.01); *H01L 27/10* (2013.01); *H01L 27/105* (2013.01); *H01L 27/10802* (2013.01); *H01L 27/10876* (2013.01); *H01L 27/10894* (2013.01); *H01L 27/10897* (2013.01); *H01L 27/11* (2013.01); *H01L 27/112* (2013.01); *H01L 27/1108* (2013.01); *H01L 27/11526* (2013.01); *H01L 27/11529* (2013.01);
(Continued)

(58) Field of Classification Search
CPC ............ H01L 25/0657; H01L 23/5226; H01L 29/401; H01L 29/4175; H01L 25/065–25/074; H01L 21/823425; H01L 27/105–27/11597
See application file for complete search history.

(56) References Cited

U.S. PATENT DOCUMENTS 4,939,568 A * 7/1990 Kato .................... H01L 21/6835
257/686
5,189,500 A * 2/1993 Kusunoki ........... H01L 27/0688
257/72

(Continued)

*Primary Examiner* — Kevin Parendo
(74) *Attorney, Agent, or Firm* — Tran & Associates

(57) ABSTRACT

A 3D semiconductor device, including: a first layer including first transistors; a first interconnection layer interconnecting the first transistors and overlying the first layer; and a second layer including second transistors, where the second layer thickness is less than 2 microns and greater than 5 nm, where the second layer is overlying the first interconnection layer, and where the second layer includes dice lines formed by an etch step.

6 Claims, 71 Drawing Sheets

Related U.S. Application Data is a continuation of application No. 13/273,712, filed on Oct. 14, 2011, now Pat. No. 8,273,610, which is a continuation-in-part of application No. 13/016,313, filed on Jan. 28, 2011, now Pat. No. 8,362,482, which is a continuation-in-part of application No. 12/970,602, filed on Dec. 16, 2010, which is a continuation-in-part of application No. 12/949,617, filed on Nov. 18, 2010, now Pat. No. 8,754,533.

(51) Int. Cl.

| | |
|---|---|
| H01L 21/762 | (2006.01) |
| H01L 29/78 | (2006.01) |
| H01L 27/105 | (2006.01) |
| H01L 21/683 | (2006.01) |
| H01L 23/544 | (2006.01) |
| H01L 27/088 | (2006.01) |
| G11C 8/16 | (2006.01) |
| H01L 21/768 | (2006.01) |
| H01L 21/822 | (2006.01) |
| H01L 21/8238 | (2006.01) |
| H01L 21/84 | (2006.01) |
| H01L 23/525 | (2006.01) |
| H01L 29/423 | (2006.01) |
| H01L 29/66 | (2006.01) |
| H01L 21/74 | (2006.01) |
| H01L 27/02 | (2006.01) |
| H01L 27/06 | (2006.01) |
| H01L 27/092 | (2006.01) |
| H01L 27/10 | (2006.01) |
| H01L 27/108 | (2006.01) |
| H01L 29/788 | (2006.01) |
| H01L 29/792 | (2006.01) |
| H01L 27/11 | (2006.01) |
| H01L 27/112 | (2006.01) |
| H01L 27/11526 | (2017.01) |
| H01L 27/11529 | (2017.01) |
| H01L 27/11551 | (2017.01) |
| H01L 27/11573 | (2017.01) |
| H01L 27/11578 | (2017.01) |
| H01L 27/118 | (2006.01) |
| H01L 27/12 | (2006.01) |
| H01L 23/367 | (2006.01) |
| H01L 23/00 | (2006.01) |
| H01L 25/00 | (2006.01) |

(52) U.S. Cl.
CPC .. *H01L 27/11551* (2013.01); *H01L 27/11573* (2013.01); *H01L 27/11578* (2013.01); *H01L 27/11807* (2013.01); *H01L 27/11898* (2013.01); *H01L 27/1203* (2013.01); *H01L 29/4236* (2013.01); *H01L 29/66272* (2013.01); *H01L 29/66621* (2013.01); *H01L 29/66825* (2013.01); *H01L 29/66833* (2013.01); *H01L 29/66901* (2013.01); *H01L 29/78* (2013.01); *H01L 29/7841* (2013.01); *H01L 29/7843* (2013.01); *H01L 29/7881* (2013.01); *H01L 29/792* (2013.01); *H01L 23/3677* (2013.01); *H01L 24/45* (2013.01); *H01L 24/48* (2013.01); *H01L 25/0655* (2013.01); *H01L 25/0657* (2013.01); *H01L 25/50* (2013.01); *H01L 27/10873* (2013.01); *H01L 27/11206* (2013.01); *H01L 27/1214* (2013.01); *H01L 27/1266* (2013.01); *H01L 2221/68368* (2013.01); *H01L 2223/5442* (2013.01); *H01L 2223/54426* (2013.01); *H01L 2224/131* (2013.01); *H01L 2224/16225* (2013.01); *H01L 2224/16235* (2013.01); *H01L 2224/32145* (2013.01); *H01L 2224/32225* (2013.01); *H01L 2224/45124* (2013.01); *H01L 2224/45147* (2013.01); *H01L 2224/48091* (2013.01); *H01L 2224/48227* (2013.01); *H01L 2224/73204* (2013.01); *H01L 2224/73253* (2013.01); *H01L 2224/73265* (2013.01); *H01L 2224/83894* (2013.01); *H01L 2225/06513* (2013.01); *H01L 2225/06541* (2013.01); *H01L 2225/06558* (2013.01); *H01L 2924/00011* (2013.01); *H01L 2924/01004* (2013.01); *H01L 2924/01013* (2013.01); *H01L 2924/01018* (2013.01); *H01L 2924/01019* (2013.01); *H01L 2924/01029* (2013.01); *H01L 2924/01046* (2013.01); *H01L 2924/01066* (2013.01); *H01L 2924/01068* (2013.01); *H01L 2924/01077* (2013.01); *H01L 2924/01078* (2013.01); *H01L 2924/01322* (2013.01); *H01L 2924/10253* (2013.01); *H01L 2924/10329* (2013.01); *H01L 2924/12032* (2013.01); *H01L 2924/12033* (2013.01); *H01L 2924/12036* (2013.01); *H01L 2924/12042* (2013.01); *H01L 2924/1301* (2013.01); *H01L 2924/1305* (2013.01); *H01L 2924/13062* (2013.01); *H01L 2924/13091* (2013.01); *H01L 2924/1431* (2013.01); *H01L 2924/1434* (2013.01); *H01L 2924/1461* (2013.01); *H01L 2924/1579* (2013.01); *H01L 2924/15311* (2013.01); *H01L 2924/16152* (2013.01); *H01L 2924/19041* (2013.01); *H01L 2924/3011* (2013.01); *H01L 2924/3025* (2013.01); *H01L 2924/30105* (2013.01)

(56) References Cited

U.S. PATENT DOCUMENTS

| | | | | |
|---|---|---|---|---|
| 5,770,483 | A * | 6/1998 | Kadosh | H01L 21/8221 |
| | | | | 257/E21.575 |
| 6,392,253 | B1 * | 5/2002 | Saxena | H01L 27/0688 |
| | | | | 257/347 |
| 6,448,615 | B1 * | 9/2002 | Forbes | G11C 7/065 |
| | | | | 257/350 |
| 7,385,283 | B2 * | 6/2008 | Wu | H01L 21/6835 |
| | | | | 257/668 |
| 7,566,974 | B2 * | 7/2009 | Konevecki | H01L 21/28282 |
| | | | | 257/754 |
| 7,795,619 | B2 * | 9/2010 | Hara | H01L 21/84 |
| | | | | 257/59 |
| 2004/0262635 | A1 * | 12/2004 | Lee | B82Y 10/00 |
| | | | | 257/199 |
| 2004/0262772 | A1 * | 12/2004 | Ramanathan | H01L 24/11 |
| | | | | 257/777 |
| 2006/0170046 | A1 * | 8/2006 | Hara | H01L 21/84 |
| | | | | 257/347 |
| 2008/0124845 | A1 * | 5/2008 | Yu | H01L 21/76898 |
| | | | | 438/143 |
| 2008/0179678 | A1 * | 7/2008 | Dyer | H01L 21/84 |
| | | | | 257/351 |
| 2008/0315253 | A1 * | 12/2008 | Yuan | H01L 21/84 |
| | | | | 257/190 |
| 2009/0079000 | A1 * | 3/2009 | Yamazaki | H01L 23/433 |
| | | | | 257/351 |
| 2009/0224364 | A1 * | 9/2009 | Oh | H01L 21/2007 |
| | | | | 257/532 |
| 2009/0325343 | A1 * | 12/2009 | Lee | H01L 21/2007 |
| | | | | 438/107 |
| 2010/0096730 | A1 * | 4/2010 | Stacey | H01L 21/78 |
| | | | | 257/620 |

* cited by examiner

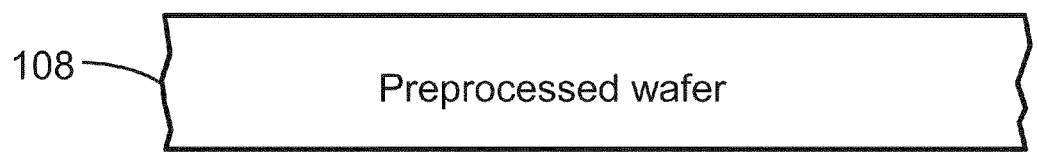
Fig. 1B
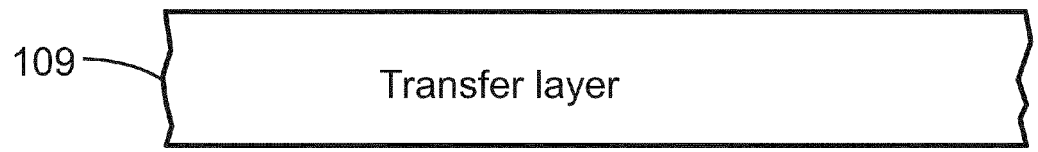
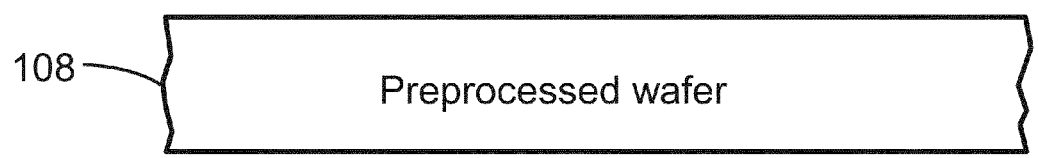
Fig. 1C

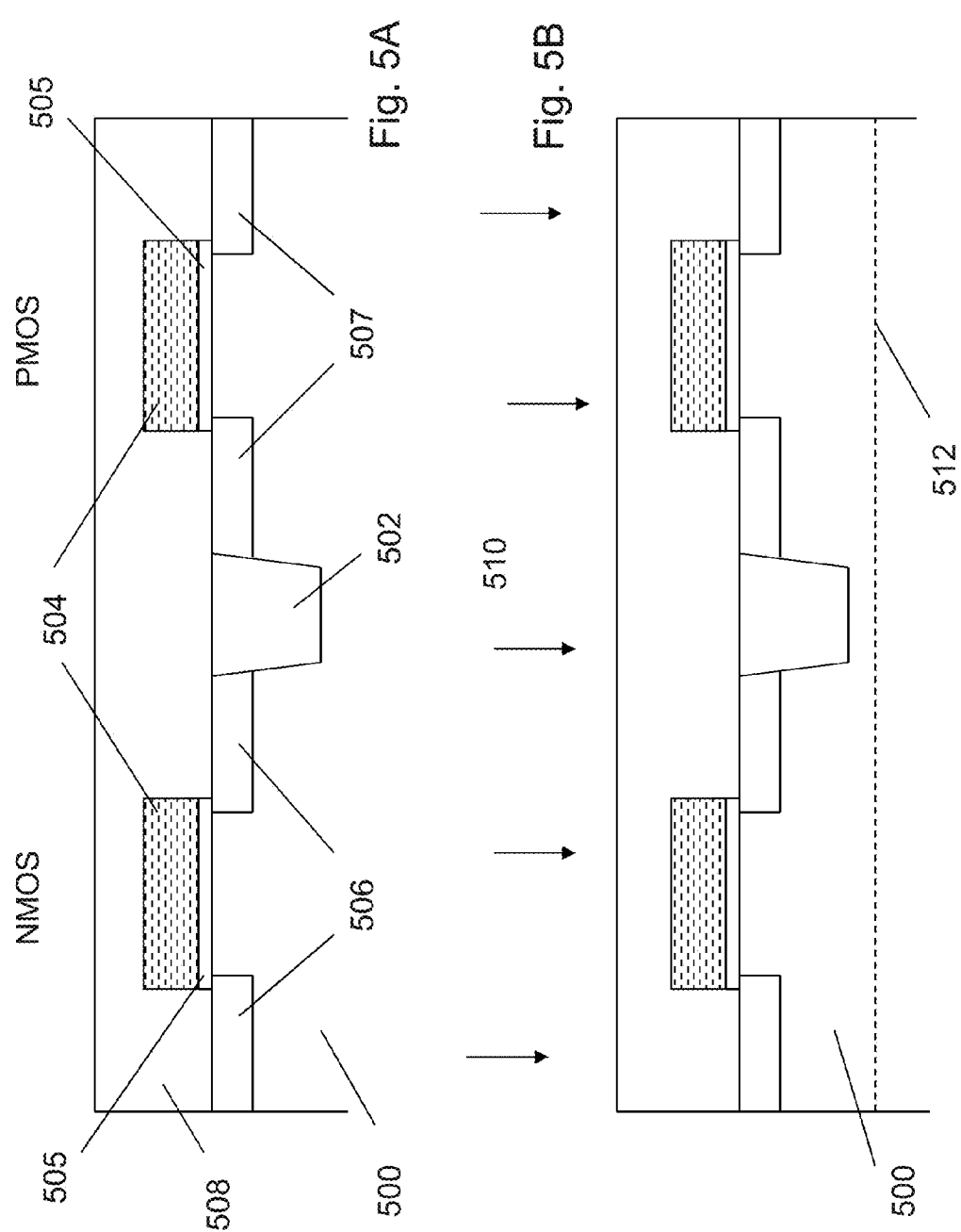

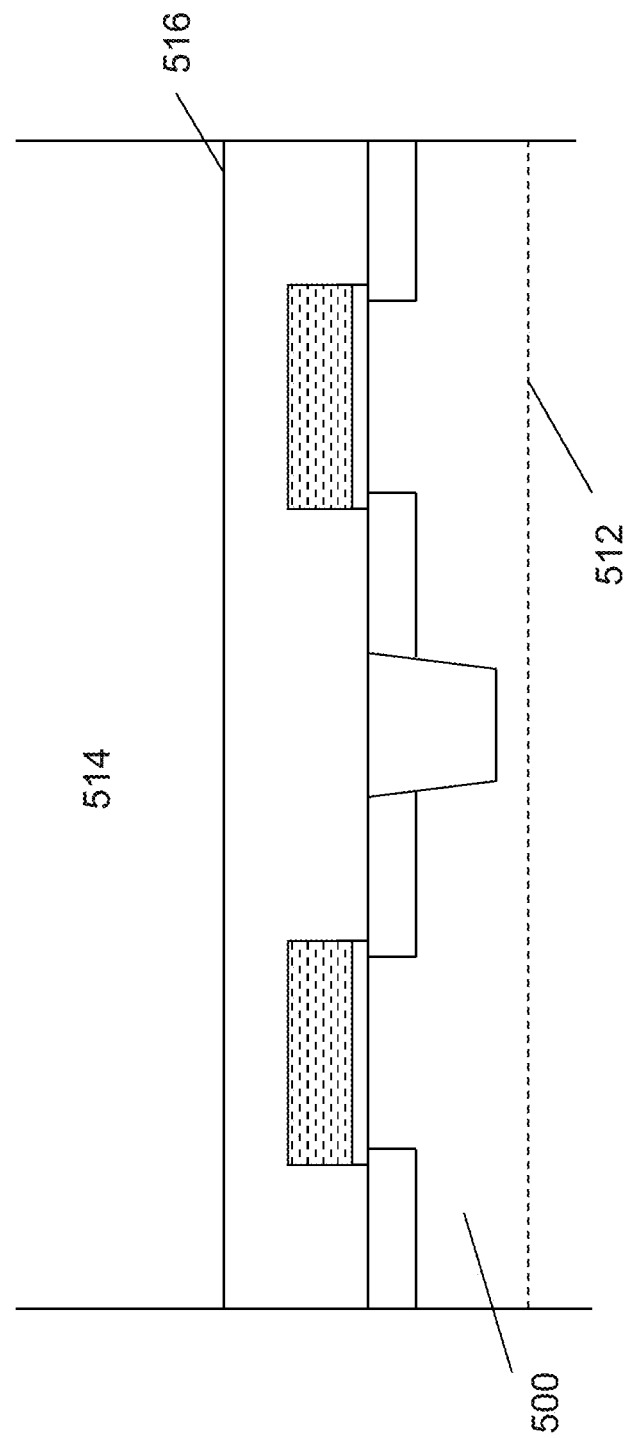

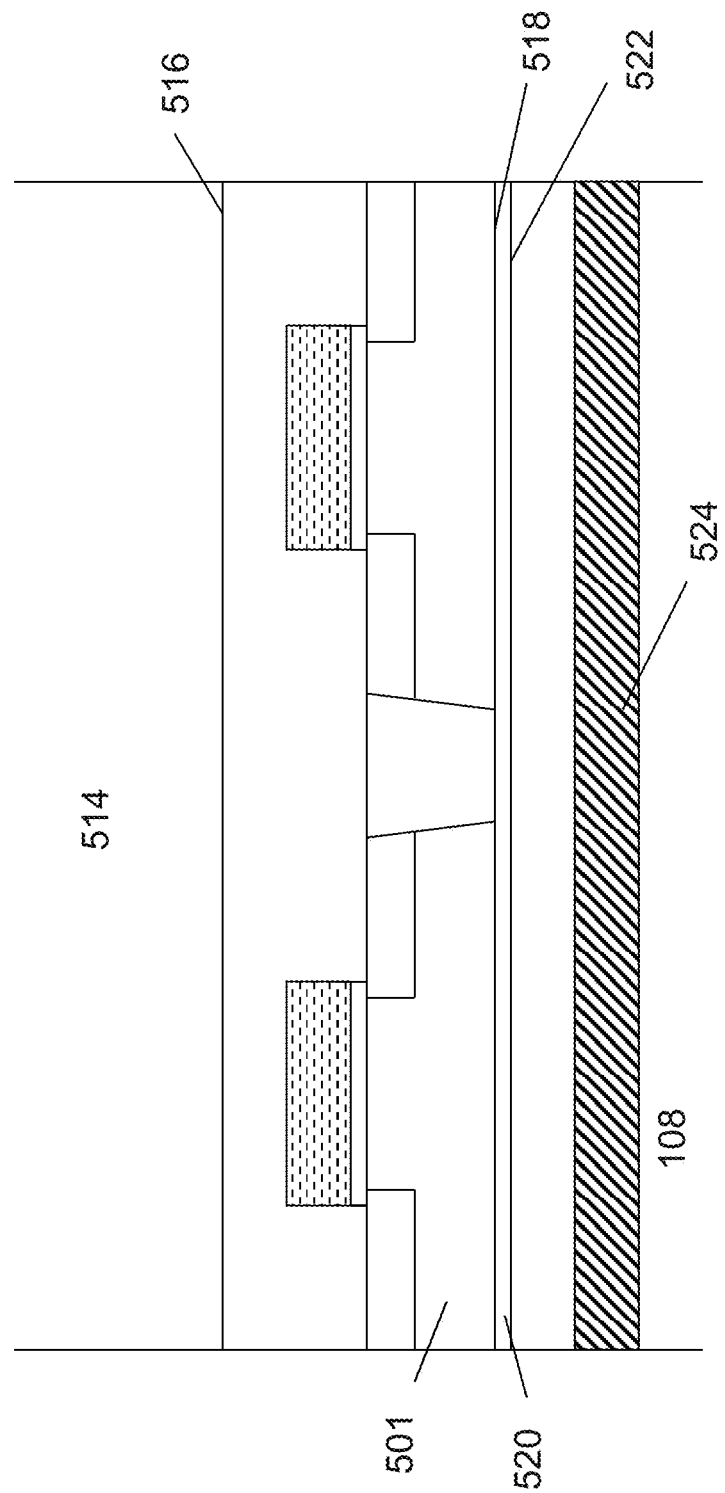

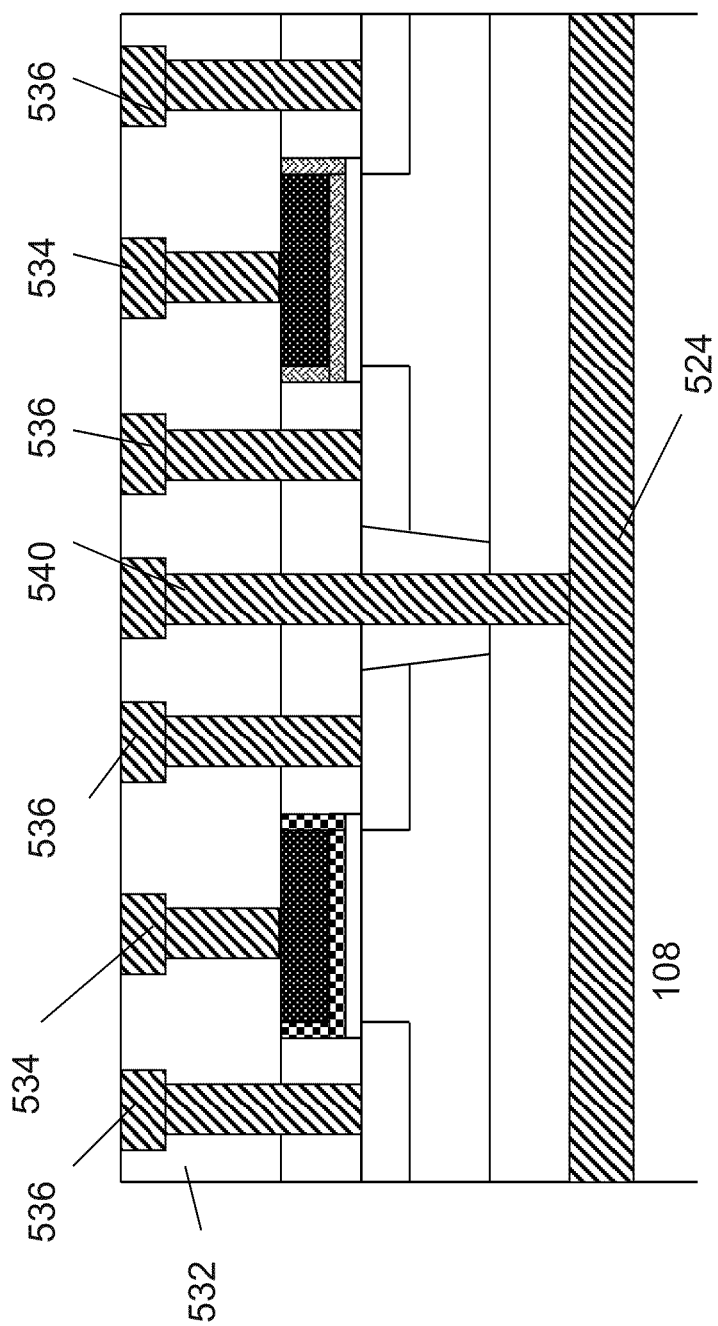

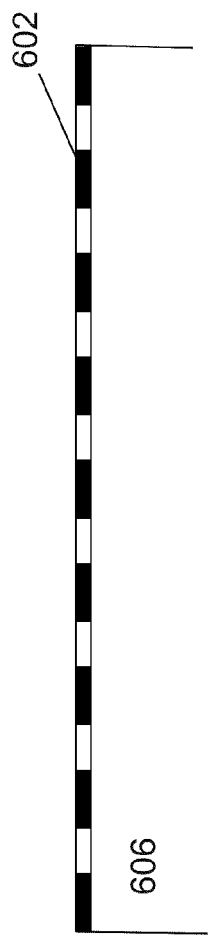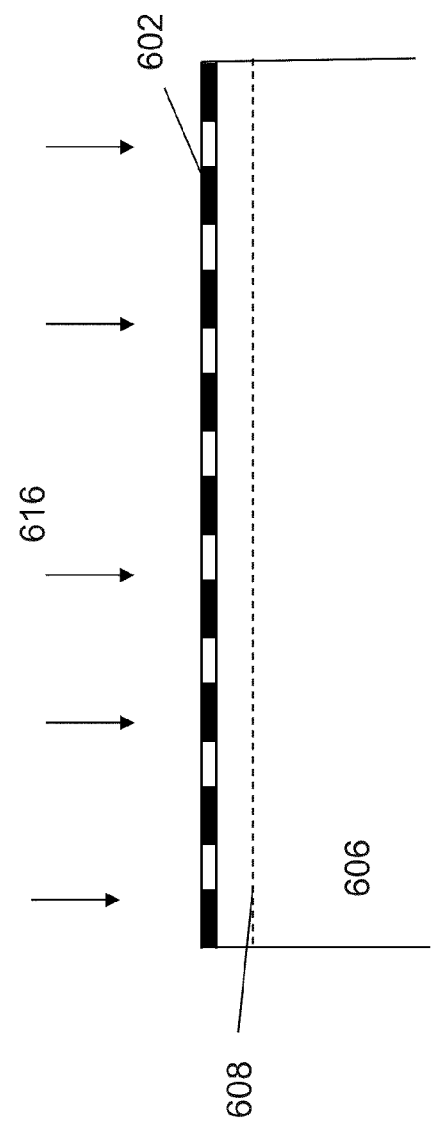

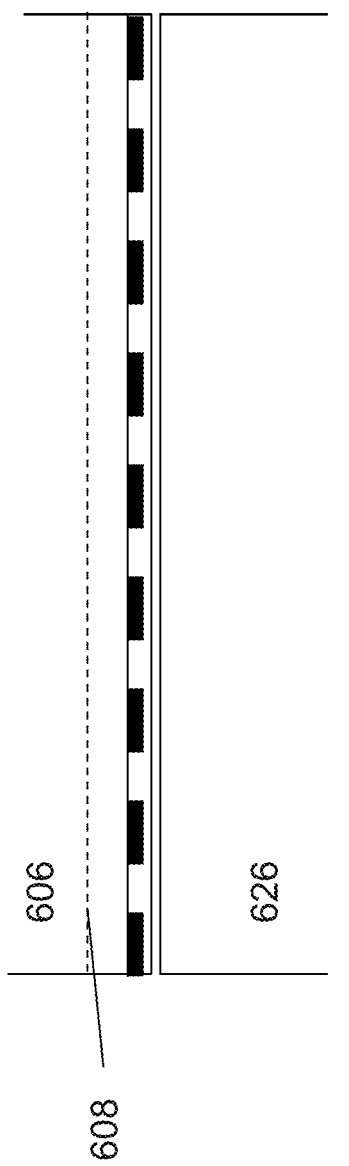
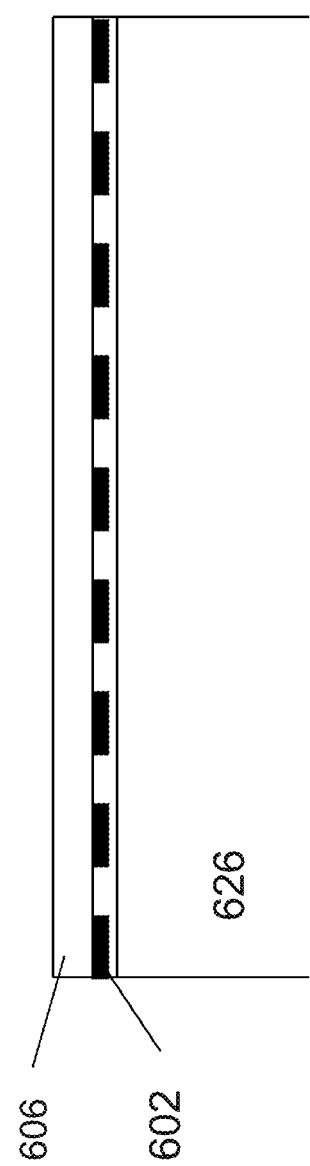

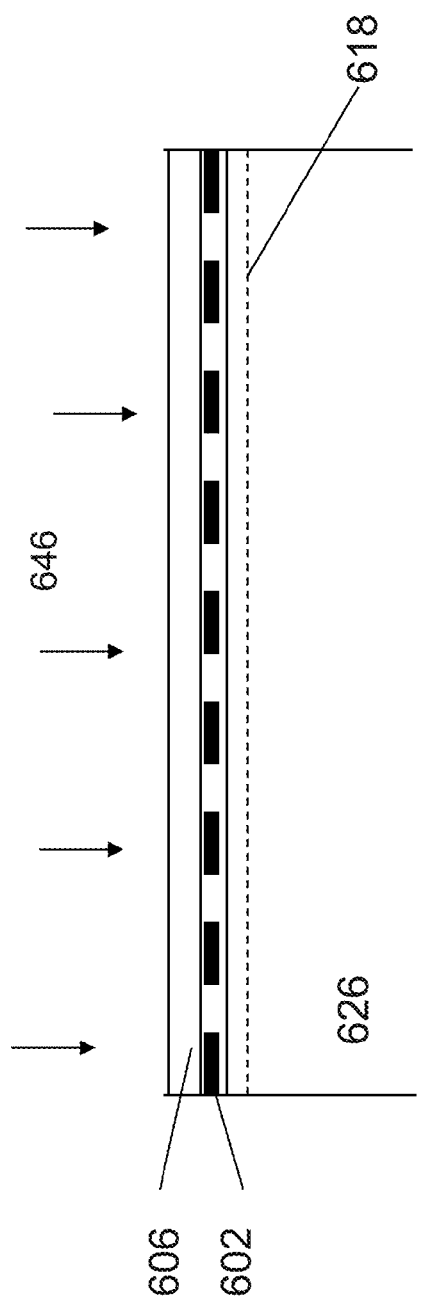
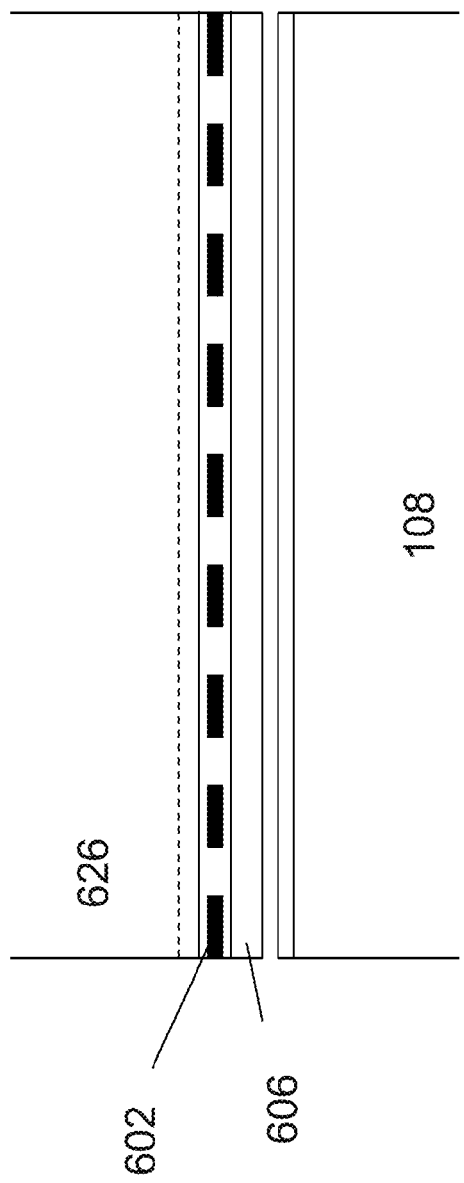

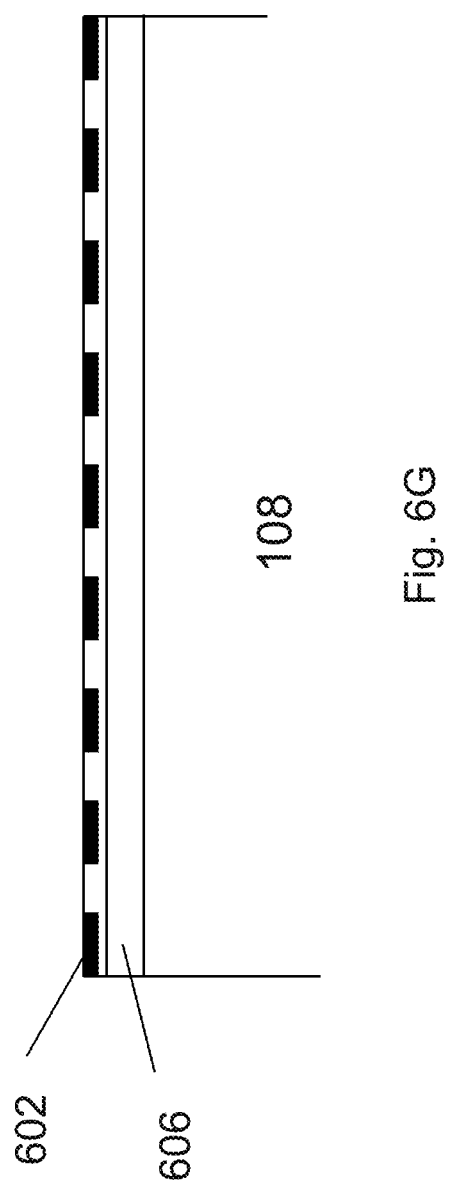

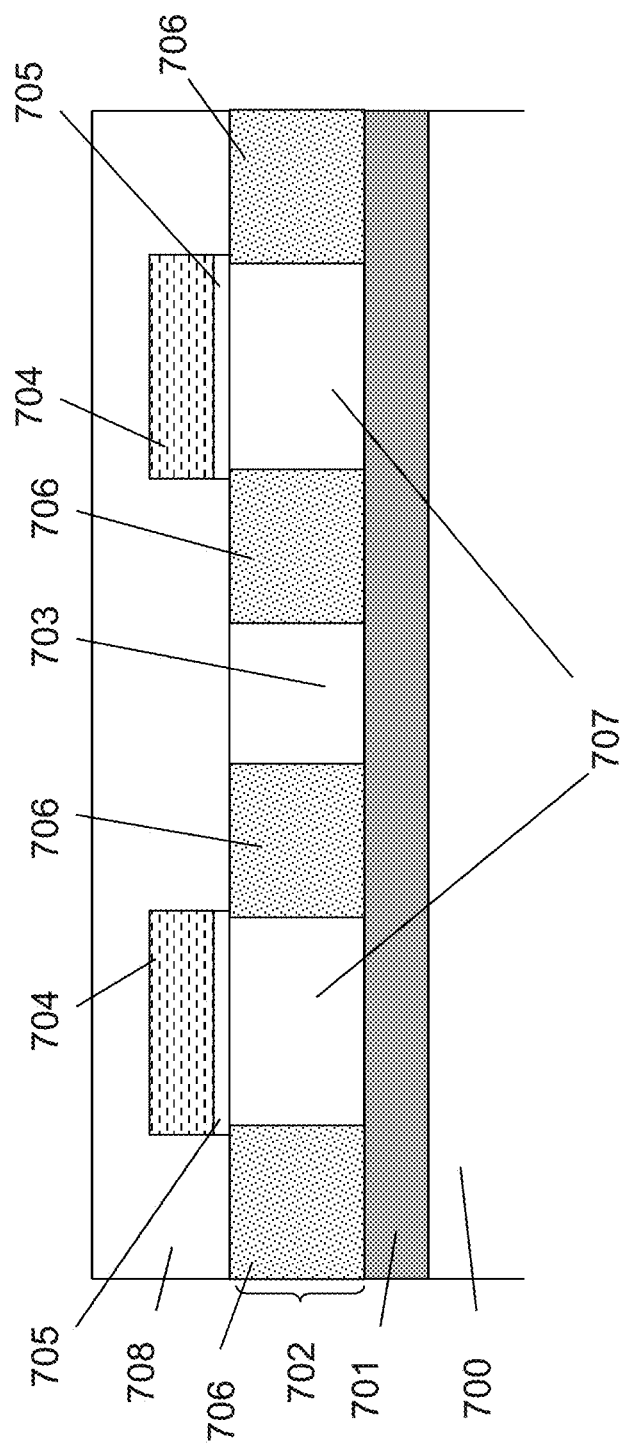

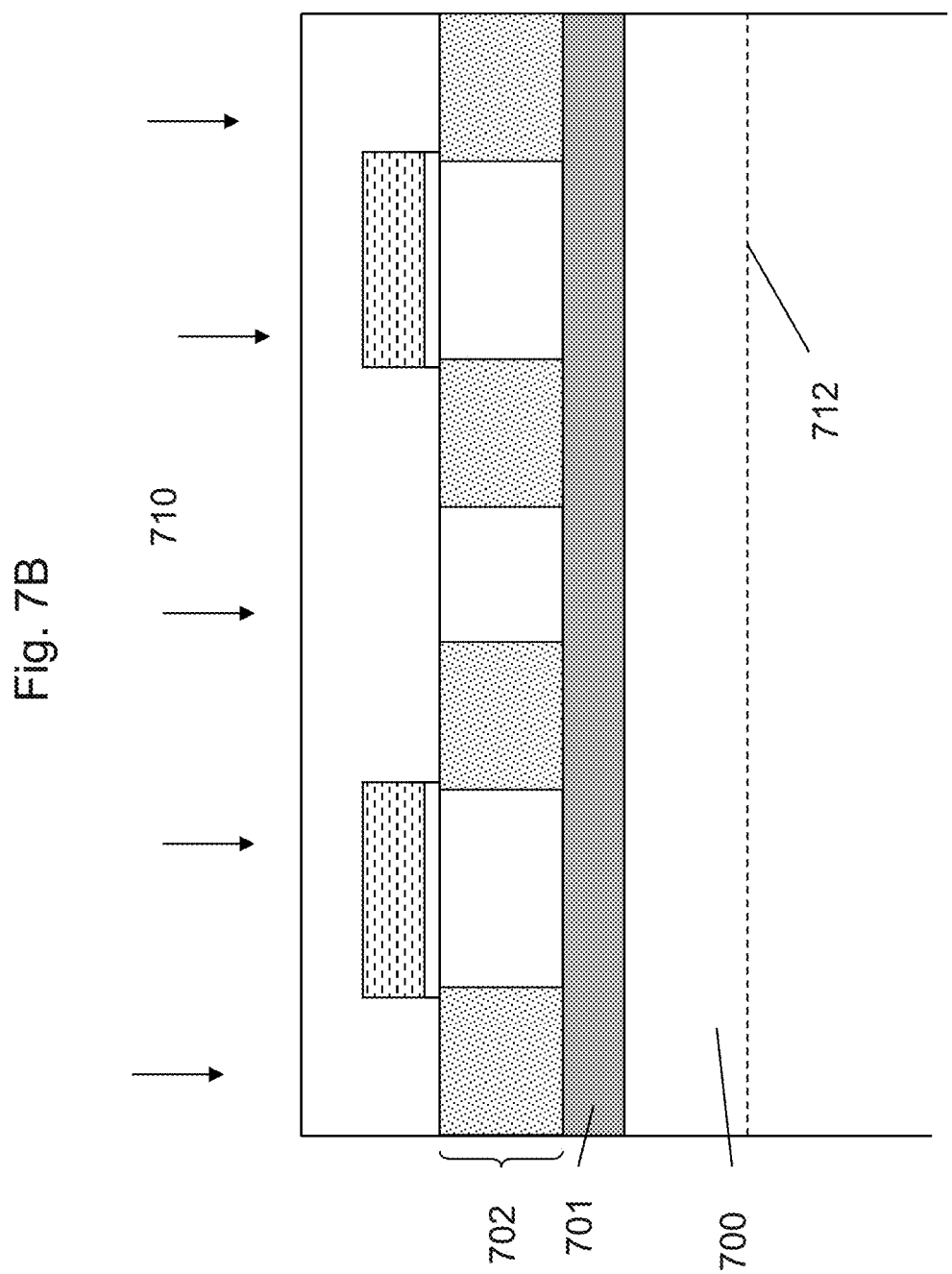

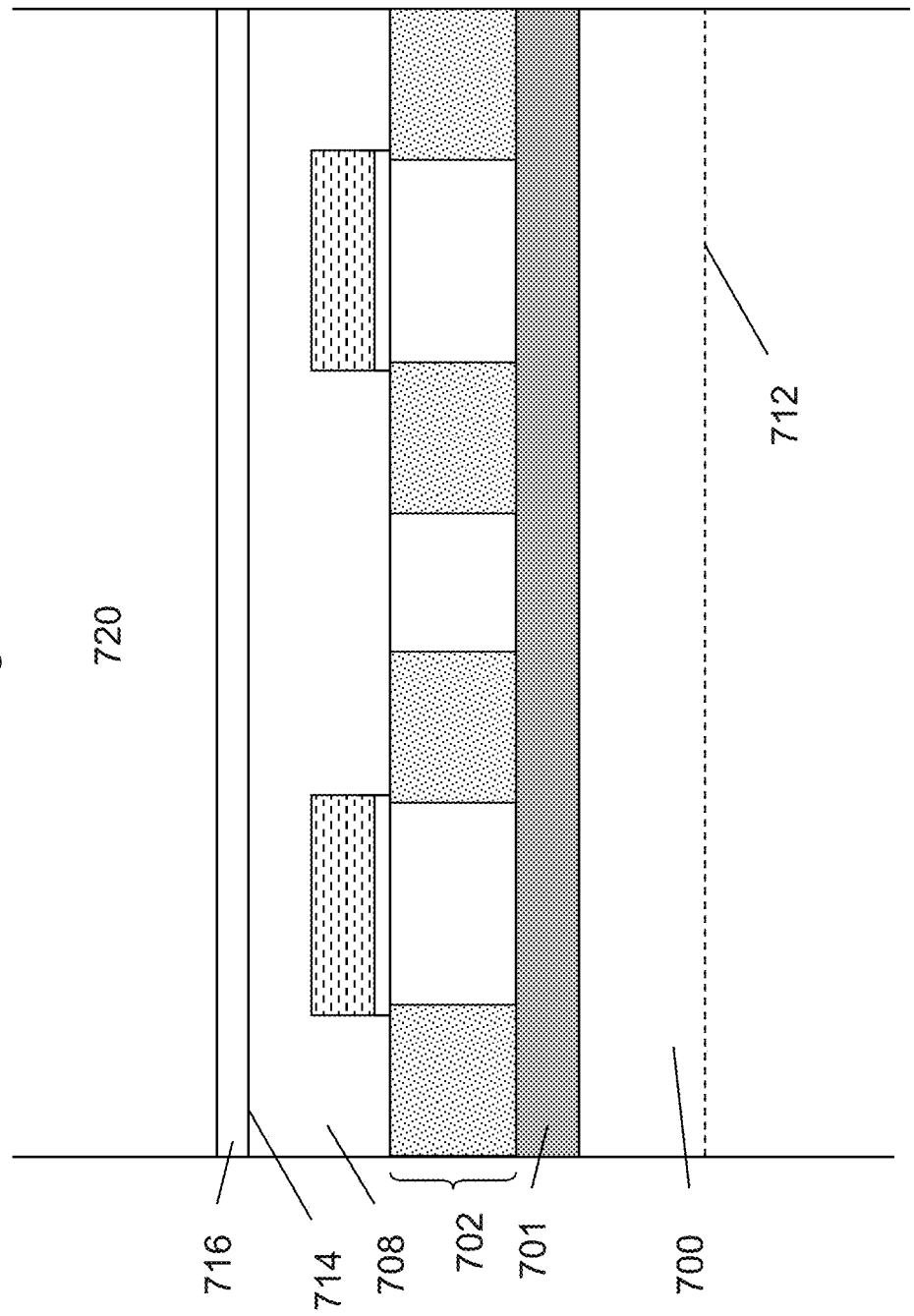

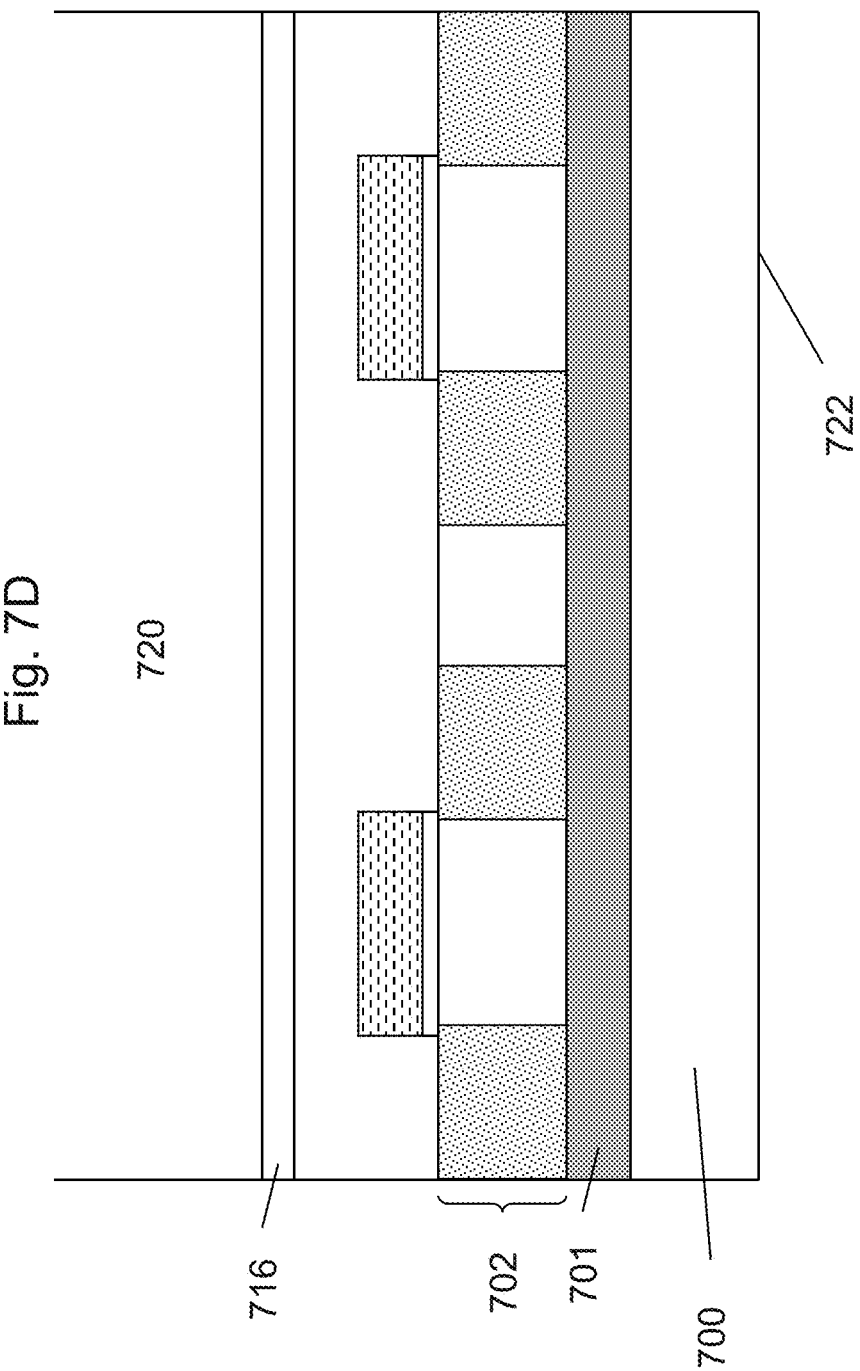

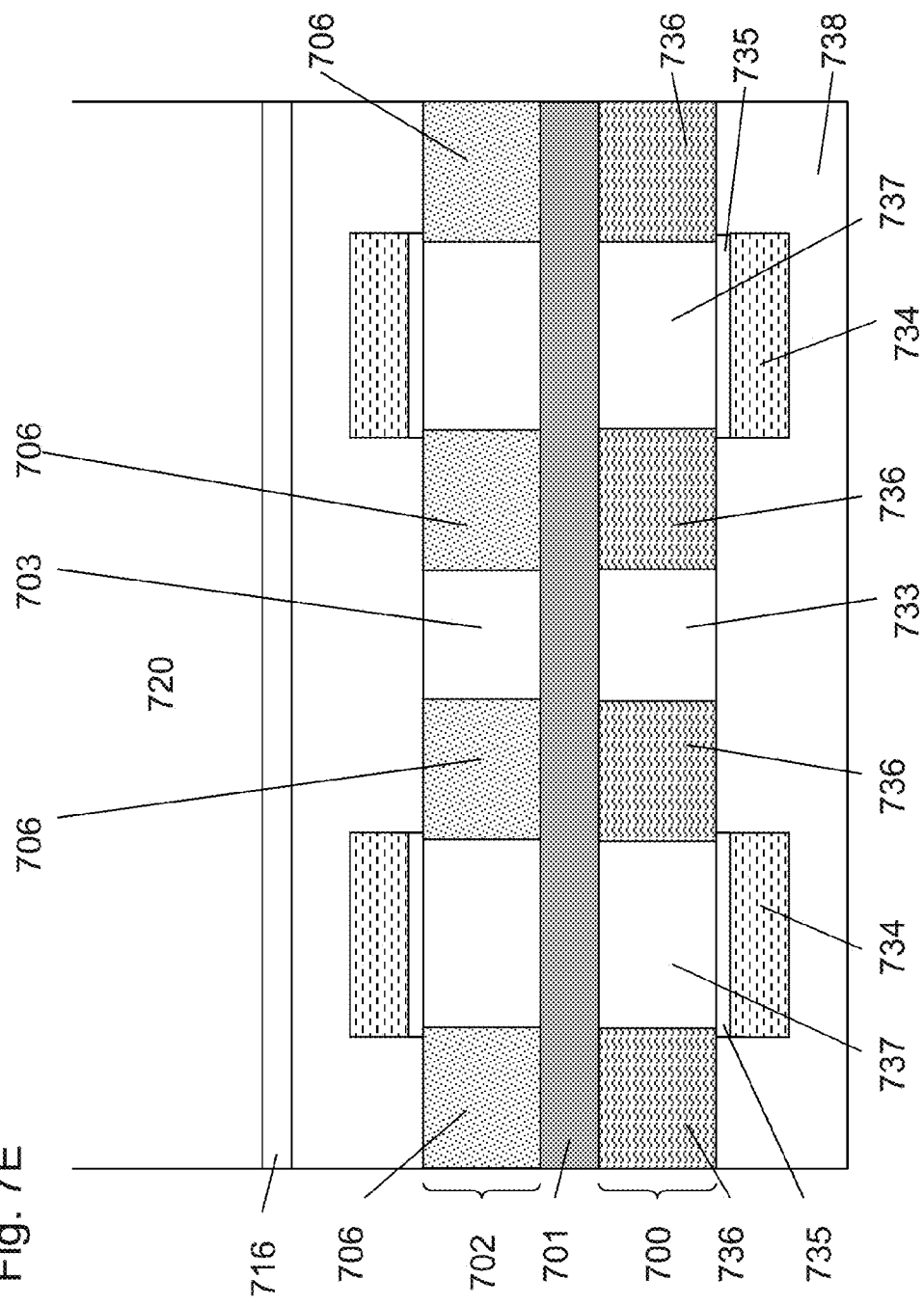

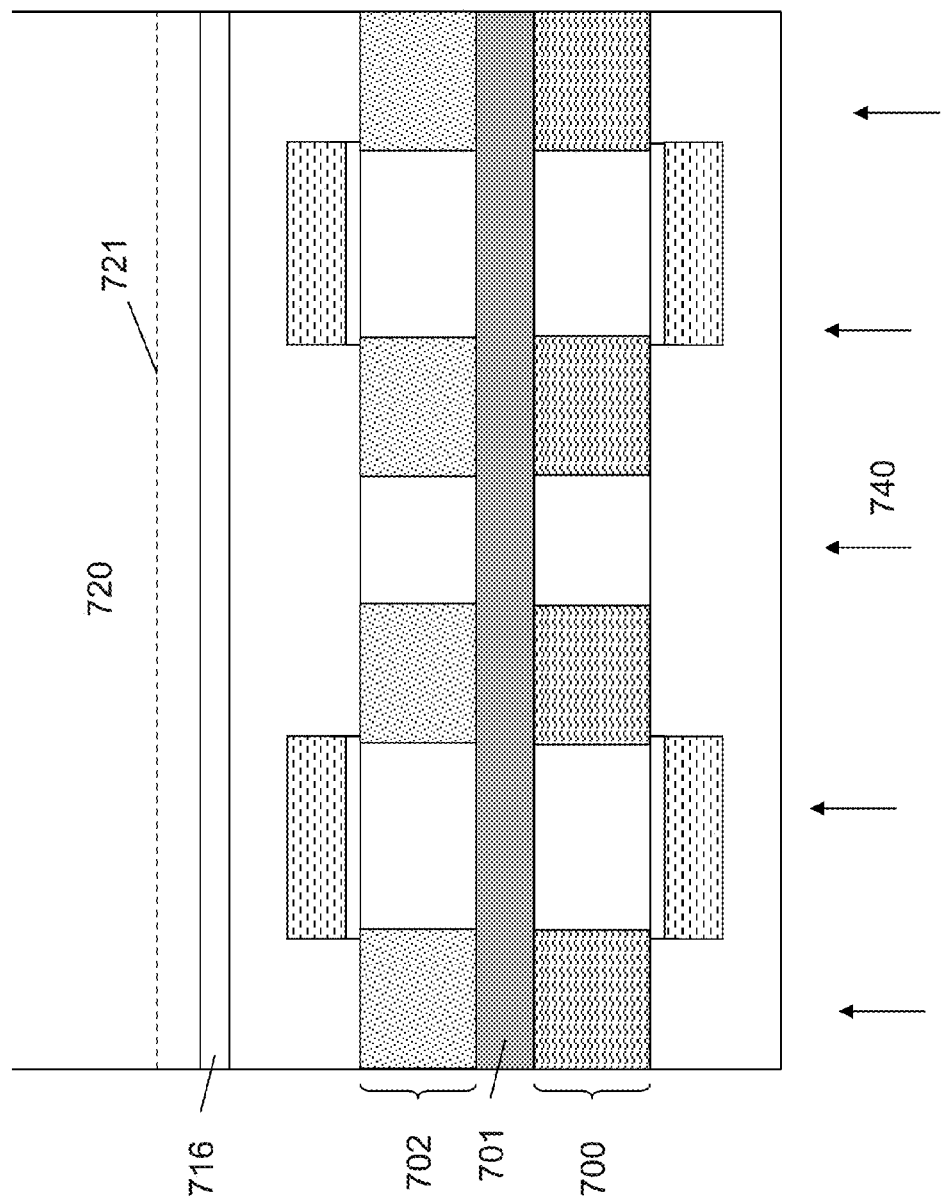

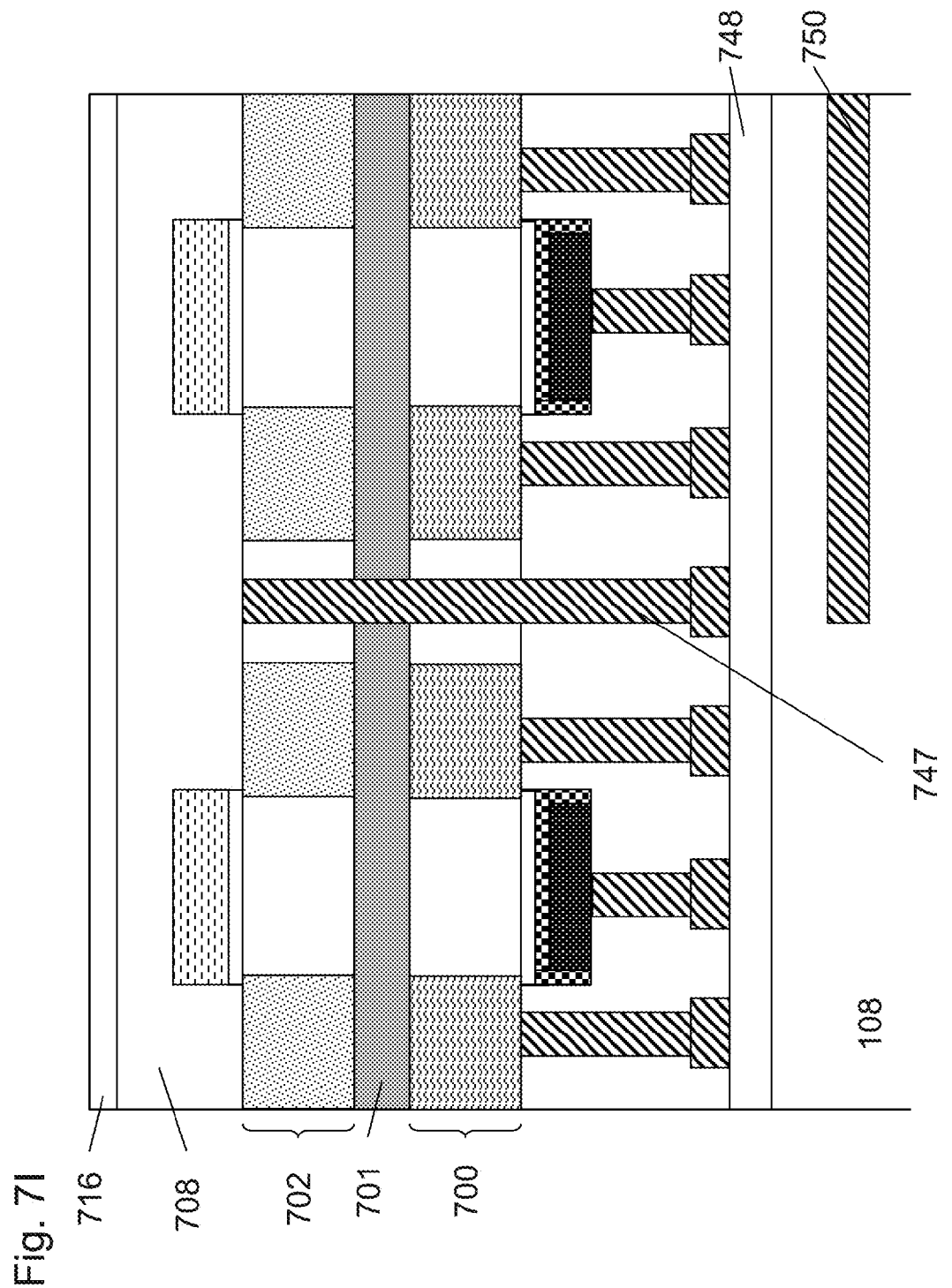

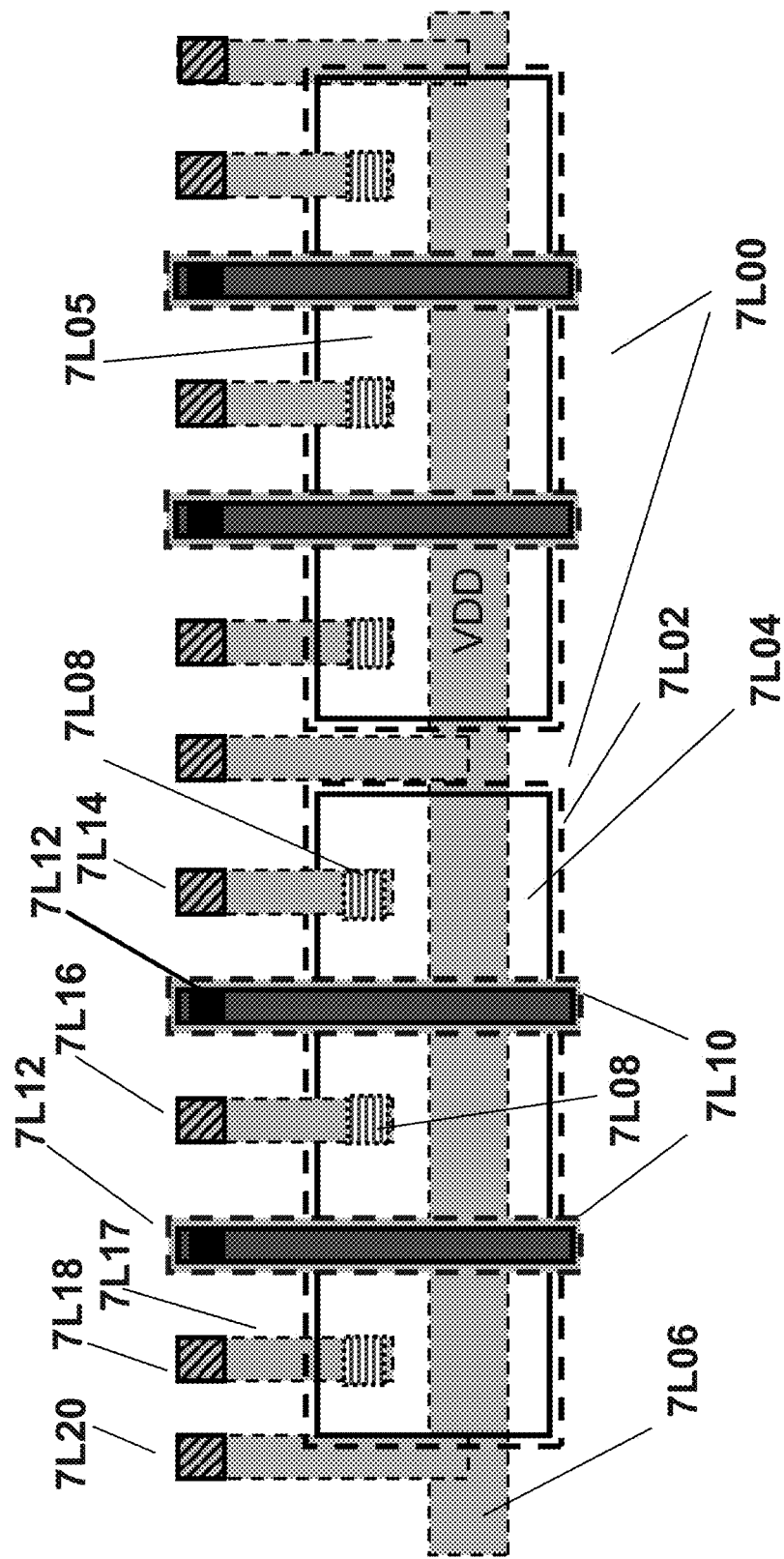

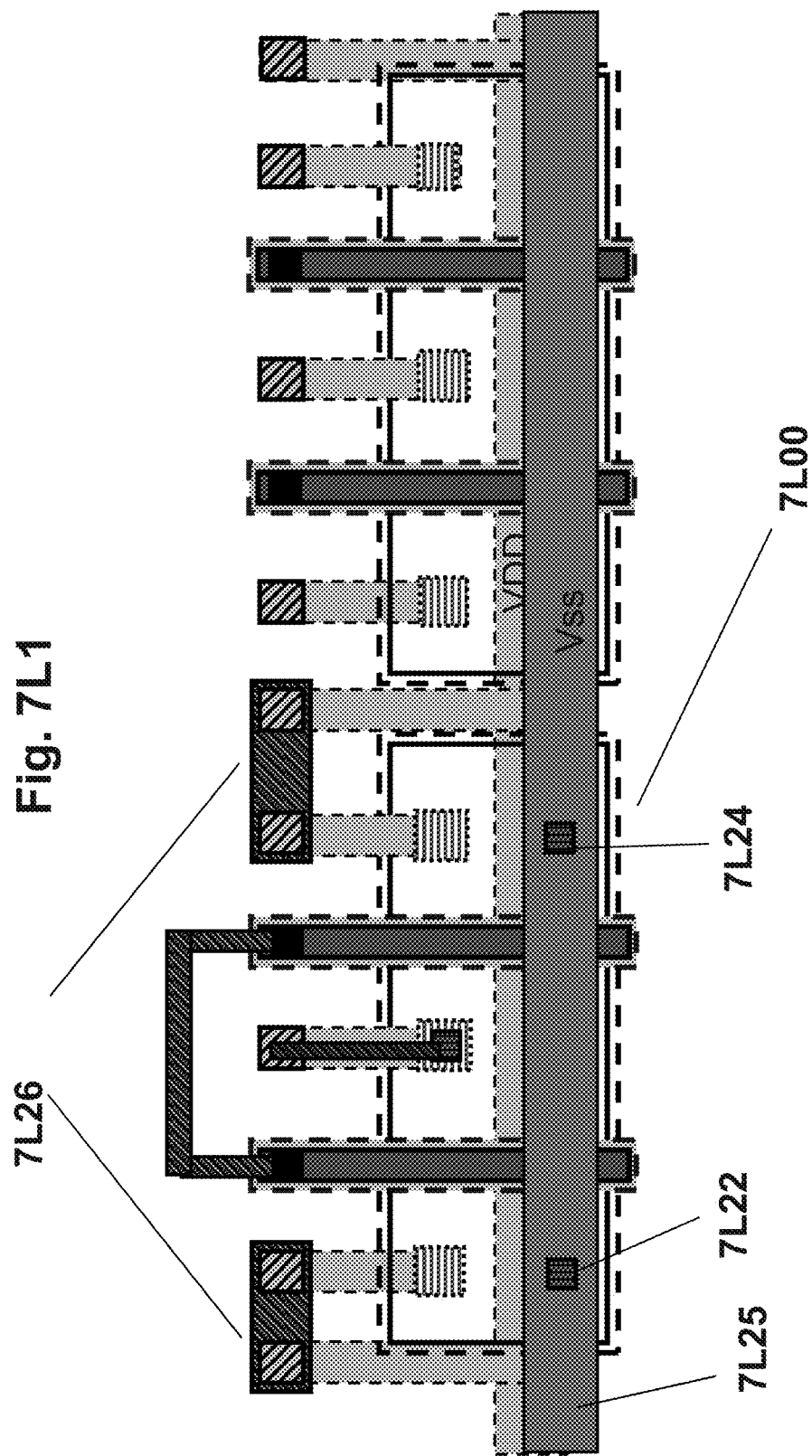
Fig. 7L1

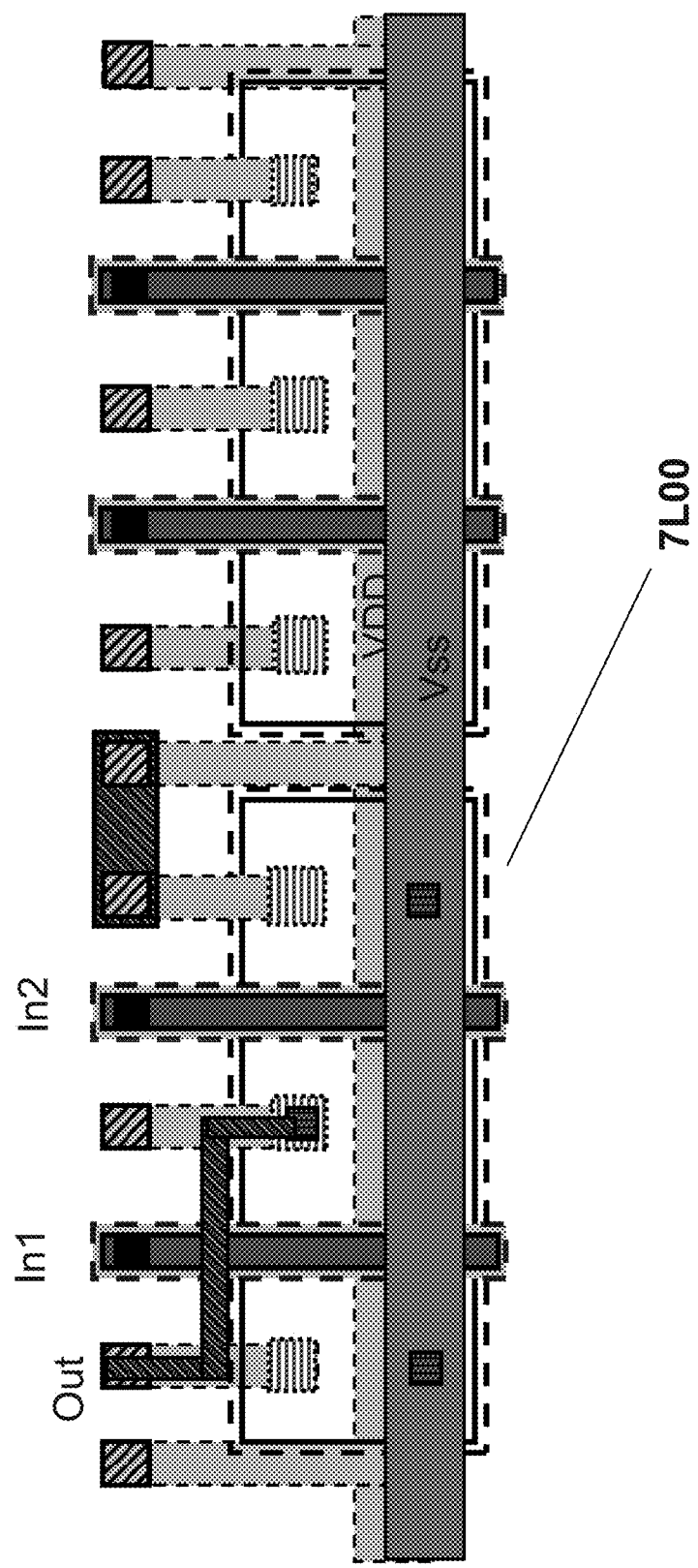
Fig. 7L2

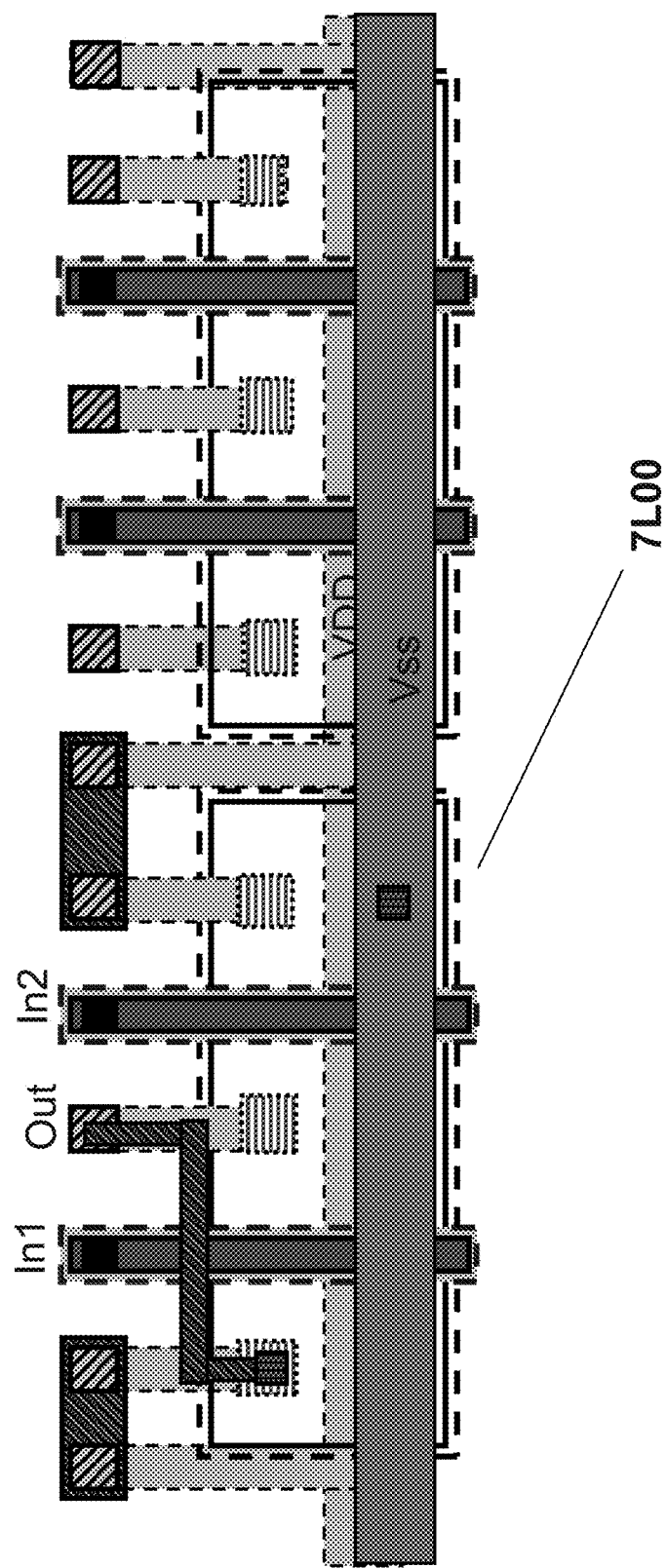

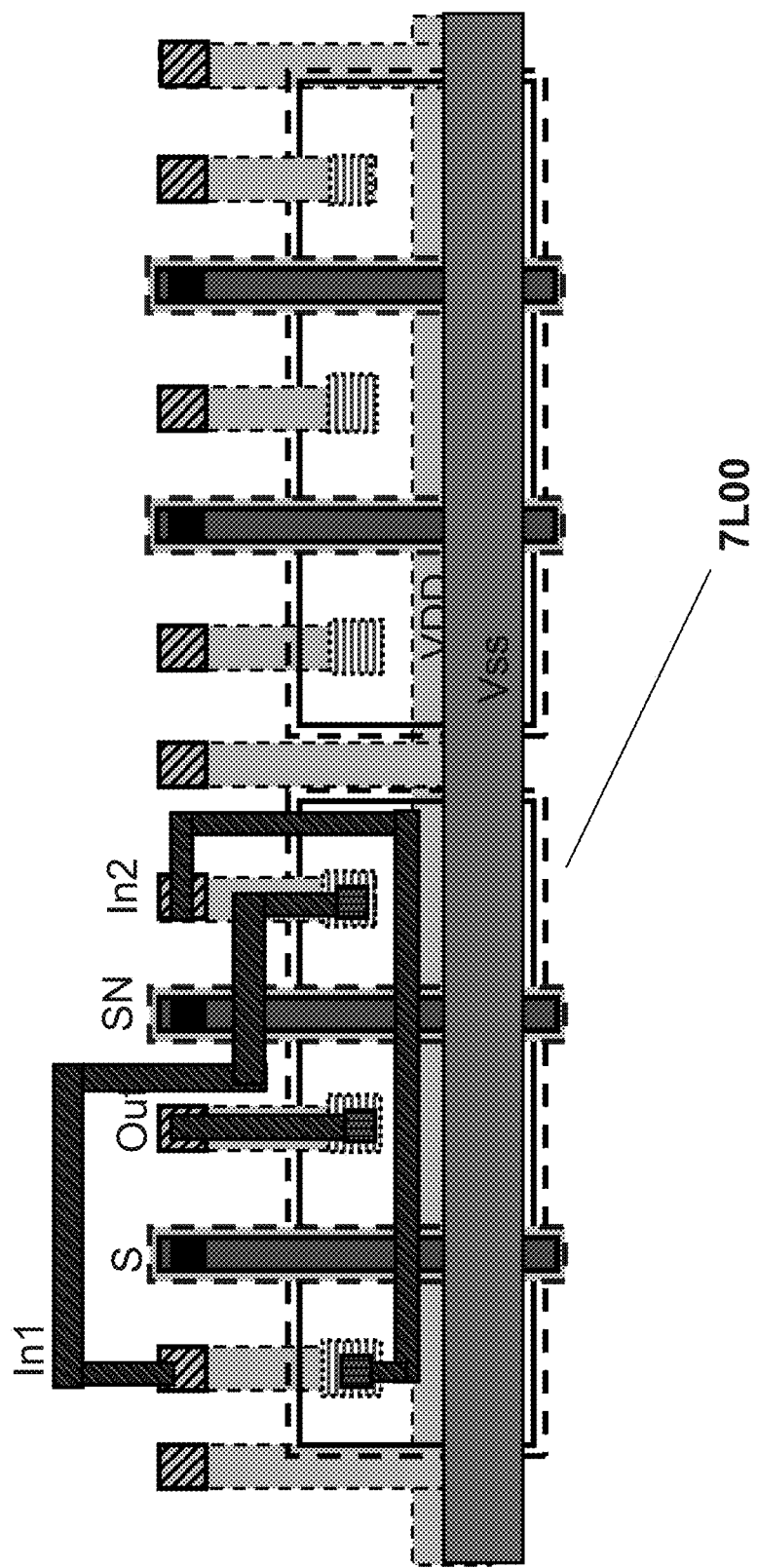
Fig. 7L4

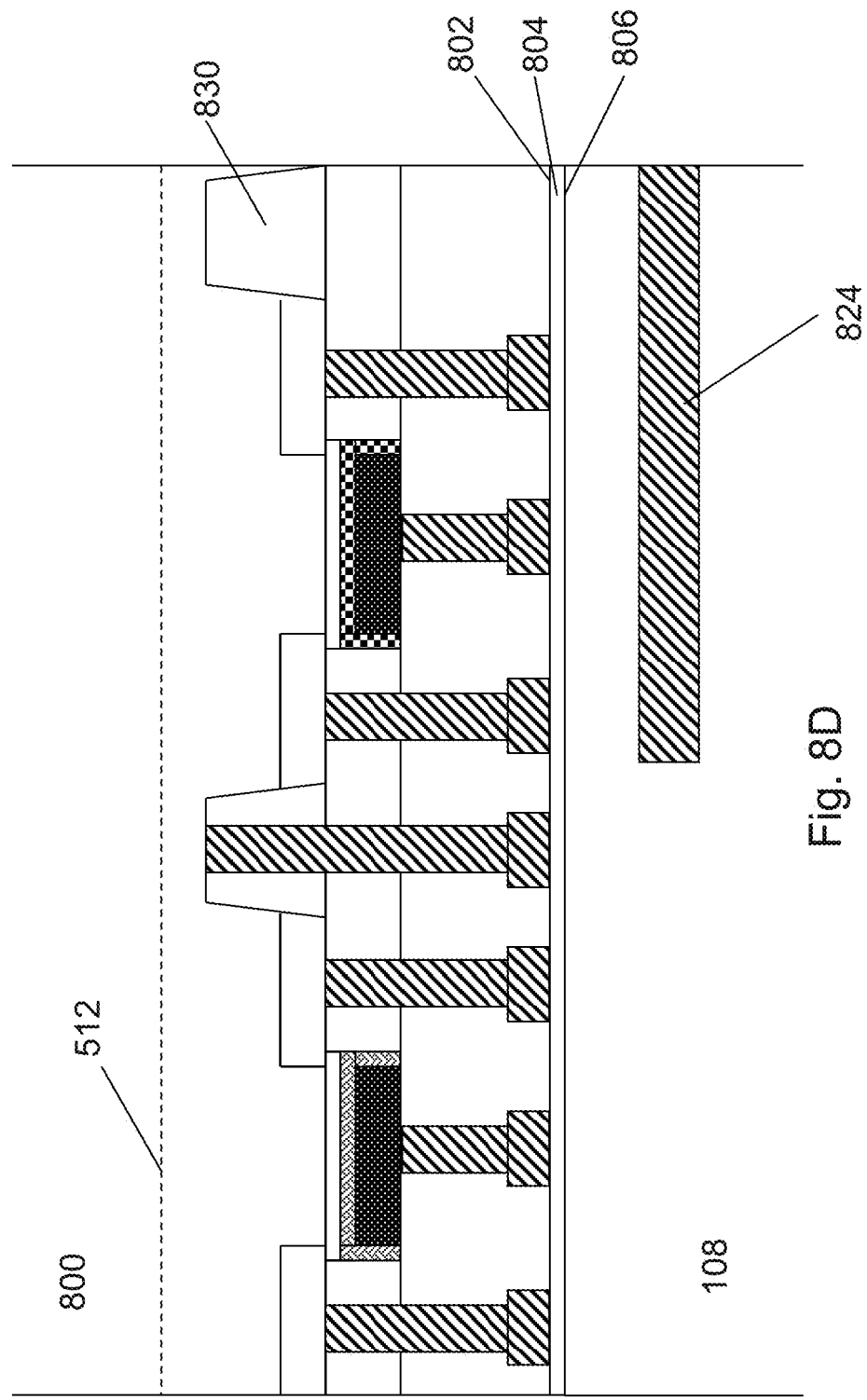

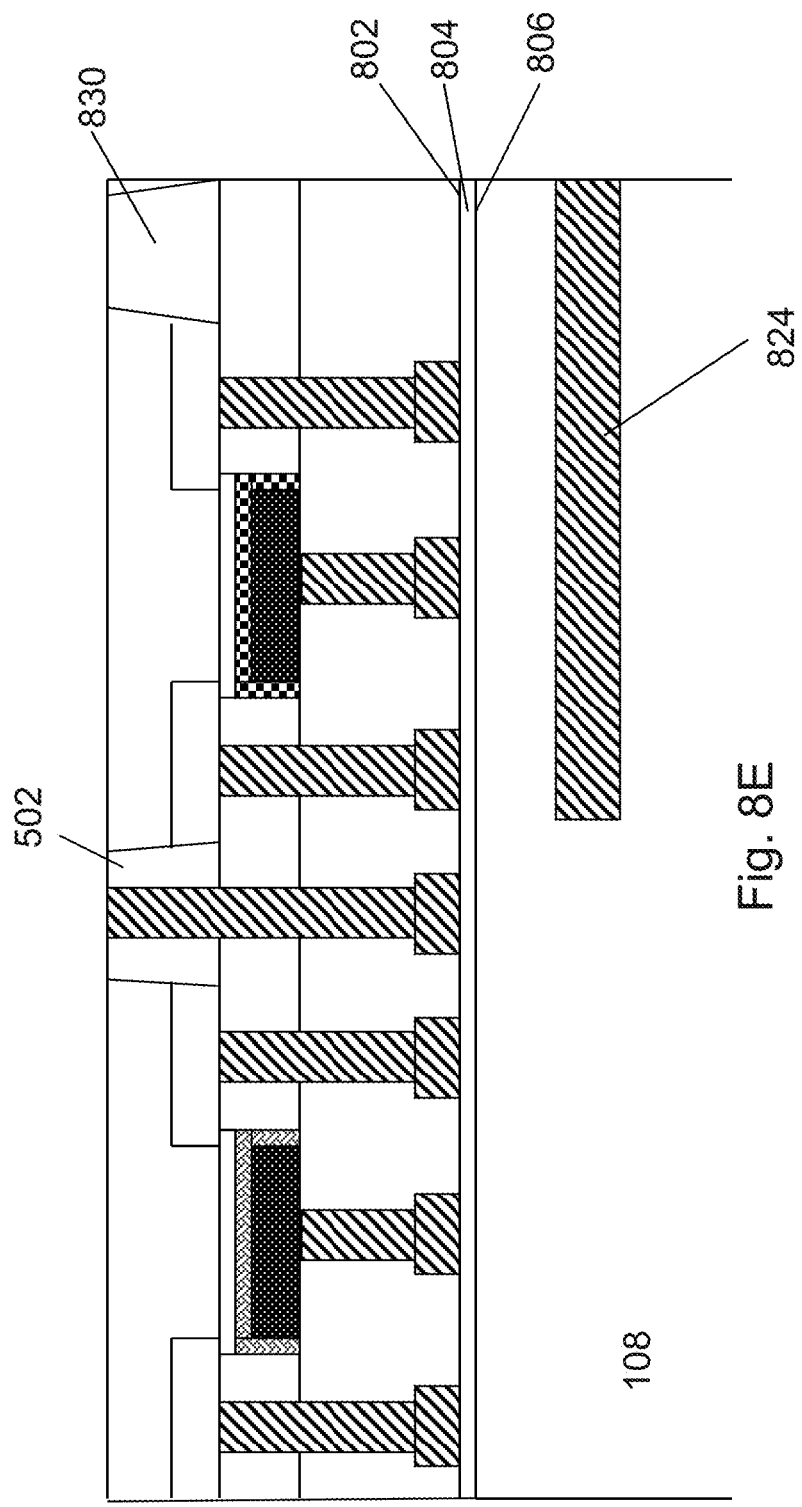

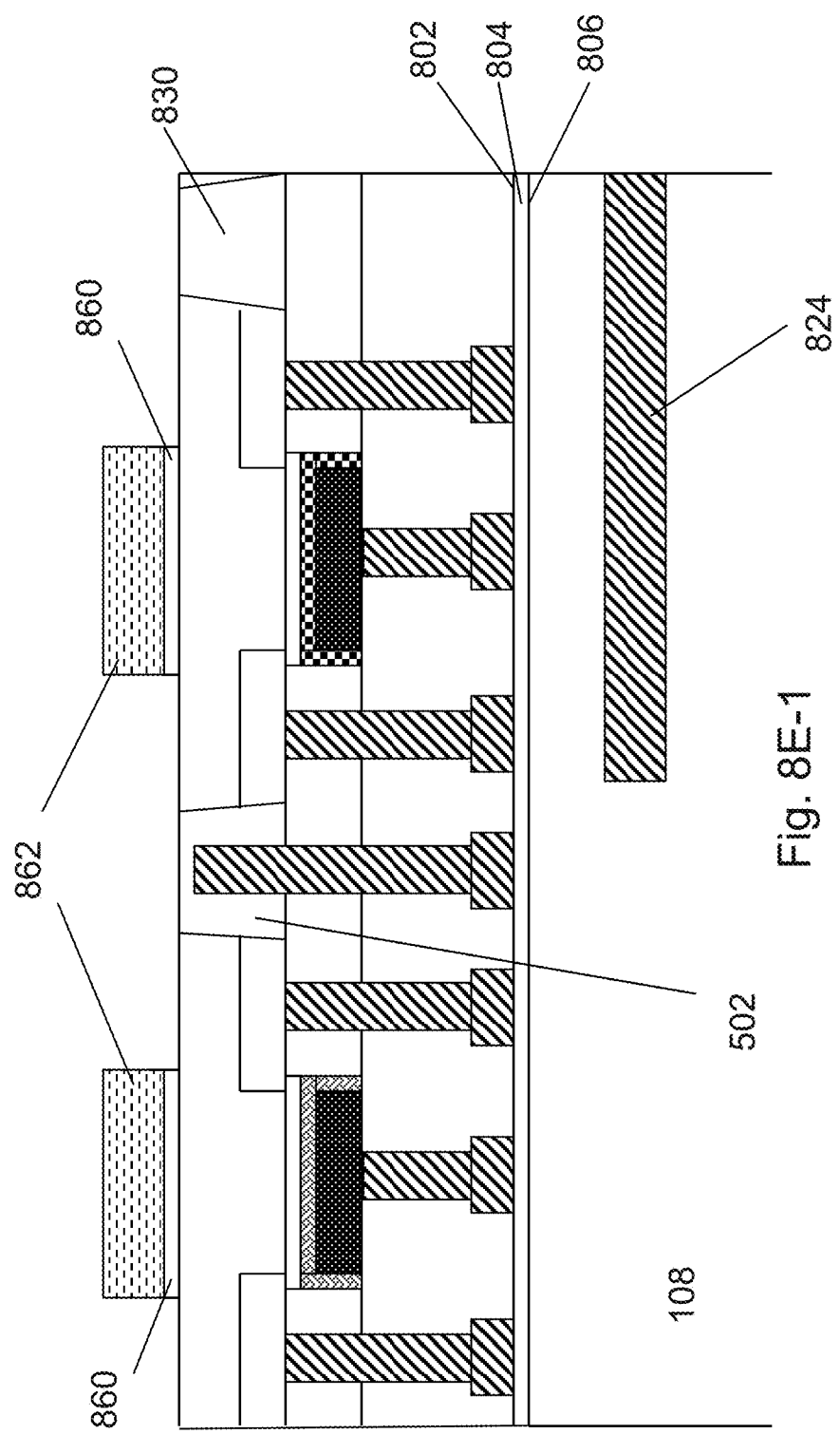

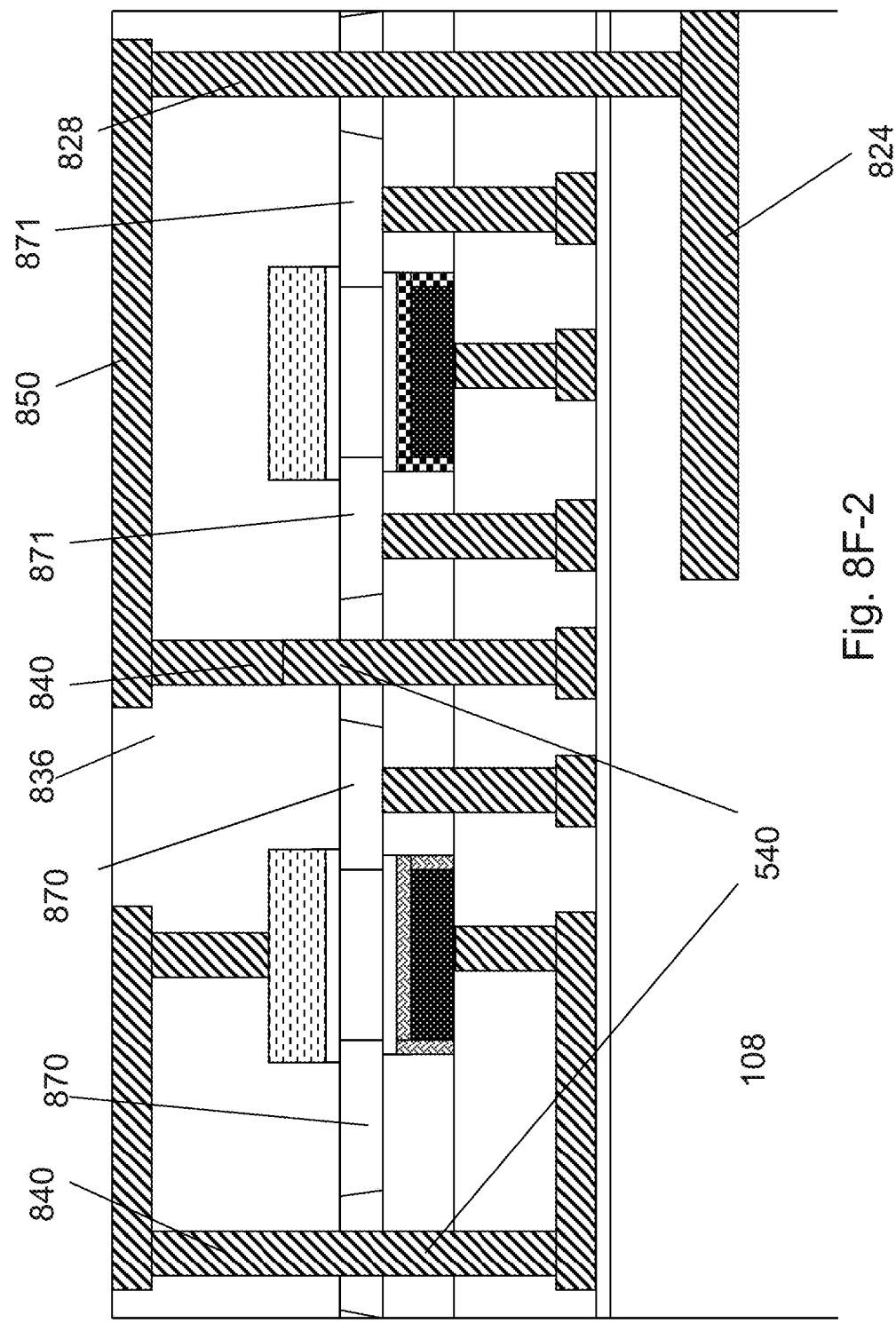

1202

1202

3D SEMICONDUCTOR DEVICE HAVING TWO LAYERS OF TRANSISTORS

CROSS-REFERENCE OF RELATED APPLICATION

This application is a continuation-in-part of co-pending U.S. patent application Ser. No. 13/492,395, filed on Jun. 8, 2012, which is a continuation-in-part of U.S. patent application Ser. No. 13/273,712 (now U.S. Pat. No. 8,273,610 issued on Sep. 25, 2012) filed Oct. 14, 2011, which is a continuation-in-part of U.S. patent application Ser. No. 13/016,313 (now U.S. Pat. No. 8,362,482 issued on Jan. 29, 2013) filed on Jan. 28, 2011, which is a continuation-in-part of U.S. patent application Ser. No. 12/970,602, filed on Dec. 16, 2010, which is a continuation-in-part of U.S. patent application Ser. No. 12/949,617, (now U.S. Pat. No. 8,754, 533 issued on Jun. 17, 2014) filed on Nov. 18, 2010. The contents of the foregoing applications are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D IC) devices and fabrication methods.

2. Discussion of Background Art

Semiconductor manufacturing is known to improve device density in an exponential manner over time, but such improvements come with a price. The mask set cost required for each new process technology has also been increasing exponentially. While 20 years ago a mask set cost less than $20,000, it is now quite common to be charged more than $1M for today's state of the art device mask set.

These changes represent an increasing challenge primarily to custom products, which tend to target smaller volume and less diverse markets therefore making the increased cost of product development very hard to accommodate.

Custom Integrated Circuits can be segmented into two groups. The first group includes devices that have all their layers custom made. The second group includes devices that have at least some generic layers used across different custom products. Well-known examples of the second kind may include Gate Arrays, which use generic layers for all layers up to a contact layer that couples the silicon devices to the metal conductors, and Field Programmable Gate Array (FPGA) devices where all the layers are generic. The generic layers in such devices may mostly be a repeating pattern structure, called a Master Slice, in an array form.

The logic array technology may be based on a generic fabric customized for a specific design during the customization stage. For an FPGA the customization may be done through programming by electrical signals. For Gate Arrays, which in their modern form are sometimes called Structured Application Specific Integrated Circuits (or Structured ASICs), the customization may be by at least one custom layer, which might be done with Direct Write eBeam or with a custom mask. As designs tend to be highly variable in the amount of logic and memory and type of input & output (I/O) each one may need, vendors of logic arrays create product families, each product having a different number of Master Slices covering a range of logic, memory size and I/O options. Yet, it is typically a challenge to come up with minimum set of Master Slices that can provide a good fit for the maximal number of designs because it may be quite costly to use a dedicated mask set for each product.

U.S. Pat. No. 4,733,288 issued to Sato in March 1988 ("Sato"), discloses a method "to provide a gate-array LSI chip which can be cut into a plurality of chips, each of the chips having a desired size and a desired number of gates in accordance with a circuit design." The references cited in Sato present a few alternative methods to utilize a generic structure for different sizes of custom devices.

The array structure may fit the objective of variable sizing. The difficulty to provide variable-sized array structure devices may result from the need of providing I/O cells and associated pads to connect the device to the package. To overcome this difficulty Sato suggests a method wherein I/O could be constructed from the transistors also used for the general logic gates. Anderson also suggested a similar approach. U.S. Pat. No. 5,217,916 issued to Anderson et al. on Jun. 8, 1993, discloses a borderless configurable gate array free of predefined boundaries using transistor gate cells, of the same type of cells used for logic, to serve the input and output function. Accordingly, the input and output functions may be placed to surround the logic array sized for the specific application. This method may place a potential limitation on the I/O cell to use the same type of transistors as used for the logic and; hence, may not allow the use of higher operating voltages for the I/O.

U.S. Pat. No. 7,105,871 issued to Or-Bach et al. on Sep. 12, 2006, discloses a semiconductor device that includes a borderless logic array and area I/Os. The logic array may comprise a repeating core, and at least one of the area I/Os may be a configurable I/O.

In the past it was reasonable to design an I/O cell that could be configured to the various needs of most customers. The ever increasing need of higher data transfer rate in and out of the device drove the development of special serial I/O circuits called SerDes (Serializer/Deserializer) transceivers. These circuits are complex and may lead to a far larger silicon area than conventional I/Os. Consequently, the variations may be combinations of various amounts of logic, various amounts and types of memories, and various amounts and types of I/O. This implies that even the use of the borderless logic array of the prior art may still lead to multiple expensive mask sets.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D approaches are described in U.S. Pat. Nos. 8,273,610, 8,557,632, 8,298,875, 8,642,416, 8,362,482, 8,378,715, 8,379,458, 8,450,804, 8,574,929, 8,581,349, 8,642,416, 8,687,399, 8,742,476, 8,674,470, 8,803,206, 8,902,663, 8,994,404, 9,021,414, 9,023,688, 9,030,858; US patent publications 2011/0092030 and 2013/0020707; and pending U.S. patent application Ser. Nos. 13/836,080, 62/077,280, 62/042,229, 13/803,437, 61/932, 617, 14/607,077, 14/642,724, 62/139,636, 62/149,651, and 62/198,126. The entire contents of the foregoing patents, publications, and applications are incorporated herein by reference.

Electro-Optics: There is also work done for integrated monolithic 3D including layers of different crystals, such as U.S. Pat. No. 8,283,215, U.S. Pat. Nos. 8,163,581, 8,753, 913, 8,823,122, and U.S. patent application Ser. Nos. 13/274,161 and 14/461,539. The entire contents of the foregoing patents, publications, and applications are incorporated herein by reference.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, a 3D semiconductor device, including: a first layer including first transistors; a first interconnection layer interconnecting the first transistors and overlying the first layer; and a second layer including second transistors, where the second layer thickness is less than 2 microns and greater than 5 nm, where the second layer is overlying the first interconnection layer, and where the second layer includes dice lines formed by an etch step.

In another aspect, a 3D semiconductor device, including: a first layer including first transistors; a first interconnection layer interconnecting the first transistors and overlying the first layer; and a second layer including second transistors, where the second layer thickness is less than 2 microns and greater than 5 nm, where the second layer is overlying the first interconnection layer, and where the first transistors are downward looking and the second transistors are upward looking.

In another aspect, a 3D semiconductor device, including: a first layer including first transistors; a first interconnection layer interconnecting the first transistors and overlying the first layer; and a second layer including second transistors, where the second layer thickness is less than 2 micron and greater than 5 nm, where the second layer is overlying the first interconnection layer, where at least two of the second transistors have a common shared diffusion, and where the first interconnection layer includes copper or aluminum.

BRIEF DESCRIPTION OF THE DRAWINGS

Various embodiments of the invention will be understood and appreciated more fully from the following detailed description, taken in conjunction with the drawings in which:

FIGS. 1B-1I are exemplary drawing illustrations of the preprocessed wafers and layers and generalized layer transfer;

FIGS. 5A, 5B, 5B-1, and 5C-H are exemplary drawing illustrations of formation of top planar transistors;

FIGS. 6A-6G are exemplary drawing illustrations of a formation of top planar transistors;

FIGS. 7A-7L are exemplary drawing illustrations of a formation of top planar transistors;

FIGS. 7L1-7L4 are exemplary drawing illustrations of a formation of top planar transistors;

FIGS. 8A-8E, 8E-1, 8F, 8F-1, 8F-2 are exemplary drawing illustrations of a formation of top planar transistors;

DETAILED DESCRIPTION

Figure 1:
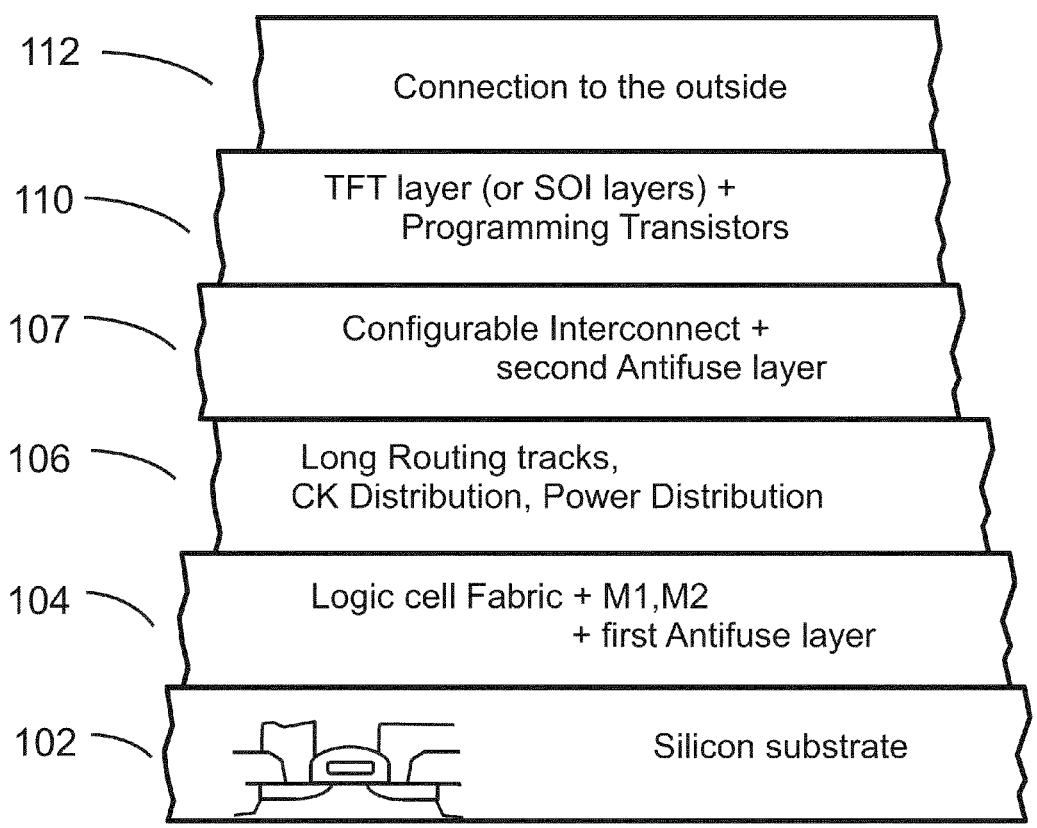
FIG. 1 is an exemplary drawing illustration of a programmable device layers structure.

Embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

Some embodiments of the invention may provide a new method for semiconductor device fabrication that may be highly desirable for custom products. Some embodiments of the invention may suggest the use of a re-programmable antifuse in conjunction with 'Through Silicon Via' to construct a new type of configurable logic, or as usually called, FPGA devices. Some embodiments of the invention may provide a solution to the challenge of high mask-set cost and low flexibility that exists in the current common methods of semiconductor fabrication. An additional illustrated advantage of some embodiments of the present invention may be that it could reduce the high cost of manufacturing the many different mask sets needed in order to provide a commercially viable logic family with a range of products each with a different set of master slices. Some embodiments of the invention may improve upon the prior art in many respects, including, for example, the structuring of the semiconductor device and methods related to the fabrication of semiconductor devices.

Some embodiments of the invention may reflect the motivation to save on the cost of masks with respect to the investment that would otherwise have been necessary to put in place a commercially viable set of master slices. Some embodiments of the invention may also provide the ability to incorporate various types of memory blocks in the configurable device. Some embodiments of the invention may provide a method to construct a configurable device with the desired amount of logic, memory, I/Os, and analog functions.

In addition, some embodiments of the invention may allow the use of repeating logic tiles that provide a continuous terrain of logic. Some embodiments of the invention may use a modular approach to construct various configurable systems with Through-Silicon-Via (TSV). Once a standard size and location of TSV has been defined one could build various configurable logic dies, configurable memory dies, configurable I/O dies and configurable analog dies which could be connected together to construct various configurable systems. In fact, these embodiments of the invention may allow mixing and matching among configurable dies, fixed function dies, and dies manufactured in different processes.

Some embodiments of the invention may provide additional illustrated benefits by making use of special type of transistors placed above or below the antifuse configurable interconnect circuits to allow for a far better use of the silicon area. In general an FPGA device that utilizes antifuses to configure the device function may include the electronic circuits to program the antifuses. The programming circuits may be used primarily to configure the device and may be mostly an overhead once the device is configured. The programming voltage used to program the antifuse may typically be significantly higher than the voltage used for the operating circuits of the device. The design of the antifuse structure may be designed such that an unused antifuse may not accidentally get fused. Accordingly, the incorporation of the antifuse programming in the silicon substrate may entail special attention for a resulting higher voltage, and additional silicon area may, accordingly, be allocated.

Unlike the operating transistors designed to operate as fast as possible and to enable fast system performance, the programming circuits could operate relatively slowly. Accordingly using a thin film transistor for the programming circuits could fit very well with the function and may reduce the needed silicon area.

The programming circuits may, therefore, be constructed with thin film transistors, which may be fabricated after the fabrication of the operating circuitry, on top of the configurable interconnection layers that incorporate and use the antifuses. An additional illustrated advantage of such embodiments of the invention may be the ability to reduce cost of the high volume production. One may only need to use mask-defined links instead of the antifuses and their programming circuits. One custom via mask may be used, and this may save steps associated with the fabrication of the antifuse layers, the thin film transistors, and/or the associated connection layers of the programming circuitry.

In accordance with an embodiment of the invention an Integrated Circuit device may thus be provided, including a plurality of antifuse configurable interconnect circuits and a plurality of transistors to configure at least one of said antifuses; wherein said transistors are fabricated after said antifuse.

Further provided in accordance with an embodiment of the invention may provide an Integrated Circuit device including: a plurality of antifuse configurable interconnect circuits and plurality of transistors to configure at least one of said antifuses; wherein said transistors are placed over said antifuse.

Still further in accordance with an embodiment of the illustrated invention of the Integrated Circuit device may include second antifuse configurable logic cells and a plurality of second transistors to configure said second antifuses wherein these second transistors may be fabricated before said second antifuses.

Still further in accordance with an embodiment of the illustrated invention the Integrated Circuit device may also include second antifuse configurable logic cells and a plurality of second transistors to configure said second antifuses wherein said second transistors may be placed underneath said second antifuses.

Further provided in accordance with an embodiment of the illustrated invention may be an Integrated Circuit device including: first antifuse layer, at least two metal layers over it and a second antifuse layer overlaying the two metal layers.

In accordance with an embodiment of the invention a configurable logic device may be presented, including: antifuse configurable look up table logic interconnected by antifuse configurable interconnect.

In accordance with an embodiment of the illustrated invention a configurable logic device may also be provided, including: a plurality of configurable look up table logic, a plurality of configurable programmable logic array (PLA) logic, and a plurality of antifuse configurable interconnect.

In accordance with an embodiment of the invention a configurable logic device may also be provided, including: a plurality of configurable look up table logic and a plurality of configurable drive cells wherein the drive cells may be configured by plurality of antifuses.

In accordance with an embodiment of the illustrated invention, a configurable logic device may additionally be provided, including: configurable logic cells interconnected by a plurality of antifuse configurable interconnect circuits wherein at least one of the antifuse configurable interconnect circuits may be configured as part of a non volatile memory.

Further in accordance with an embodiment of the invention, the configurable logic device may include at least one antifuse configurable interconnect circuit, which may also be configurable to a PLA function.

In accordance with an alternative embodiment of the invention, an integrated circuit system may also be provided, including a configurable logic die and an I/O die wherein the configurable logic die may be connected to the I/O die by the use of Through-Silicon-Via.

Further in accordance with an embodiment of the invention, the integrated circuit system may include; a configurable logic die and a memory die wherein the configurable logic die and the memory die may be connected by the use of Through-Silicon-Via.

Still further in accordance with an embodiment of the invention the integrated circuit system may include a first configurable logic die and second configurable logic die wherein the first configurable logic die and the second configurable logic die may be connected by the use of Through-Silicon-Via.

Moreover in accordance with an embodiment of the invention, the integrated circuit system may include an I/O die that may be fabricated utilizing a different process than the process utilized to fabricate the configurable logic die.

Further in accordance with an embodiment of the invention, the integrated circuit system may include at least two logic dies connected by the use of Through-Silicon-Via and wherein some of the Through-Silicon-Vias may be utilized to carry the system bus signal.

Moreover in accordance with an embodiment of the invention, the integrated circuit system may include at least one configurable logic device.

Further in accordance with an embodiment of the invention, the integrated circuit system may include, an antifuse configurable logic die and programmer die which may be connected by the use of Through-Silicon-Via.

Additionally there is a growing need to reduce the impact of inter-chip interconnects. In fact, interconnects may be now dominating IC performance and power. One solution to shorten interconnect may be to use a 3D IC. Currently, the only known way for general logic 3D IC is to integrate finished device one on top of the other by utilizing Through-Silicon-Vias as now called TSVs. The problem with TSVs may be that their large size, usually a few microns each, may severely limit the number of connections that can be made. Some embodiments of the invention may provide multiple alternatives to constructing a 3D IC wherein many connections may be made less than one micron in size, thus enabling the use of 3D IC technology for most device applications.

Additionally some embodiments of the invention may offer new device alternatives by utilizing the proposed 3D IC technology.

Unlike prior art, various embodiments of the present invention suggest constructing the programming transistors not in the base silicon diffusion layer but rather above or below the antifuse configurable interconnect circuits. The programming voltage used to program the antifuse may be typically significantly higher than the voltage used for the operational circuits of the device. This may be part of the design of the antifuse structure so that the antifuse may not become accidentally activated. In addition, extra attention, design effort, and silicon resources might be needed to make sure that the programming phase may not damage the operating circuits. Accordingly the incorporation of the antifuse programming transistors in the silicon substrate may need attention and extra silicon area.

Unlike the operational transistors designed to operate as fast as possible and so to enable fast system performance, the programming circuits could operate relatively slowly. Accordingly, a thin film transistor for the programming circuits could provide the function and could reduce the silicon area.

Alternatively other type of transistors, such as Vacuum FET, bipolar, etc., could be used for the programming circuits and may be placed not in the base silicon but rather above or below the antifuse configurable interconnect.

Yet in another alternative the programming transistors and the programming circuits could be fabricated on SOI wafers which may then be bonded to the configurable logic wafer and connected to it by the use of through-silicon-via (TSV), or through layer via (TLV). An illustrated advantage of using an SOI wafer for the antifuse programming function may be that the high voltage transistors that could be built on it are very efficient and could be used for the programming circuitry including support functions such as the programming controller function. Yet as an additional variation, the programming circuits could be fabricated by an older process on SOI wafers to further reduce cost. Moreover, the programming circuits could be fabricated by a different process technology than the logic wafer process technology. Furthermore, the wafer fab that the programming circuits may be fabricated at may be different than the wafer fab that the logic circuits are fabricated at and located anywhere in the world.

A common objective may be to reduce cost for high volume production without redesign and with minimal additional mask cost. The use of thin-film-transistors, for the programming transistors, may enable a relatively simple and direct volume cost reduction. Instead of embedding antifuses in the isolation layer a custom mask could be used to define vias on substantially all the locations that used to have their respective antifuse activated. Accordingly the same connection between the strips that used to be programmed may now be connected by fixed vias. This may allow saving the cost associated with the fabrication of the antifuse programming layers and their programming circuits. It should be noted that there might be differences between the antifuse resistance and the mask defined via resistance. A conventional way to handle it may be by providing the simulation models for both options so the designer could validate that the design may work properly in both cases.

An additional objective for having the programming circuits above the antifuse layer may be to achieve better circuit density. Many connections may be needed to connect the programming transistors to their respective metal strips. If those connections are going upward they could reduce the circuit overhead by not blocking interconnection routes on the connection layers underneath.

FIG. 1 is a drawing illustration of a programmable device layers structure according to an alternative embodiment of the invention. In this alternative embodiment, there are two layers including antifuses. The first may be designated to configure the logic terrain and, in some cases, may also configure the logic clock distribution. The first antifuse layer could also be used to manage some of the power distribution to save power by not providing power to unused circuits. This layer could also be used to connect some of the long routing tracks and/or connections to the inputs and outputs of the logic cells.

The device fabrication of the example shown in FIG. 1 may start with the semiconductor substrate, such as monocrystalline silicon substrate 102, comprising the transistors used for the logic cells and also the first antifuse layer programming transistors. Thereafter, logic fabric/first antifuse layer 104 may be constructed, which may include multiple layers, such as Metal 1, dielectric, Metal 2, and sometimes Metal 3. These layers may be used to construct the logic cells and often I/O and other analog cells. In this alternative embodiment of the invention, a plurality of first antifuses may be incorporated in the isolation layer between metal 1 and metal 2 or in the isolation layer between metal 2 and metal 3 and the corresponding programming transistors could be embedded in the silicon substrate 102 being underneath the first antifuses. The first antifuses could be used to program logic cells and to connect individual cells to construct larger logic functions. The first antifuses could also be used to configure the logic clock distribution. The first antifuse layer could also be used to manage some of the power distribution to save power by not providing power to unused circuits. This layer could also be used to connect some of the long routing tracks and/or one or more connections to the inputs and outputs of the cells.

Interconnection layer 106 could include multiple layers of long interconnection tracks for power distribution and clock networks, or a portion thereof, in addition to structures already fabricated in the first few layers, for example, logic fabric/first antifuse layer 104.

Second antifuse layer 107 could include many layers, including the antifuse configurable interconnection fabric. It might be called the short interconnection fabric, too. If metal 6 and metal 7 are used for the strips of this configurable interconnection fabric then the second antifuse may be embedded in the dielectric layer between metal 6 and metal 7.

The programming transistors and the other parts of the programming circuit could be fabricated afterward and be on top of the configurable interconnection fabric programming transistors 110. The programming element could be a thin film transistor or other alternatives for over oxide transistors as was mentioned previously. In such case the antifuse programming transistors may be placed over the antifuse layer, which may thereby enable the configurable interconnect in second antifuse layer 107 or logic fabric/first antifuse layer 104. It should be noted that in some cases it might be useful to construct part of the control logic for the second antifuse programming circuits, in the base layers such as silicon substrate 102 and logic fabric/first antifuse layer 104.

The final step may include constructing the connection to the outside 112. The connection could be pads for wire bonding, soldering balls for flip chip, optical, or other connection structures such as those connection structures for TSV.

In another alternative embodiment of the invention the antifuse programmable interconnect structure could be designed for multiple use. The same structure could be used as a part of the interconnection fabric, or as a part of the PLA logic cell, or as part of a Read Only Memory (ROM) function. In an FPGA product it might be desirable to have an element that could be used for multiple purposes. Having resources that could be used for multiple functions could increase the utility of the FPGA device.

Figure 1A:
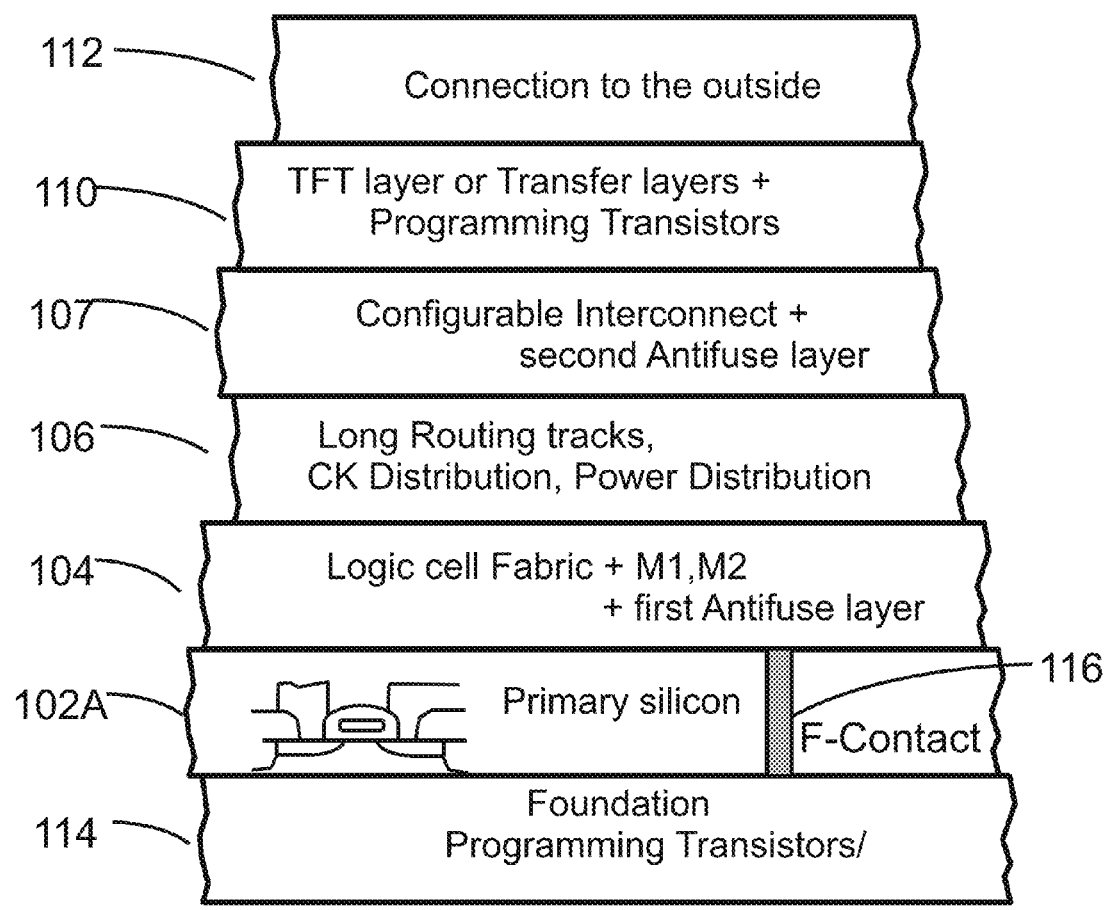
FIG. 1A is an exemplary drawing illustration of a programmable device layers structure.

FIG. 1A is a drawing illustration of a programmable device layers structure according to another alternative embodiment of the invention. In this alternative embodiment, there may be an additional circuit of Foundation layer 114 connected by through silicon via connections 116 to the fabric/first antifuse layer 104 logic or antifuses. This underlying device of circuit of Foundation layer 114 may provide the programming transistor for the logic fabric/first antifuse layer 104. In this way, the programmable device substrate diffusion, such as primary silicon layer 102A, may not be prone to the cost penalty of the programming transistors for the logic fabric/first antifuse layer 104. Accordingly the programming connection of the logic fabric/first antifuse layer 104 may be directed downward to connect to the underlying programming device of Foundation layer 114 while the programming connection to the second antifuse layer 107 may be directed upward to connect to the programming circuit programming transistors 110. This could provide less congestion of the circuit internal interconnection routes.

FIG. 1A is a cut illustration of a programmable device, with two antifuse layers. The programming transistors for the first logic fabric/first antifuse layer 104 could be prefabricated on Foundation layer 114, and then, utilizing "smart-cut", a single crystal, or mono-crystalline, transferred silicon layer 204 may be transferred on which the primary programmable logic of primary silicon layer 102A may be fabricated with advanced logic transistors and other circuits. Then multi-metal layers are fabricated including a lower layer of antifuses in logic fabric/first antifuse layer 104, interconnection layer 106 and second antifuse layer 107 with its configurable interconnects. For the second antifuse layer 107 the programming transistors 110 could be fabricated also utilizing a second "smart-cut" layer transfer.

The term layer transfer in the use herein may be defined as the technological process or method that enables the transfer of very fine layers of crystalline material onto a mechanical support, wherein the mechanical support may be another layer or substrate of crystalline material. For example, the "SmartCut" process, also used herein as the term 'ion-cut' process, together with wafer bonding technology, may enable a "Layer Transfer" whereby a thin layer of a single or mono-crystalline silicon wafer may be transferred from one wafer or substrate to another wafer or substrate. Other specific layer transfer processes may be described or referenced herein.

The terms monocrystalline or mono-crystalline in the use herein of, for example, monocrystalline or mono-crystalline layer, material, or silicon, may be defined as "a single crystal body of crystalline material that contains no large-angle boundaries or twin boundaries as in ASTM F1241, also called monocrystal" and "an arrangement of atoms in a solid that has perfect periodicity (that is, no defects)" as in the SEMATECH dictionary. The terms single crystal and monocrystal are equivalent in the SEMATECH dictionary. The term single crystal in the use herein of, for example, single crystal silicon layer, single crystal layer, may be equivalently defined as monocrystalline.

The term via in the use herein may be defined as "an opening in the dielectric layer(s) through which a riser passes, or in which the walls are made conductive; an area that provides an electrical pathway [connection path] from one metal layer to the metal layer above or below," as in the SEMATECH dictionary. The term through silicon via (TSV) in the use herein may be defined as an opening in a silicon layer(s) through which an electrically conductive riser passes, and in which the walls are made isolative from the silicon layer; a riser that provides an electrical pathway [connection path] from one metal layer to the metal layer above or below. The term through layer via (TLV) in the use herein may be defined as an opening in a layer transferred layer(s) through which an electrically conductive riser passes, wherein the riser may pass through at least one isolating region, for example, a shallow trench isolation (STI) region in the transferred layer, may typically have a riser diameter of less than 200 nm, a riser that provides an electrical pathway [connection path] from one metal layer to the metal layer above or below. In some cases, a TLV may additionally pass thru an electrically conductive layer, and the walls may be made isolative from the conductive layer.

The reference 108 in subsequent figures can be any one of a vast number of combinations of possible preprocessed wafers or layers containing many combinations of transfer layers that fall within the scope of the invention. The term "preprocessed wafer or layer" may be generic and reference number 108 when used in a drawing figure to illustrate an embodiment of the present invention may represent many different preprocessed wafer or layer types including but not limited to underlying prefabricated layers, a lower layer interconnect wiring, a base layer, a substrate layer, a processed house wafer, an acceptor wafer, a logic house wafer, an acceptor wafer house, an acceptor substrate, target wafer, preprocessed circuitry, a preprocessed circuitry acceptor wafer, a base wafer layer, a lower layer, an underlying main wafer, a foundation layer, an attic layer, or a house wafer.

FIG. 1B is a drawing illustration of a generalized preprocessed wafer or layer 108. The wafer or layer 108 may have preprocessed circuitry, such as, for example, logic circuitry, microprocessors, MEMS, circuitry comprising transistors of various types, and other types of digital or analog circuitry including, but not limited to, the various embodiments described herein. Preprocessed wafer or layer 108 may have preprocessed metal interconnects and may include copper or aluminum. The metal layer or layers of interconnect may be constructed of lower (less than about 400° C.) thermal damage resistant metals such as, for example, copper or aluminum, or may be constructed with refractory metals such as tungsten to provide high temperature utility at greater than about 400° C. The preprocessed metal interconnects may be designed and prepared for layer transfer and electrical coupling from preprocessed wafer or layer 108 to the layer or layers to be transferred.

FIG. 1C is a drawing illustration of a generalized transfer layer 109 prior to being attached to preprocessed wafer or layer 108. Transfer layer 109 may be attached to a carrier wafer or substrate during layer transfer. Preprocessed wafer or layer 108 may be called a target wafer, acceptor substrate, or acceptor wafer. The acceptor wafer may have acceptor wafer metal connect pads or strips designed and prepared for electrical coupling to transfer layer 109. Transfer layer 109 may be attached to a carrier wafer or substrate during layer transfer. Transfer layer 109 may have metal interconnects designed and prepared for layer transfer and electrical coupling to preprocessed wafer or layer 108. The metal interconnects now on transfer layer 109 may include copper or aluminum. Electrical coupling from transferred layer 109 to preprocessed wafer or layer 108 may utilize through layer vias (TLVs) as the connection path. Transfer layer 109 may be comprised of single crystal silicon, or mono-crystalline silicon, or doped mono-crystalline layer or layers, or other semiconductor, metal, and insulator materials, layers; or multiple regions of single crystal silicon, or mono-crystalline silicon, or doped mono-crystalline silicon, or other semiconductor, metal, or insulator materials.

Figure 1D:
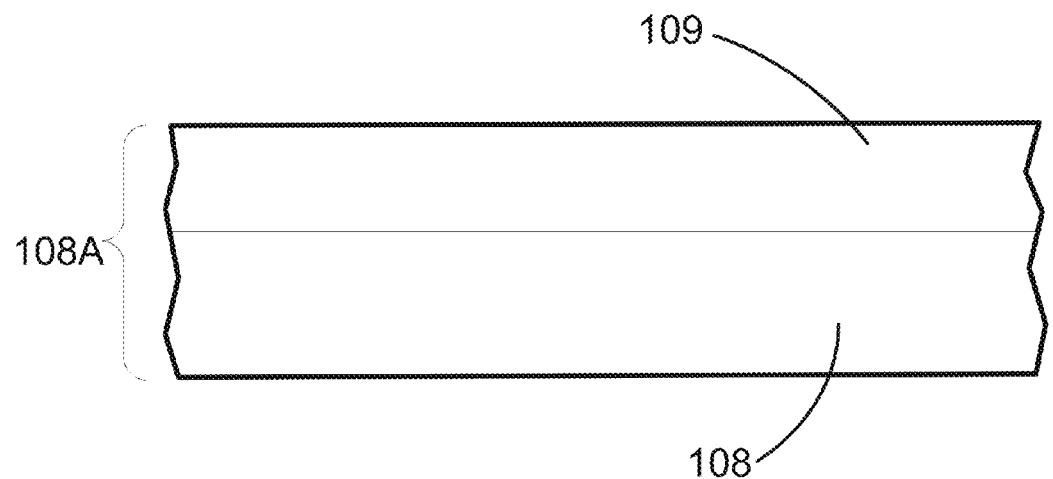

FIG. 1D is a drawing illustration of a preprocessed wafer or layer 108A created by the layer transfer of transfer layer 109 on top of preprocessed wafer or layer 108. The top of preprocessed wafer or layer 108A may be further processed with metal interconnects designed and prepared for layer transfer and electrical coupling from preprocessed wafer or layer 108A to the next layer or layers to be transferred.

Figure 1E:
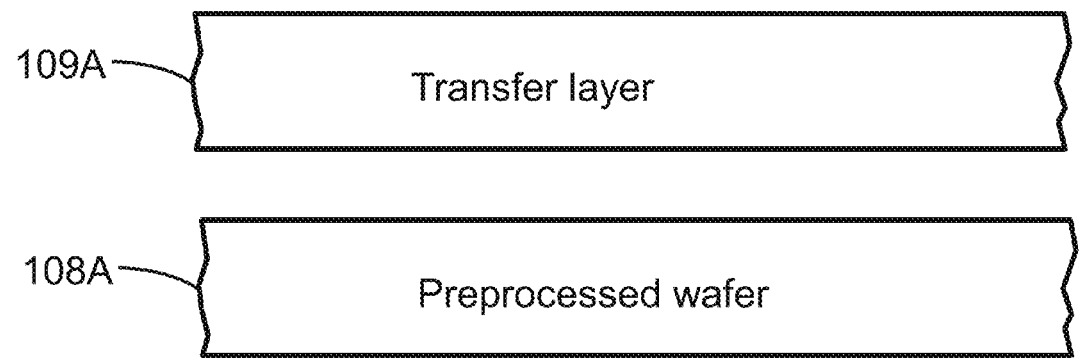

FIG. 1E is a drawing illustration of a generalized transfer layer 109A prior to being attached to preprocessed wafer or layer 108A. Transfer layer 109A may be attached to a carrier wafer or substrate during layer transfer. Transfer layer 109A may have metal interconnects designed and prepared for layer transfer and electrical coupling to preprocessed wafer or layer 108A.

Figure 1F:
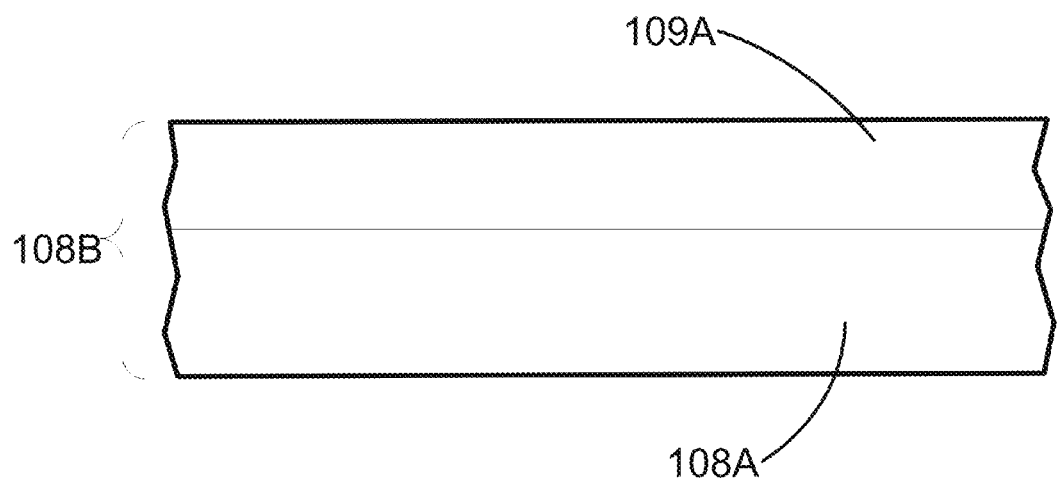

FIG. 1F is a drawing illustration of a preprocessed wafer or layer 108B created by the layer transfer of transfer layer 109A on top of preprocessed wafer or layer 108A. The top of preprocessed wafer or layer 108B may be further processed with metal interconnects designed and prepared for layer transfer and electrical coupling from preprocessed wafer or layer 108B to the next layer or layers to be transferred.

Figure 1G:
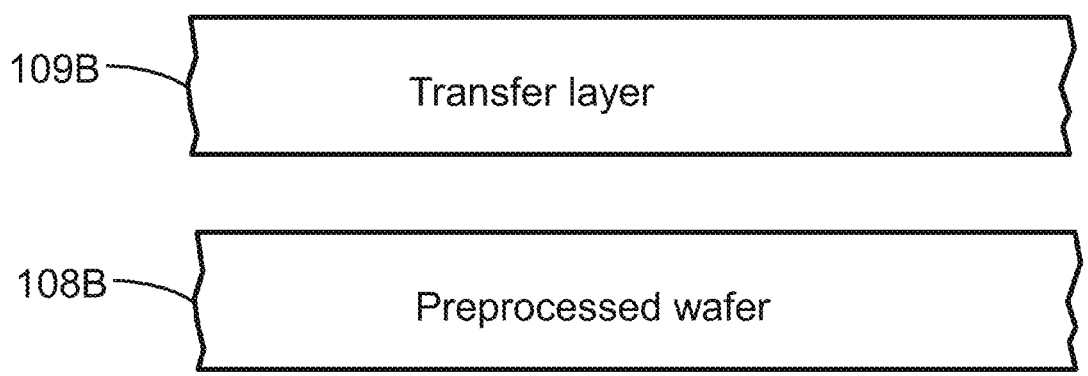

FIG. 1G is a drawing illustration of a generalized transfer layer 109B prior to being attached to preprocessed wafer or layer 108B. Transfer layer 109B may be attached to a carrier wafer or substrate during layer transfer. Transfer layer 109B may have metal interconnects designed and prepared for layer transfer and electrical coupling to preprocessed wafer or layer 108B.

Figure 1H:

FIG. 1H is a drawing illustration of preprocessed wafer or layer 108C created by the layer transfer of transfer layer 109B on top of preprocessed wafer or layer 108B. The top of preprocessed wafer or layer 108C may be further processed with metal interconnect designed and prepared for layer transfer and electrical coupling from preprocessed wafer or layer 108C to the next layer or layers to be transferred.

Figure 1I:
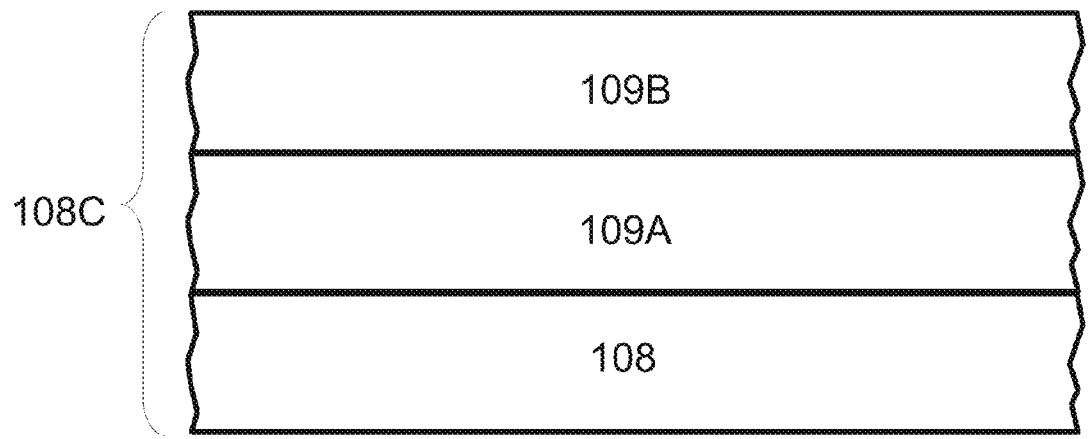

FIG. 1I is a drawing illustration of preprocessed wafer or layer 108C, a 3D IC stack, which may comprise transferred layers 109A and 109B on top of the original preprocessed wafer or layer 108. Transferred layers 109A and 109B and the original preprocessed wafer or layer 108 may include transistors of one or more types in one or more layers, metallization such as, for example, copper or aluminum in one or more layers, interconnections to and between layers above and below, and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be junction-less transistors or recessed channel array transistors. Transferred layers 109A and 109B and the original preprocessed wafer or layer 108 may further comprise semiconductor devices such as resistors and capacitors and inductors, one or more programmable interconnects, memory structures and devices, sensors, radio frequency devices, or optical interconnect with associated transceivers. Transferred layers 109A and 109B and the original preprocessed wafer or layer 108 may further include isolation layers, such as, for example, silicon and/or carbon containing oxides and/or low-k dielectrics and/or polymers, which may facilitate oxide to oxide wafer or substrate bonding and may electrically isolate, for example, one layer, such as transferred layer 109A, from another layer, such as preprocessed wafer or layer 108. The terms carrier wafer or carrier substrate may also be called holder wafer or holder substrate. The terms carrier wafer or substrate used herein may be a wafer, for example, a monocrystalline silicon wafer, or a substrate, for example, a glass substrate, used to hold, flip, or move, for example, other wafers, layers, or substrates, for further processing. The attachment of the carrier wafer or substrate to the carried wafer, layer, or substrate may be permanent or temporary.

This layer transfer process can be repeated many times, thereby creating preprocessed wafers comprising many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

The thinner the transferred layer, the smaller the through layer via (TLV) diameter obtainable, due to the potential limitations of manufacturable via aspect ratios. Thus, the transferred layer may be, for example, less than about 2 microns thick, less than about 1 micron thick, less than about 0.4 microns thick, less than about 200 nm thick, or less than about 100 nm thick. The TLV diameter may be less than about 400 nm, less than about 200 nm, less than about 80 nm, less than about 40 nm, or less than about 20 nm. The thickness of the layer or layers transferred according to some embodiments of the present invention may be designed as such to match and enable the best obtainable lithographic resolution capability of the manufacturing process employed to create the through layer vias or any other structures on the transferred layer or layers.

In many of the embodiments of the invention, the layer or layers transferred may be of a crystalline material, for example, mono-crystalline silicon, and after layer transfer, further processing, such as, for example, plasma/RIE or wet etching, may be done on the layer or layers that may create islands or mesas of the transferred layer or layers of crystalline material, for example, mono-crystalline silicon, the crystal orientation of which has not changed. Thus, a mono-crystalline layer or layers of a certain specific crystal orientation may be layer transferred and then processed whereby the resultant islands or mesas of mono-crystalline silicon have the same crystal specific orientation as the layer or layers before the processing. After this processing, the resultant islands or mesas of crystalline material, for example, mono-crystalline silicon, may be still referred to herein as a layer, for example, mono-crystalline layer, layer of mono-crystalline silicon, and so on.

Persons of ordinary skill in the art will appreciate that the illustrations in FIGS. 1 through 1I are exemplary only and are not drawn to scale. Such skilled persons will further appreciate that many variations may be possible such as, for example, the preprocessed wafer or layer 108 may act as a base or substrate layer in a wafer transfer flow, or as a preprocessed or partially preprocessed circuitry acceptor wafer in a wafer transfer process flow. Moreover, layer transfer techniques, such as 'ion-cut' that may form a layer transfer demarcation plane by ion implantation of hydrogen molecules or atoms, or any other layer transfer technique described herein or utilized in industry, may be utilized in the generalized FIG. 1 flows and applied throughout herein. Furthermore, metal interconnect strips may be formed on the acceptor wafer and/or transferred layer to assist the electrical coupling of circuitry between the two layers, and may utilize TLVs. Many other modifications within the scope of the illustrated embodiments of the invention described herein will suggest themselves to such skilled persons after reading this specification. Thus the invention is to be limited only by the appended claims.

A technology for such underlying circuitry may be to use the "SmartCut" process. The "SmartCut" process is a well understood technology used for fabrication of SOI wafers. The "SmartCut" process, together with wafer bonding technology, may enable a "Layer Transfer" whereby a thin layer of a single or mono-crystalline silicon wafer may be transferred from one wafer to another wafer. The "Layer Transfer" could be done at less than about 400° C. and the resultant transferred layer could be even less than about 100 nm thick. The transferred layer thickness may typically be about 100 nm, and may be a thin as about 5 nm in currently demonstrated fully depleted SOI (FDSOI) wafer manufacturing by Soitec. In most applications described herein in this invention the transferred layer thickness may be less than about 400 nm and may be less than about 200 nm for logic applications. The process with some variations and under different names may be commercially available by two companies, namely, Soitec (Crolles, France) and SiGen—Silicon Genesis Corporation (San Jose, Calif.). A room temperature wafer bonding process utilizing ion-beam preparation of the wafer surfaces in a vacuum has been recently demonstrated by Mitsubishi Heavy Industries Ltd., Tokyo, Japan. This process may allow for room temperature layer transfer.

Alternatively, other technology may also be used. For example, other technologies may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) is selectively etched off. The now thinned donor wafer may be subsequently aligned and low-temperature oxide-to-oxide bonded to the acceptor wafer topside. A low temperature release of the glass handle wafer from the thinned donor wafer may be performed, and then through bond via connections may be made. Additionally, epitaxial liftoff (ELO) technology as shown by P. Demeester, et. al, of IMEC in Semiconductor Science Technology 1993 may be utilized for layer transfer. ELO may make use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, may etch the exposed release layer, such as, for example, silicon oxide in SOI or AlAs. After liftoff, the transferred layer may then be aligned and bonded to the acceptor substrate or wafer. The manufacturability of the ELO process for multilayer layer transfer use was recently improved by J. Yoon, et. al., of the University of Illinois at Urbana-Champaign as described in Nature May 20, 2010. Canon developed a layer transfer technology called ELTRAN—Epitaxial Layer TRANsfer from porous silicon. ELTRAN may be utilized. The Electrochemical Society Meeting abstract No. 438 from year 2000 and the JSAP International July 2001 paper show a seed wafer being anodized in an HF/ethanol solution to create pores in the top layer of silicon, the pores may be treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 2:
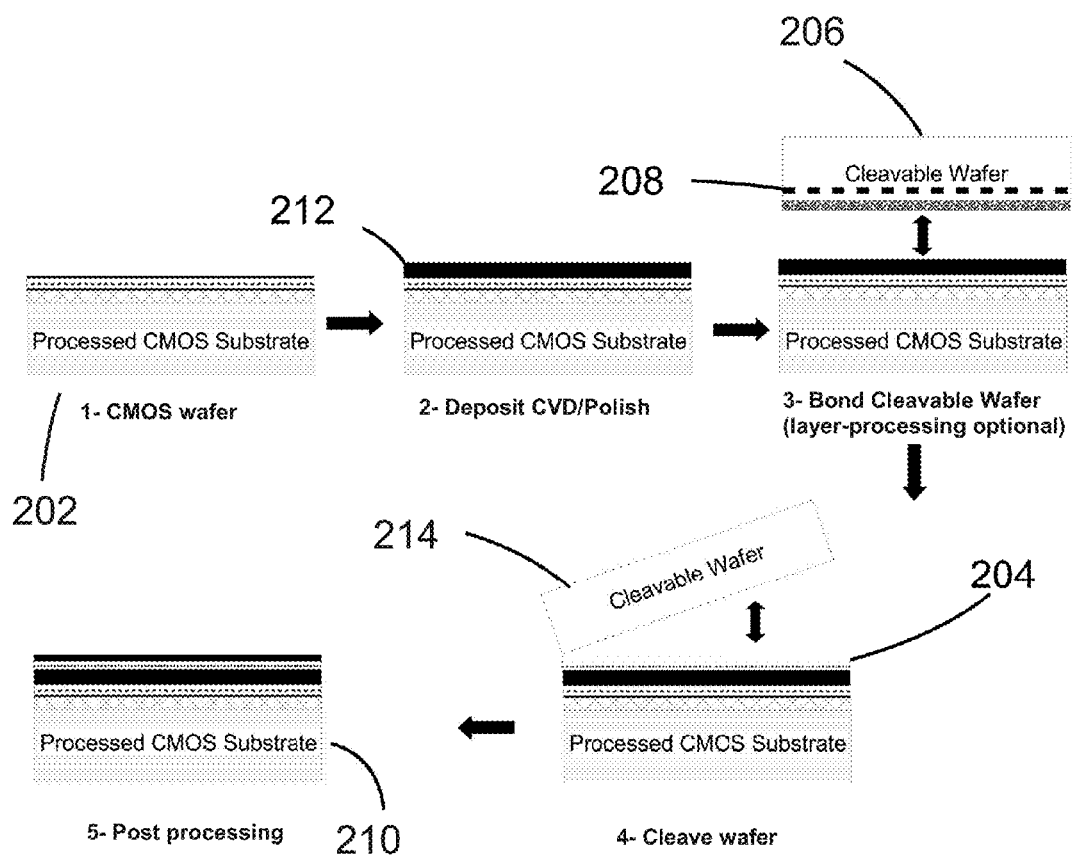
FIG. 2 is an exemplary drawing illustration of a layer transfer process flow.

FIG. 2 is a drawing illustration of a layer transfer process flow. In another illustrative embodiment of the invention, "Layer-Transfer" may be used for construction of the underlying circuitry of Foundation layer 114. Wafer 202 may include a monocrystalline silicon wafer that was processed to construct the underlying circuitry. The wafer 202 could be of the most advanced process or more likely a few generations behind. It could include the programming circuits of Foundation layer 114 and other useful structures and may be a preprocessed CMOS silicon wafer, or a partially processed CMOS, or other prepared silicon or semiconductor substrate. Wafer 202 may also be called an acceptor substrate or a target wafer. An oxide layer 212 may then be deposited on top of the wafer 202 and thereafter may be polished for better planarization and surface preparation. A donor wafer 206 may then be brought in to be bonded to wafer 202. The surfaces of both donor wafer 206 and wafer 202 may be pre-processed for low temperature bonding by various surface treatments, such as an RCA pre-clean that may comprise dilute ammonium hydroxide or hydrochloric acid, and may include plasma surface preparations to lower the bonding energy and enhance the wafer to wafer bond strength. The donor wafer 206 may be pre-prepared for "SmartCut" by an ion implant of an atomic species, such as H+ ions, at the desired depth to prepare the SmartCut line 208. SmartCut line 208 may also be called a layer transfer demarcation plane, shown as a dashed line. The SmartCut line 208 or layer transfer demarcation plane may be formed before or after other processing on the donor wafer 206. Donor wafer 206 may be bonded to wafer 202 by bringing the donor wafer 206 surface in physical contact with the wafer 202 surface, and then applying mechanical force and/or thermal annealing to strengthen the oxide to oxide bond. Alignment of the donor wafer 206 with the wafer 202 may be performed immediately prior to the wafer bonding. Acceptable bond strengths may be obtained with bonding thermal cycles that do not exceed about 400° C. After bonding the two wafers a SmartCut step may be performed to cleave and remove the top portion 214 of the donor wafer 206 along the SmartCut line 208. The cleaving may be accomplished by various applications of energy to the SmartCut line 208, or layer transfer demarcation plane, such as a mechanical strike by a knife or jet of liquid or jet of air, or by local laser heating, by application of ultrasonic or megasonic energy, or other suitable methods. The result may be a 3D wafer 210 which may include wafer 202 with a transferred silicon layer 204 of mono-crystalline silicon, or multiple layers of materials. Transferred silicon layer 204 may be polished chemically and mechanically to provide a suitable surface for further processing. Transferred silicon layer 204 could be quite thin at the range of about 50-200 nm. The described flow may be called "layer transfer". Layer transfer may be commonly utilized in the fabrication of SOI—Silicon On Insulator—wafers. For SOI wafers the upper surface may be oxidized so that after "layer transfer" a buried oxide—BOX—may provide isolation between the top thin mono-crystalline silicon layer and the bulk of the wafer. The use of an implanted atomic species, such as Hydrogen or Helium or a combination, to create a cleaving plane as described above may be referred to in this document as "SmartCut" or "ion-cut" and may be generally the illustrated layer transfer method.

Persons of ordinary skill in the art will appreciate that the illustrations in FIG. 2 are exemplary only and are not drawn to scale. Such skilled persons will further appreciate that many variations may be possible such as, for example, a heavily doped (greater than 1e20 atoms/cm3) boron layer or silicon germanium (SiGe) layer may be utilized as an etch stop either within the ion-cut process flow, wherein the layer transfer demarcation plane may be placed within the etch stop layer or into the substrate material below, or the etch stop layers may be utilized without an implant cleave process and the donor wafer may be, for example, etched away until the etch stop layer is reached. Such skilled persons will further appreciate that the oxide layer within an SOI or GeOI donor wafer may serve as the etch stop layer, and hence one edge of the oxide layer may function as a layer transfer demarcation plane. Moreover, the dose and energy of the implanted specie or species may be uniform across the surface area of the wafer or may have a deliberate variation, including, for example, a higher dose of hydrogen at the edges of a monocrystalline silicon wafer to promote cleaving. Many other modifications within the scope of the illustrated embodiments of the invention will suggest themselves to such skilled persons after reading this specification. Thus the invention is to be limited only by the appended claims.

Now that a "layer transfer" process may be used to bond a thin mono-crystalline silicon layer transferred silicon layer 204 on top of the preprocessed wafer 202, a standard process could ensue to construct the rest of the desired circuits as illustrated in FIG. 1A, starting with primary silicon layer 102A on the transferred silicon layer 204. The lithography step may use alignment marks on wafer 202 so the following circuits of primary silicon layer 102A and logic fabric/first antifuse layer 104 and so forth could be properly connected to the underlying circuits of Foundation layer 114. An aspect that should be accounted for is the high temperature that may be needed for the processing of circuits of primary silicon layer 102A. The pre-processed circuits on wafer 202 may need to withstand this high temperature associated with the activation of the semiconductor transistors of primary silicon layer 102A fabricated on the transferred silicon layer 204. Those circuits on wafer 202 may include transistors and local interconnects of poly-crystalline silicon (polysilicon or poly) and some other type of interconnection that could withstand high temperature such as tungsten. A processed wafer that can withstand subsequent processing of transistors on top at high temperatures may be a called the "Foundation" or a foundation wafer, layer or circuitry. An illustrated advantage of using layer transfer for the construction of the underlying circuits may include having the transferred silicon layer 204 be very thin which may enable the through silicon via connections 116, or through layer vias (TLVs), to have low aspect ratios and be more like normal contacts, which could be made very small and with minimum area penalty. The thin transferred layer may also allow conventional direct through-layer alignment techniques to be performed, thus increasing the density of through silicon via connections 116.

An additional alternative embodiment of the invention is where the foundation wafer 202 layer may be pre-processed to carry a plurality of back bias voltage generators. A known challenge in advanced semiconductor logic devices may be die-to-die and within-a-die parameter variations. Various sites within the die might have different electrical characteristics due to dopant variations and such. The parameters that can affect the variation may include the threshold voltage of the transistor. Threshold voltage variability across the die may be mainly due to channel dopant, gate dielectric, and critical dimension variability. This variation may become profound in sub 45 nm node devices. The usual implication may be that the design should be done for the worst case, resulting in a quite significant performance penalty. Alternatively complete new designs of devices are being proposed to solve this variability problem with significant uncertainty in yield and cost. A possible solution may be to use localized back bias to drive upward the performance of the worst zones and allow better overall performance with minimal additional power. The foundation-located back bias could also be used to minimize leakage due to process variation.

Figure 3A:
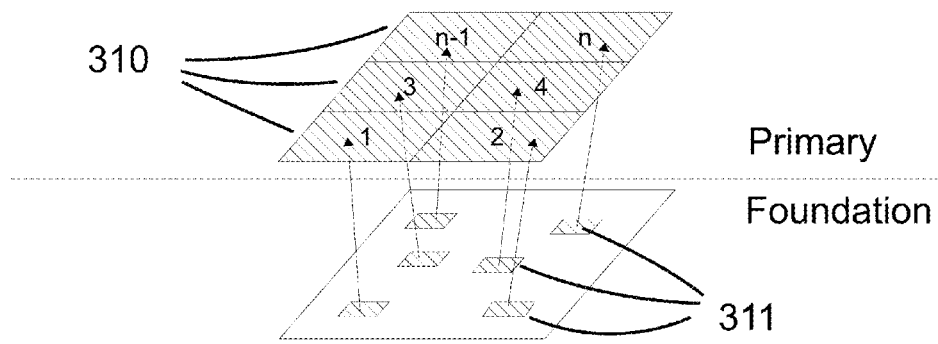
FIG. 3A is an exemplary topology drawing illustration of underlying back bias circuitry.

FIG. 3A is a topology drawing illustration of back bias circuitry. The foundation wafer 202 layer may carry back bias circuits 311 to allow enhancing the performance of some of the zones 310 on the primary device which otherwise will have lower performance.

Figure 3B:
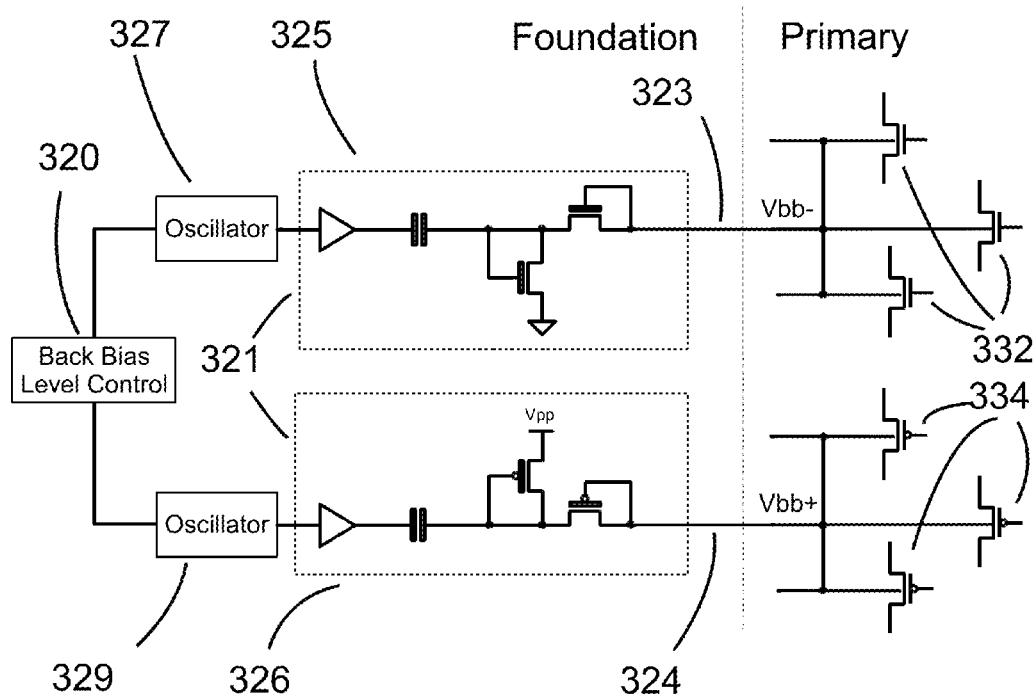
FIG. 3B is an exemplary drawing illustration of underlying back bias circuits.

FIG. 3B is a drawing illustration of back bias circuits. A back bias level control circuit 320 may be controlling the oscillators 327 and 329 to drive the voltage generators 321. The negative voltage generator 325 may generate the desired negative bias which may be connected to the primary circuit by connection 323 to back bias the N-channel Metal-Oxide-Semiconductor (NMOS) transistors 332 on the primary silicon transferred silicon layer 204. The positive voltage generator 326 may generate the desired negative bias which may be connected to the primary circuit by connection 324 to back bias the P-channel Metal-Oxide-Semiconductor (PMOS) transistors 334 on the primary silicon transferred silicon layer 204. The setting of the proper back bias level per zone may be done in the initiation phase. It could be done by using external tester and controller or by on-chip self test circuitry. As an example, a non volatile memory may be used to store the per zone back bias voltage level so the device could be properly initialized at power up. Alternatively a dynamic scheme could be used where different back bias level(s) are used in different operating modes of the device. Having the back bias circuitry in the foundation allows better utilization of the primary device silicon resources and less distortion for the logic operation on the primary device.

Figure 3C:
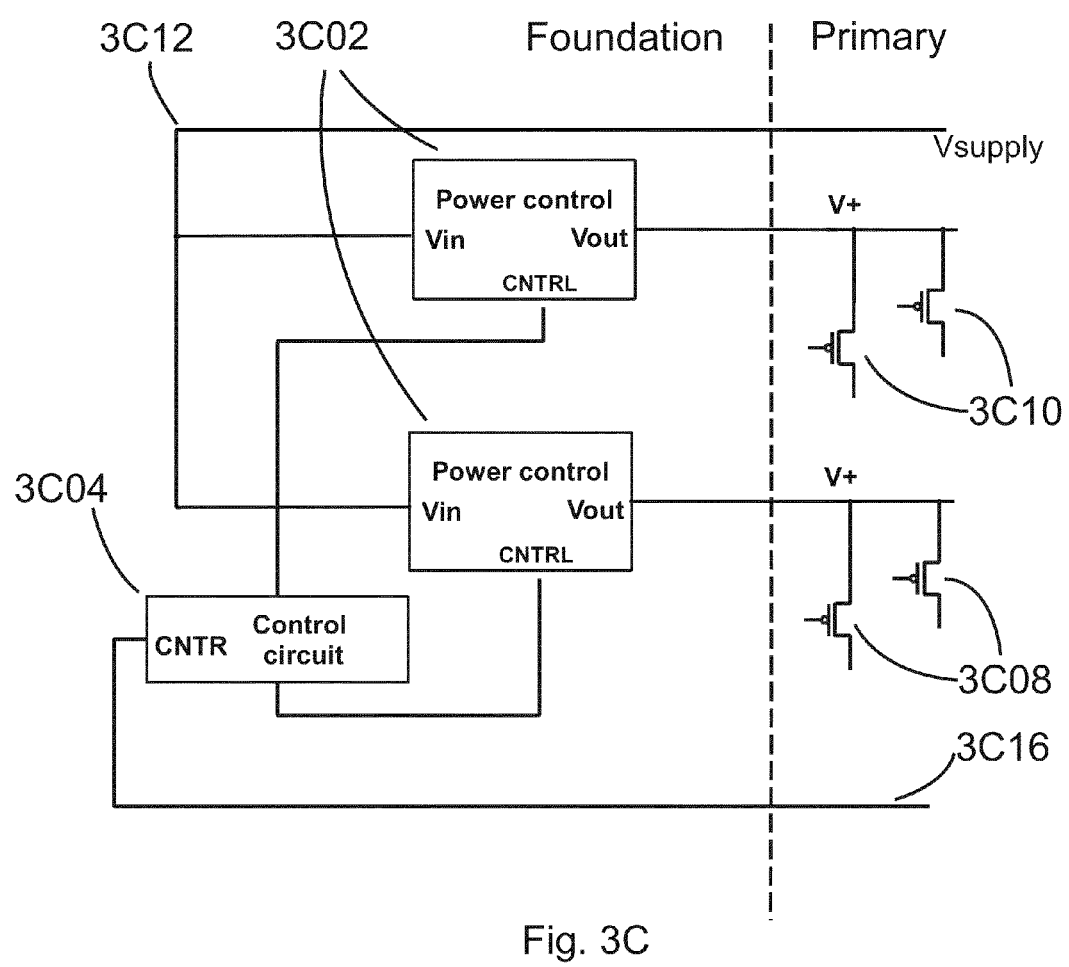
FIG. 3C is an exemplary drawing illustration of power control circuits.

FIG. 3C illustrates an alternative circuit function that may fit well in the "Foundation." In many IC designs it may be desired to integrate power control to reduce either voltage to sections of the device or to substantially totally power off these sections when those sections may not be needed or in an almost 'sleep' mode. In general such power control may be best done with higher voltage transistors. Accordingly a power control circuit cell 3C02 may be constructed in the Foundation. Such power control circuit cell 3C02 may have its own higher voltage supply and control or regulate supply voltage for sections 3C10 and 3C08 in the "Primary" device. The control may come from the primary device 3C16 and be managed by control circuit 3C04 in the Foundation.

Figure 3D:
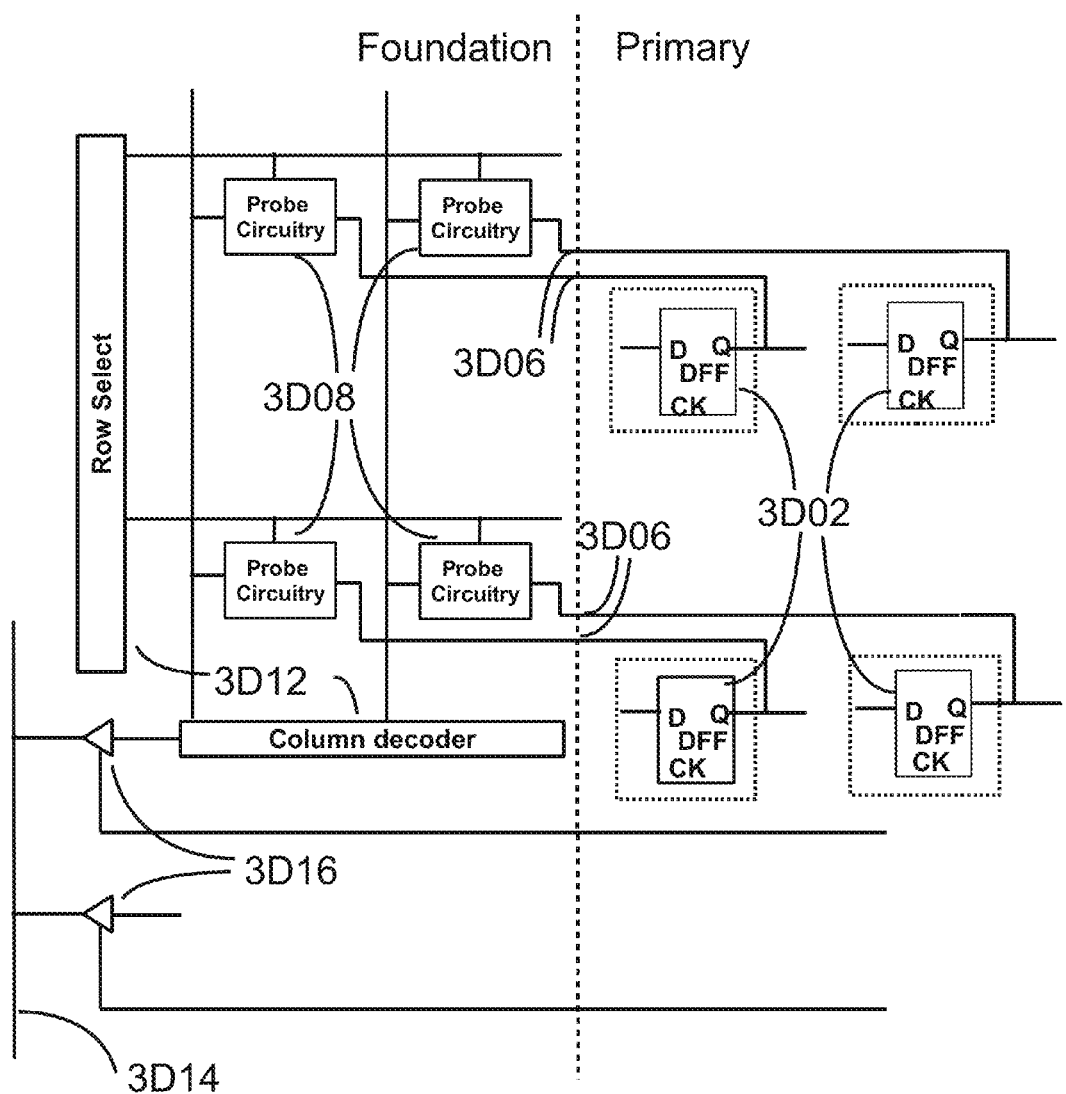
FIG. 3D is an exemplary drawing illustration of probe circuits.

FIG. 3D illustrates an alternative circuit function that may fit well in the "Foundation." In many IC designs it may be desired to integrate a probe auxiliary system that may make it very easy to probe the device in the debugging phase, and to support production testing. Probe circuits have been used in the prior art sharing the same transistor layer as the primary circuit. FIG. 3D illustrates a probe circuit constructed in the Foundation underneath the active circuits in the primary layer. FIG. 3D illustrates that the connections are made to the sequential active circuit elements 3D02. Those connections may be routed to the Foundation through interconnect lines 3D06 where high impedance probe circuits 3D08 may be used to sense the sequential element output. A selector circuit 3D12 may allow one or more of those sequential outputs to be routed out through one or more buffers 3D16 which may be controlled by signals from the Primary circuit to supply the drive of the sequential output signal to the probe output signal 3D14 for debugging or testing. Persons of ordinary skill in the art will appreciate that other configurations are possible like, for example, having multiple groups of probe circuits 3D08, multiple probe output signals 3D14, and controlling buffers 3D16 with signals not originating in the primary circuit.

Figure 4:
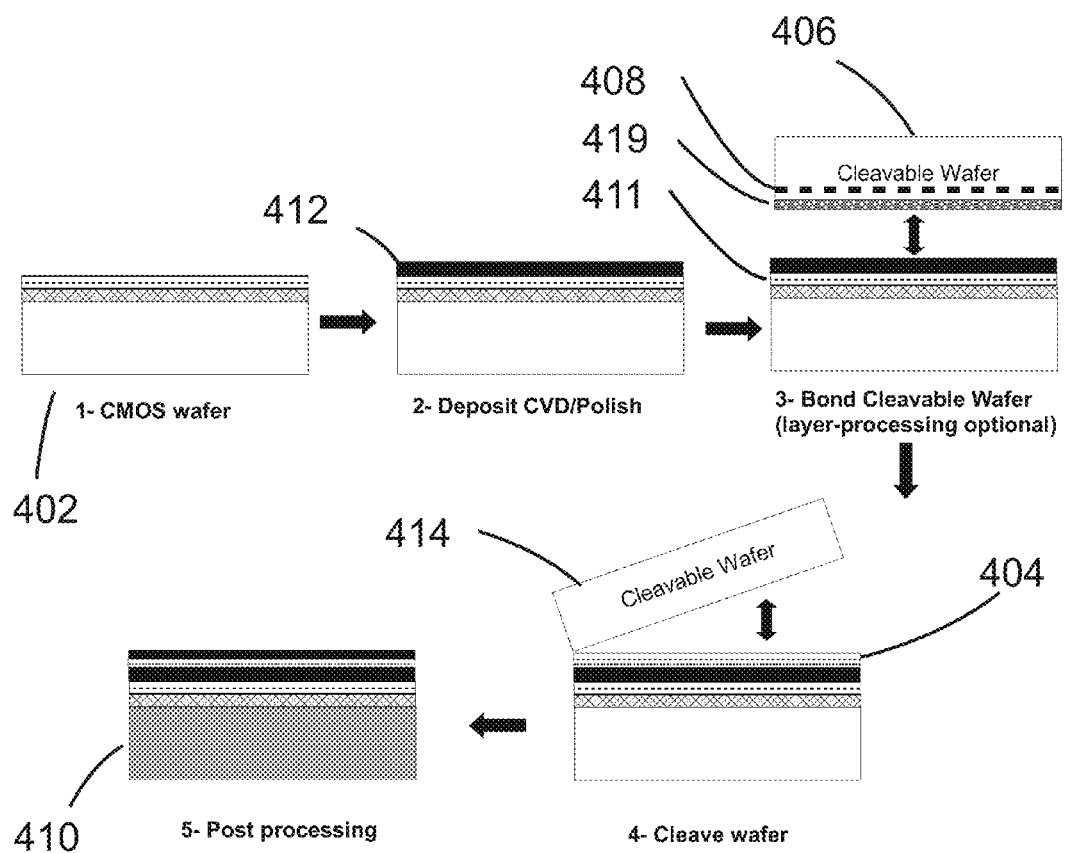
FIG. 4 is an exemplary drawing illustration of a layer transfer process flow.

FIG. 4 is a drawing illustration of the second layer transfer process flow. The primary processed wafer 402 may include all the prior layers—114, 102, 104, 106, and 107. Layer 411 may include metal interconnect for said prior layers. An oxide layer 412 may then be deposited on top of the wafer 402 and then be polished for better planarization and surface preparation. A donor wafer 406 (or cleavable wafer as labeled in the drawing) may be then brought in to be bonded to 402. The donor wafer 406 may be pre-processed to include the semiconductor layers 419 which may be later used to construct the top layer of programming transistors 110 as an alternative to the TFT transistors. The donor wafer 406 may also be prepared for "SmartCut" by ion implant of an atomic species, such as H+, at the desired depth to prepare the SmartCut line 408. After bonding the two wafers a SmartCut step may be performed to pull out the top portion 414 of the donor wafer 406 along the ion-cut layer/plane 408. This donor wafer may now also be processed and reused for more layer transfers. The result may be a 3D wafer 410 which may include wafer 402 with an added transferred layer 404 of single crystal silicon pre-processed to carry additional semiconductor layers. The transferred layer 404 could be quite thin at the range of about 10-40 nm. Utilizing "SmartCut" layer transfer may provide single crystal semiconductors layer on top of a pre-processed wafer without heating the pre-processed wafer to more than 400° C.

There may be a few alternative methods to construct the top transistors precisely aligned to the underlying pre-fabricated layers such as pre-processed wafer or layer 108, utilizing "SmartCut" layer transfer and not exceeding the temperature limit, typically about 400° C., of the underlying pre-fabricated structure, which may include low melting temperature metals or other construction materials such as, for example, aluminum or copper. As the layer transfer may be less than about 200 nm thick, then the transistors defined on it could be aligned precisely to the top metal layer of the pre-processed wafer or layer 108 as may be needed and those transistors may have state of the art layer to layer misalignment capability, for example, less than about 40 nm misalignment or less than about 4 nm misalignment, as well as through layer via, or layer to layer metal connection, diameters of less than about 50 nm, or even less than about 20 nm. The thinner the transferred layer, the smaller the through layer via diameter obtainable, due to the potential limitations of manufacturable via aspect ratios. The transferred layer may be, for example, less than about 2 microns thick, less than about 1 micron thick, less than about 0.4 microns thick, less than about 200 nm thick, or less than about 100 nm thick.

The term alignment mark in the use herein may be defined as "an image selectively placed within or outside an array for either testing or aligning, or both [ASTM F127-84], also called alignment key and alignment target," as in the SEMATECH dictionary. The alignment mark may, for example, be within a layer, wafer, or substrate of material processing or to be processed, and/or may be on a photomask or photoresist image, or may be a calculated position within, for example, a lithographic wafer stepper's software or memory.

An alternative method whereby to build both 'n' type and 'p' type transistors on the same layer may be to partially process the first phase of transistor formation on the donor wafer with normal CMOS processing including a 'dummy gate', a process known as gate-last transistors or process, or gate replacement transistors or process, or replacement gate transistors or process. In some embodiments of the invention, a layer transfer of the mono-crystalline silicon may be performed after the dummy gate is completed and before the formation of a replacement gate. Processing prior to layer transfer may have no temperature restrictions and the processing during and after layer transfer may be limited to low temperatures, generally, for example, below about 400° C. The dummy gate and the replacement gate may include various materials such as silicon and silicon dioxide, or metal and low k materials such as TiAlN and HfO2. An example may be the high-k metal gate (HKMG) CMOS transistors that have been developed for the 45 nm, 32 nm, 22 nm, and future CMOS generations. Intel and TSMC may have shown the advantages of a 'gate-last' approach to construct high performance HKMG CMOS transistors (C, Auth et al., VLSI 2008, pp 128-129 and C. H. Jan et al, 2009 IEDM p. 647).

Figures 1, 5B:
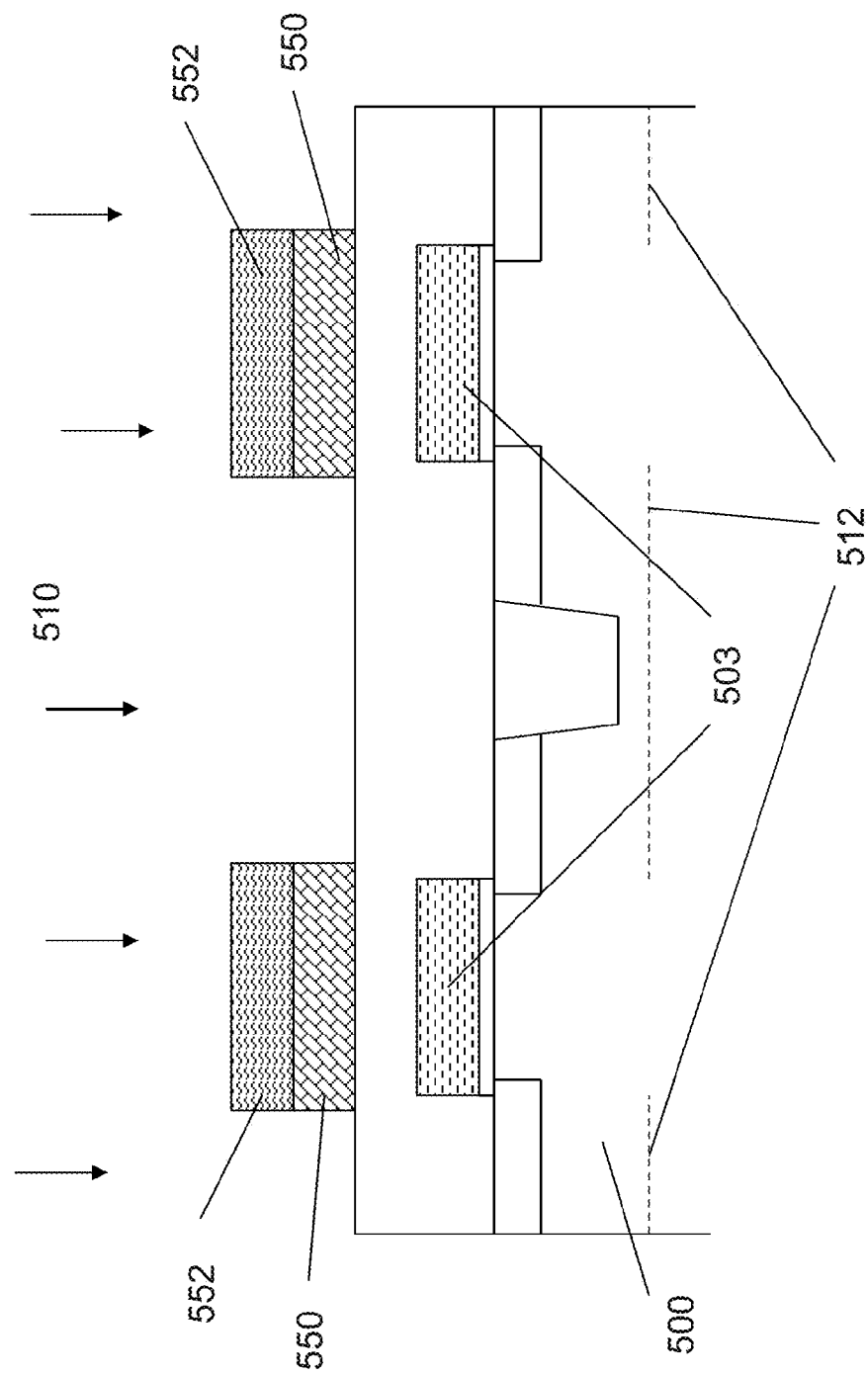

As illustrated in FIG. 5A, a bulk silicon donor wafer 500 may be processed in the normal state of the art HKMG gate-last manner up to the step prior to where CMP exposure of the polysilicon dummy gates takes place. FIG. 5A illustrates a cross section of the bulk silicon donor wafer 500, the isolation 502 between transistors, the polysilicon 504 and gate oxide 505 of both n-type and p-type CMOS dummy gates, their associated source and drains 506 for NMOS and 507 for PMOS, and the interlayer dielectric (ILD) 508. These structures of FIG. 5A illustrate completion of the first phase of transistor formation. At this step, or alternatively just after a CMP of ILD 508 to expose the polysilicon dummy gates or to planarize the ILD 508 and not expose the dummy gates, an implant of an atomic species 510, such as, for example, H+, may prepare the cleave plane 512 in the bulk of the donor substrate for layer transfer suitability, as illustrated in FIG. 5B.

The donor wafer 500 may be now temporarily bonded to carrier substrate 514 at interface 516 as illustrated in FIG. 5C with a low temperature process that may facilitate a low temperature release. The carrier substrate 514 may be a glass substrate to enable state of the art optical alignment with the acceptor wafer. A temporary bond between the carrier substrate 514 and the donor wafer 500 at interface 516 may be made with a polymeric material, such as polyimide DuPont HD3007, which can be released at a later step by laser ablation, Ultra-Violet radiation exposure, or thermal decomposition. Alternatively, a temporary bond may be made with uni-polar or bi-polar electrostatic technology such as, for example, the Apache tool from Beam Services Inc.

Figure 5D:
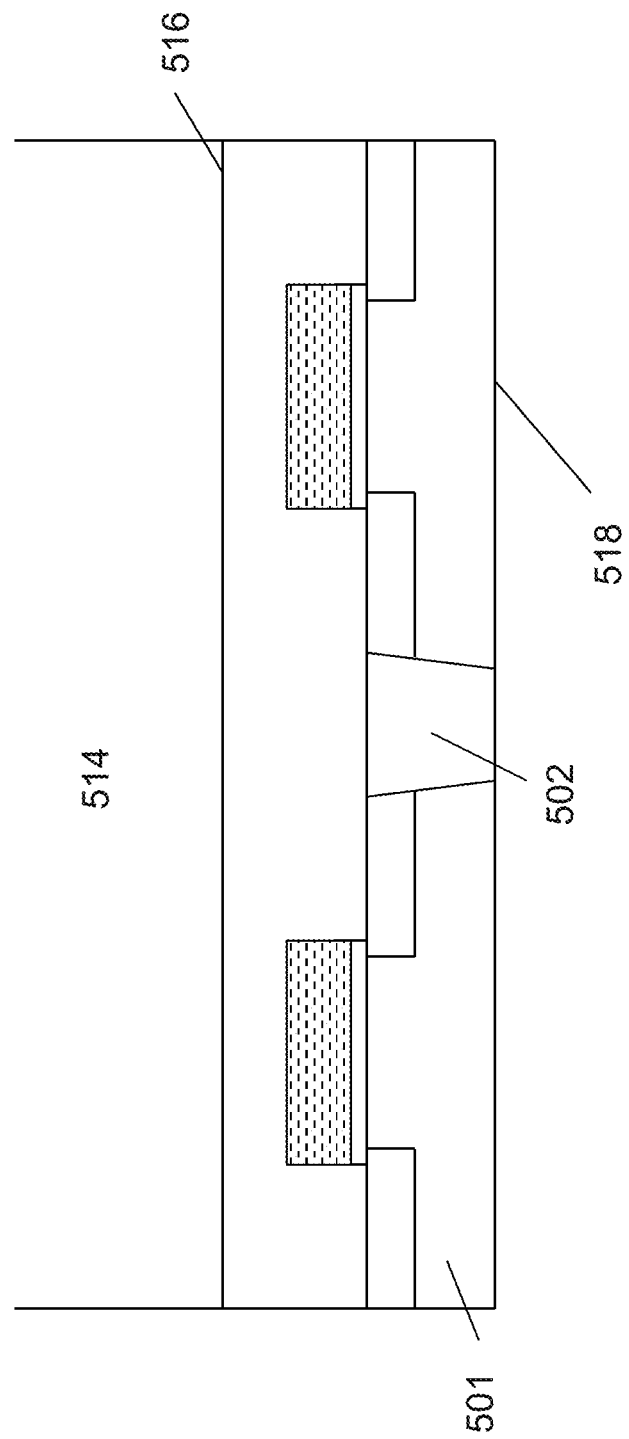

The donor wafer 500 may then be cleaved at the cleave plane 512 and may be thinned by chemical mechanical polishing (CMP) so that the transistor isolation 502 may be exposed at the donor layer face 518 as illustrated in FIG. 5D. Alternatively, the CMP could continue to the bottom of the junctions to create a fully depleted SOI layer.

As shown in FIG. 5E, the thin mono-crystalline donor layer face 518 may be prepared for layer transfer by a low temperature oxidation or deposition of an oxide 520, and plasma or other surface treatments to prepare the oxide surface 522 for wafer oxide-to-oxide bonding. Similar surface preparation may be performed on the 108 acceptor wafer in preparation for oxide-to-oxide bonding.

A low temperature (for example, less than about 400° C.) layer transfer flow may be performed, as illustrated in FIG. 5E, to transfer the thinned and first phase of transistor formation pre-processed HKMG transistor silicon layer 501 with attached carrier substrate 514 to the acceptor wafer 108. Acceptor wafer 108 may include metallization comprising metal strips 524 to act as landing pads for connection between the circuits formed on the transferred layer with the underlying circuits of layer or layer within acceptor wafer 108.

Figure 5F:
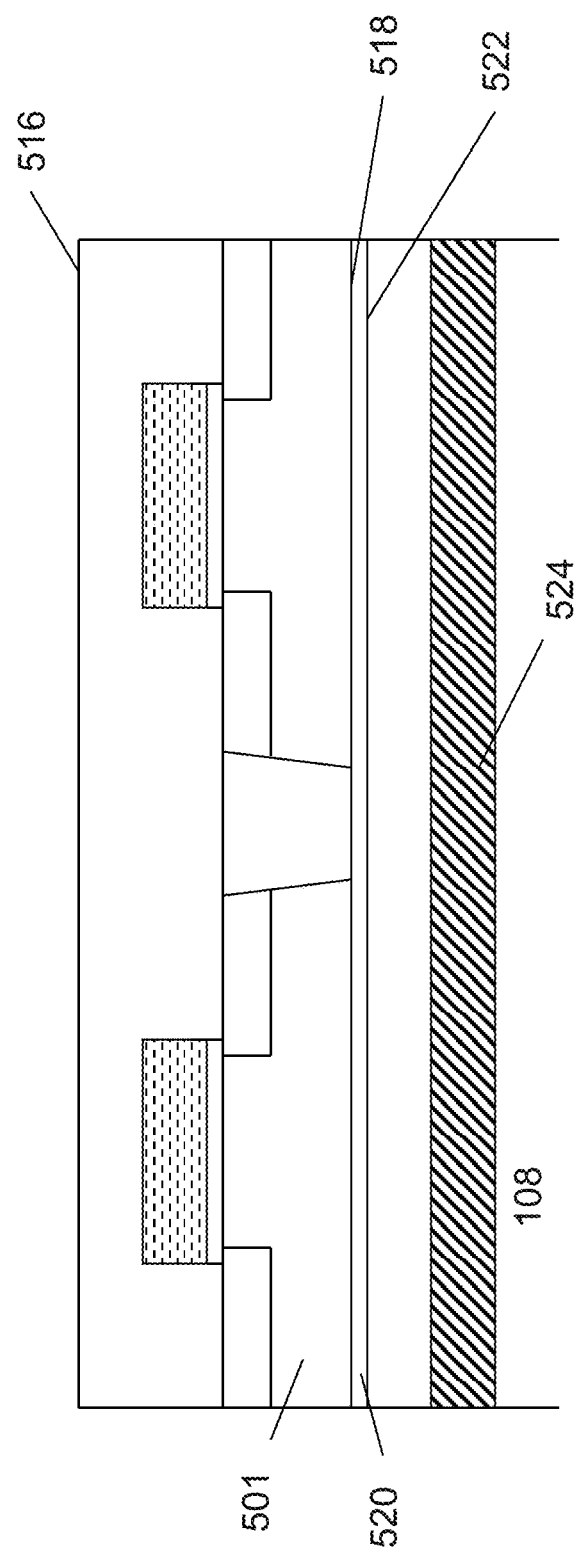

As illustrated in FIG. 5F, the carrier substrate 514 may then be released using a low temperature process such as laser ablation.

Figure 5G:
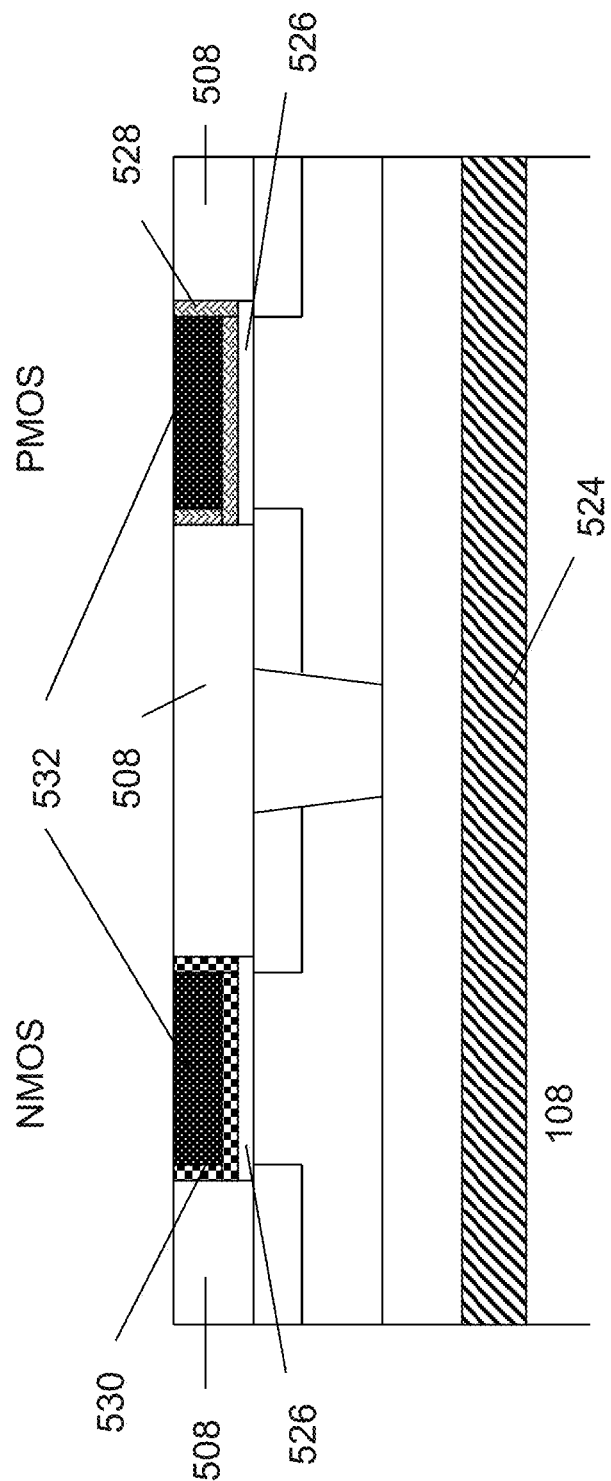

The bonded combination of acceptor wafer 108 and HKMG transistor silicon layer 501 may now be ready for normal state of the art gate-last transistor formation completion. As illustrated in FIG. 5G, the ILD 508 may be chemical mechanically polished to expose the top of the polysilicon dummy gates. The dummy polysilicon gates may then be removed by etching and the hi-k gate dielectric 526 and the PMOS specific work function metal gate 528 may be deposited. The PMOS work function metal gate may be removed from the NMOS transistors and the NMOS specific work function metal gate 530 may be deposited. An aluminum overfill 532 may be performed on both NMOS and PMOS gates and the metal CMP'ed.

As illustrated in FIG. 5H, a dielectric layer 531 may be deposited and the normal gate contact 534 and source/drain 536 contact formation and metallization may now be performed to connect the transistors on that mono-crystalline layer and to connect to the acceptor wafer 108 top metal strip 524 with through via 540 providing connection through the transferred layer from the donor wafer to the acceptor wafer. The top metal layer may be formed to act as the acceptor wafer landing strips for a repeat of the above process flow to stack another preprocessed thin mono-crystalline layer of two-phase formed transistors. The above process flow may also be utilized to construct gates of other types, such as, for example, doped polysilicon on thermal oxide, doped polysilicon on oxynitride, or other metal gate configurations, as 'dummy gates,' may perform a layer transfer of the thin mono-crystalline layer, replace the gate electrode and gate oxide, and then proceed with low temperature interconnect processing. An alternative layer transfer method may be utilized, such as, for example, SOI wafers with etchback of the bulk silicon to the buried oxide layer, in place of an ion-cut layer transfer scheme.

Another alternative, with reference to FIG. 5 and description, is illustrated in FIG. 5B-1 whereby the implant of an atomic species 510, such as, for example, H+, may be screened from the sensitive gate areas 503 by first masking and etching a shield implant stopping layer of a dense material 550, for example 5000 angstroms of Tantalum, and may be combined with 5,000 angstroms of photoresist 552. This implant may create a segmented cleave plane 512 in the bulk of the donor wafer silicon wafer and additional polishing may be applied to provide a smooth bonding surface for layer transfer suitability.

Alternatively, the carrier substrate 514 may be a silicon wafer, and infra-red light and optics could be utilized for alignments. FIGS. 6A-G illustrate the use of a carrier wafer. FIG. 6A illustrates the first step of preparing transistors with dummy gate transistors 602 on first donor wafer 606A. The first step may complete the first phase of transistor formation.

FIG. 6B illustrates forming a cleave line 608 by implant 616 of atomic particles such as H+.

FIG. 6C illustrates permanently bonding the first donor wafer 606A to a second donor wafer 626. The permanent bonding may be oxide-to-oxide wafer bonding as described previously.

FIG. 6D illustrates the second donor wafer 626 acting as a carrier wafer after cleaving the first donor wafer off; leaving a thin layer 606 of first donor wafer 606A with the now buried dummy gate transistors 602.

FIG. 6E illustrates forming a second cleave line 618 in the second donor wafer 626 by implant 646 of atomic species such as, for example, H+.

FIG. 6F illustrates the second layer transfer step to bring the dummy gate transistors 602 ready to be permanently bonded to the house 108. For simplicity of the explanation, the steps of surface layer preparation done for each of these bonding steps have been left out.

FIG. 6G illustrates the house 108 with the dummy gate transistors 602 on top after cleaving off the second donor wafer and removing the layers on top of the dummy gate transistors. Now the flow may proceed to replace the dummy gates with the final gates, form the metal interconnection layers, and continue the 3D fabrication process. An alternative layer transfer method may be utilized, such as, for example, SOI wafers with etchback of the bulk silicon to the buried oxide layer, in place of an ion-cut layer transfer scheme.

An illustrative alternative may be available when using the carrier wafer flow. In this flow we can use the two sides of the transferred layer to build NMOS on one side and PMOS on the other side. Proper timing of the replacement gate step in such a flow could enable full performance transistors properly aligned to each other. Compact 3D library cells may be constructed from this process flow.

As illustrated in FIG. 7A, an SOI (Silicon On Insulator) donor wafer 700A or substrate may be processed according to normal state of the art using, e.g., a High-k-Metal Gate (HKMG) gate-last process, with adjusted thermal cycles to compensate for later thermal processing, up to the step prior to where CMP exposure of the polysilicon dummy gates takes place. Alternatively, the donor wafer 700A may start as a bulk silicon wafer and utilize an oxygen implantation and thermal anneal to form a buried oxide layer, such as the SIMOX process (i.e., separation by implantation of oxygen). FIG. 7A illustrates a cross section of the SOI donor wafer 700A, the buried oxide (i.e., BOX) 701, the thin silicon layer 702 of the SOI wafer, the isolation 703 between transistors, the polysilicon 704 and gate oxide 705 of n-type CMOS dummy gates, their associated source and drains 706 for NMOS, the NMOS transistor channel 707, and the NMOS interlayer dielectric (ILD) 708. Alternatively, PMOS devices or full CMOS devices may be constructed at this stage. This stage may complete the first phase of transistor formation.

At this step, or alternatively just after a CMP of NMOS ILD 708 to expose the polysilicon dummy gates or to planarize the NMOS ILD 708 and not expose the dummy gates, an implant of an atomic species 710, such as, for example, H+, may prepare the cleaving plane 712 in the bulk of the donor substrate for layer transfer suitability, as illustrated in FIG. 7B.

The SOI donor wafer 700A may now be permanently bonded to a carrier wafer 720 or substrate that may have been prepared with an oxide layer 716 for oxide-to-oxide bonding to the donor wafer surface 714 as illustrated in FIG. 7C.

As illustrated in FIG. 7D, the donor wafer 700A may then be cleaved at the cleaving plane 712 and may be thinned by chemical mechanical polishing (CMP) and surface 722 may be prepared for transistor formation. Thus donor wafer layer 700 may be formed.

The donor wafer layer 700 at surface 722 may be processed in the normal state of the art gate last processing to form the PMOS transistors with dummy gates. FIG. 7E illustrates the cross section after the PMOS devices are formed showing the buried oxide (BOX) 701, the now thin silicon donor wafer layer 700 of the SOI substrate, the isolation 733 between transistors, the polysilicon 734 and gate oxide 735 of p-type CMOS dummy gates, their associated source and drains 736 for PMOS, the PMOS transistor channel 737, and the PMOS interlayer dielectric (ILD) 738. The PMOS transistors may be precisely aligned at state of the art tolerances to the NMOS transistors due to the shared substrate donor wafer layer 700 possessing the same alignment marks. At this step, or alternatively just after a CMP of PMOS ILD 738, the processing flow may proceed to expose the PMOS polysilicon dummy gates or to planarize the oxide layer PMOS ILD 738 and may not expose the dummy gates. Now the wafer could be put into a high temperature anneal to activate both the NMOS and the PMOS transistors.

Then an implant of an atomic species 795, such as, for example, H+, may prepare the cleaving plane 721 in the bulk of the carrier wafer 720 for layer transfer suitability, as illustrated in FIG. 7F.

Figure 7G:
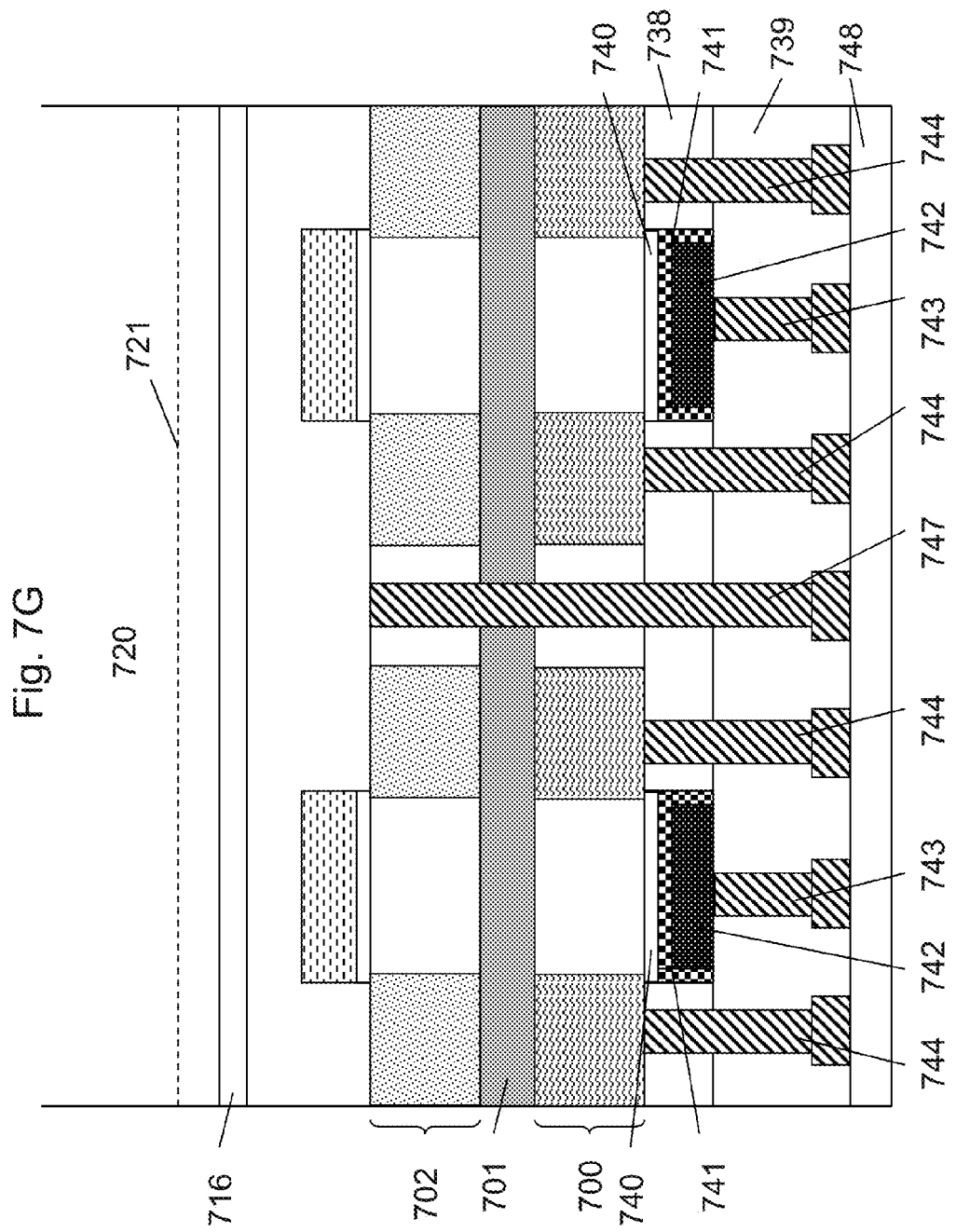

The PMOS transistors may now be ready for normal state of the art gate-last transistor formation completion. As illustrated in FIG. 7G, the PMOS ILD 738 may be chemical mechanically polished to expose the top of the polysilicon dummy gates. The dummy polysilicon gates may then be removed by etch and the PMOS hi-k gate dielectric 740 and the PMOS specific work function metal gate 741 may be deposited. An aluminum fill 742 may be performed on the PMOS gates and the metal CMP'ed. A dielectric layer 739 may be deposited and the normal gate 743 and source/drain 744 contact formation and metallization. The PMOS layer to NMOS layer via 747 and metallization may be partially formed as illustrated in FIG. 7G and an oxide layer 748 may be deposited to prepare for bonding.

Figure 7H:
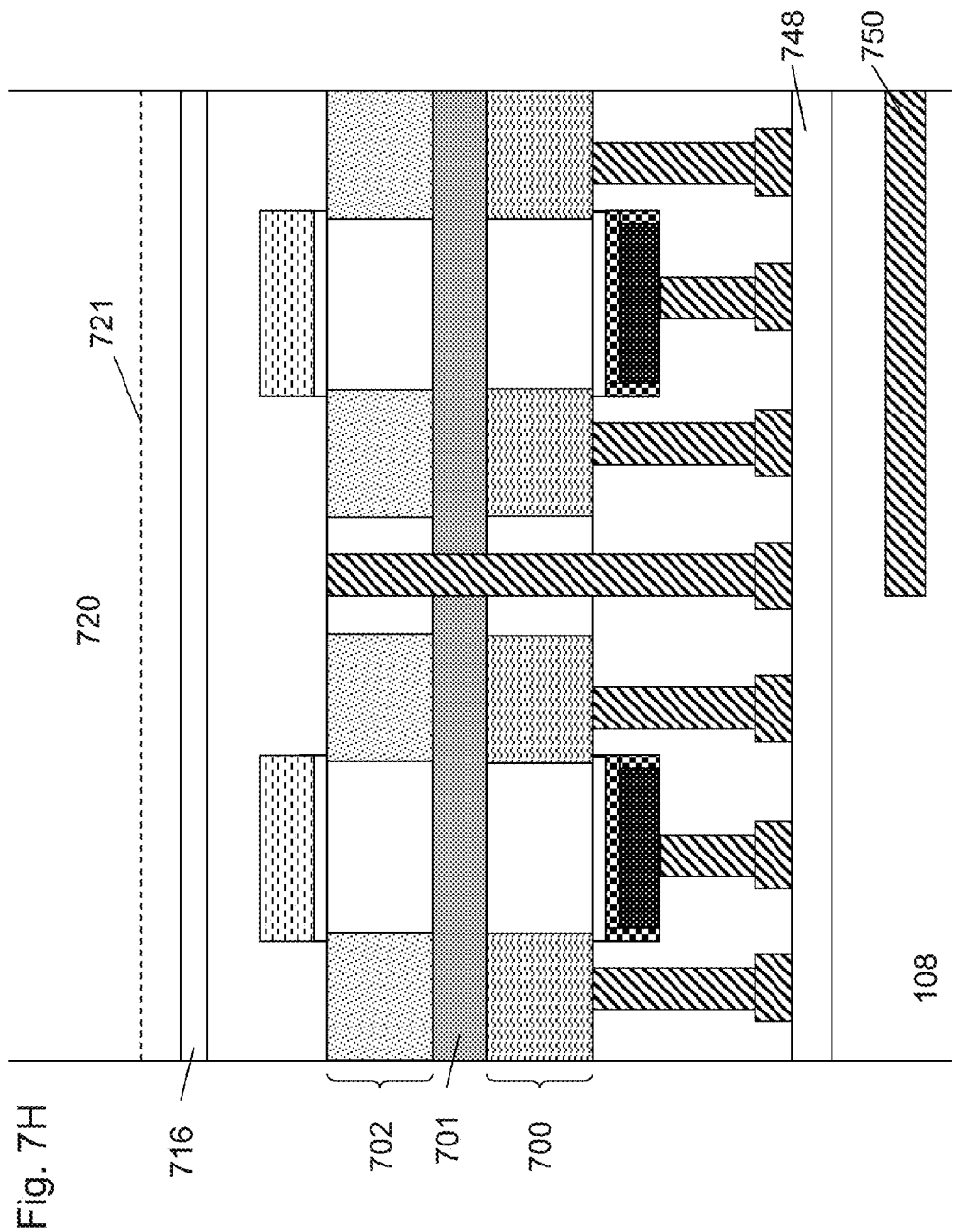

The carrier wafer and two sided n/p layer may then be aligned and permanently bonded to House acceptor wafer 108 with associated metal landing strip 750 as illustrated in FIG. 7H.

The carrier wafer 720 may then be cleaved at the cleaving plane 721 and may be thinned by chemical mechanical polishing (CMP) to oxide layer 716 as illustrated in FIG. 7I.

Figure 7J:
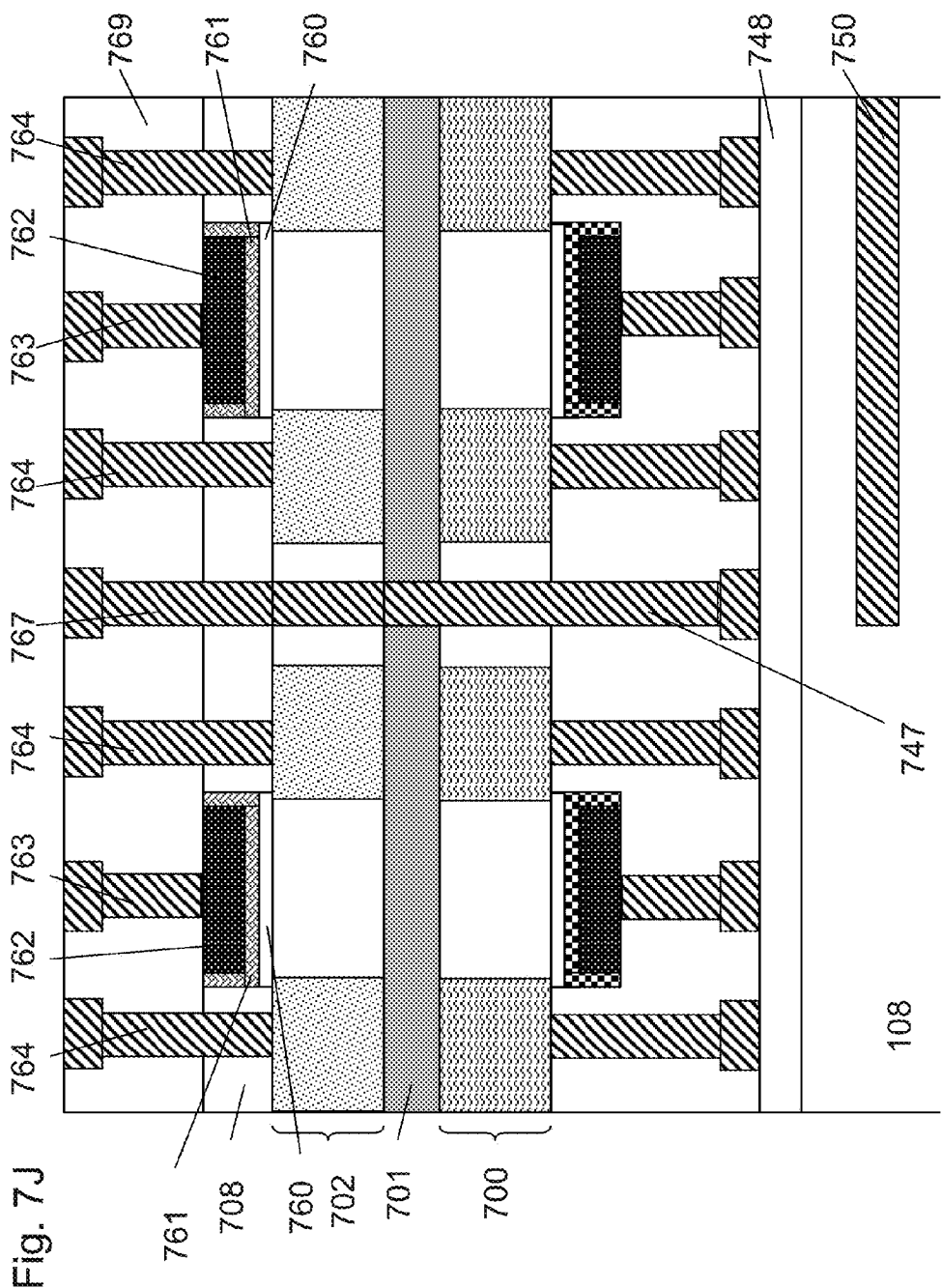

The NMOS transistors may now be ready for normal state of the art gate-last transistor formation completion. As illustrated in FIG. 7J, the NMOS ILD 708 may be chemical mechanically polished to expose the top of the NMOS polysilicon dummy gates. The dummy polysilicon gates may then be removed by etching and the NMOS hi-k gate dielectric 760 and the NMOS specific work function metal gate 761 may be deposited. An aluminum fill 762 may be performed on the NMOS gates and the metal CMP'ed. A dielectric layer 769 may be deposited and the normal gate 763 and source/drain 764 contacts may be formed and metalized. The NMOS layer to PMOS layer via 767 to connect to 747 and the metallization of via 767 may be formed.

Figure 7K:
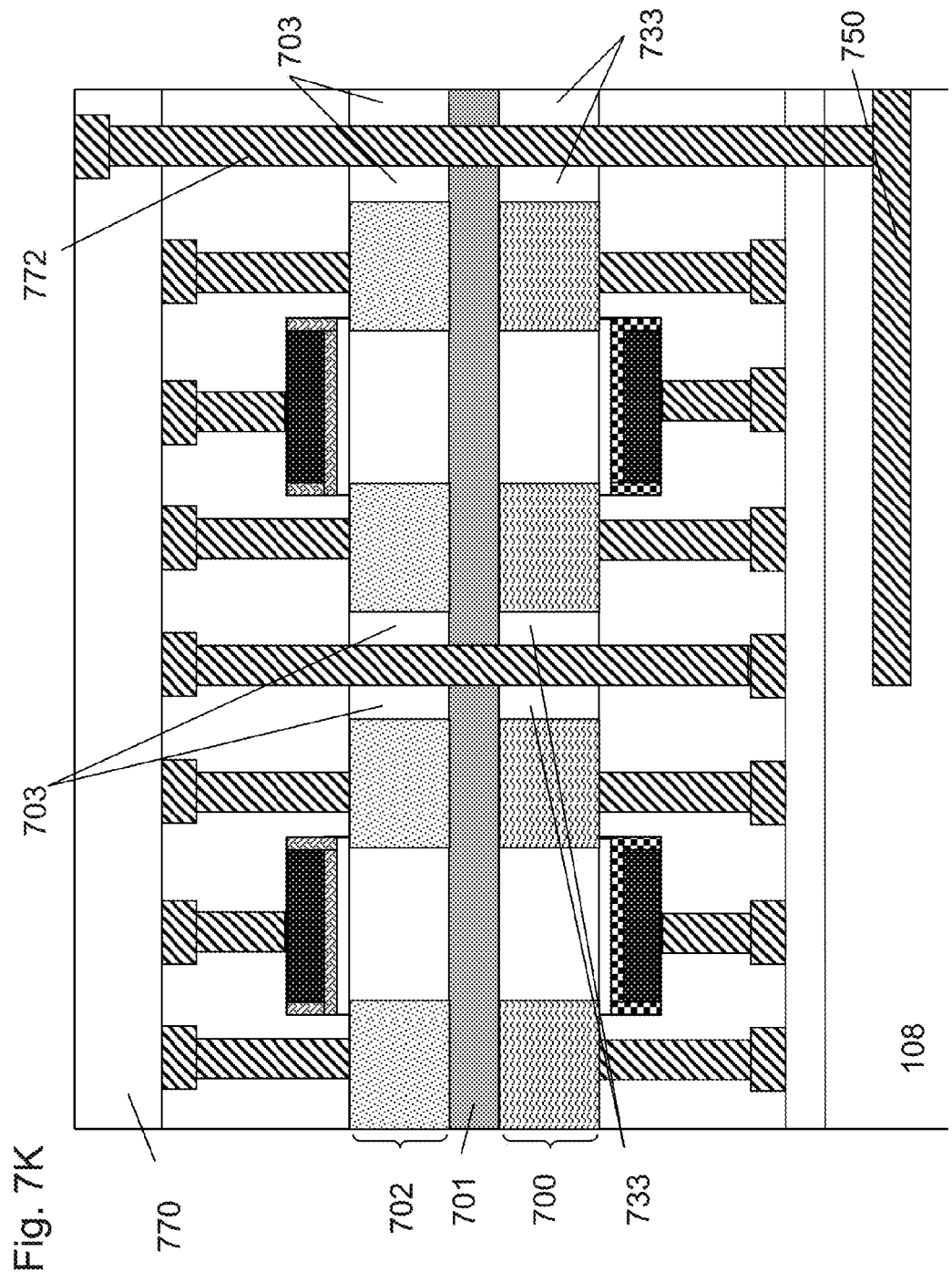

As illustrated in FIG. 7K, a dielectric layer 770 may be deposited. Layer-to-layer through via 772 may then be aligned, masked, etched, and metalized to electrically connect to the acceptor wafer 108 and metal-landing strip 750. A topmost metal layer of the layer stack illustrated in FIG. 7K may be formed to act as the acceptor wafer landing strips for a repeat of the above process flow to stack another preprocessed thin mono-crystalline layer of transistors.

Persons of ordinary skill in the art will appreciate that the illustrations in FIGS. 7A through 7K are exemplary only and are not drawn to scale. Such skilled persons will further appreciate that many variations may be possible such as, for example, the transistor layers on each side of box 701 may comprise full CMOS, or one side may be CMOS and the other n-type MOSFET transistors, logic cells, or other combinations and types of semiconductor devices. Moreover, SOI wafers with etchback of the bulk silicon to the buried oxide layer may be utilized in place of an ion-cut layer transfer scheme. Many other modifications within the scope of the illustrated embodiments of the invention will suggest themselves to such skilled persons after reading this specification. Thus the invention is to be limited only by the appended claims.

FIG. 7L is a top view drawing illustration of a repeating generic cell 7L00 as a building block for forming gate array, of two NMOS transistors 7L04 with shared diffusion 7L05 overlaying 'face down' two PMOS transistors 7L02 with shared diffusion. The NMOS transistors gates may overlay the PMOS transistors gates 7L10 and the overlayed gates may be connected to each other by via 7L12. The Vdd power line 7L06 could run as part of the face down generic structure with connection to the upper layer using vias 7L20. The diffusion connection 7L08 may be using the face down metal generic structure 7L17 and brought up by vias 7L14, 7L16, 7L18.

FIG. 7L1 is a drawing illustration of the generic cell 7L00 which may be customized by custom NMOS transistor contacts 7L22, 7L24 and custom metal 7L26 to form a double inverter. The Vss power line 7L25 may run on top of the NMOS transistors.

FIG. 7L2 is a drawing illustration of the generic cell 7L00 which may be customized to a NOR function, FIG. 7L3 is a drawing illustration of the generic cell 7L00 which may be customized to a NAND function and FIG. 7L4 is a drawing illustration of the generic cell 7L00 which may be customized to a multiplexer function. Accordingly generic cell 7L00 could be customized to substantially provide the logic functions, such as, for example, NAND and NOR functions, so a generic gate array using array of generic cells 7L00 could be customized with custom contacts vias and metal layers to any logic function. Thus, the NMOS, or n-type, transistors may be formed on one layer and the PMOS, or p-type, transistors may be formed on another layer, and connection paths may be formed between the n-type and p-type transistors to create Complementary Metal-Oxide-Semiconductor (CMOS) logic cells. Additionally, the n-type and p-type transistors layers may reside on the first, second, third, or any other of a number of layers in the 3D structure, substantially overlaying the other layer, and any other previously constructed layer.

Additional alternatives to the use of an SOI donor wafer may be employed to isolate transistors in the vertical direction. For example, a pn junction may be formed between the vertically stacked transistors and may be biased. Also, oxygen ions may be implanted between the vertically stacked transistors and annealed to form a buried oxide layer. Also, a silicon-on-replacement-insulator technique may be utilized for the first formed dummy transistors wherein a buried SiGe layer may be selectively etched out and refilled with oxide, thereby creating islands of electrically isolated silicon.

An alternative embodiment of the above process flow with reference to FIG. 5 is illustrated in FIGS. 8A to 8F and may provide a face down CMOS planar transistor layer on top of a preprocessed House substrate. The CMOS planar transistors may be fabricated with dummy gates and the cleave plane 512 may be created in the donor wafer as described previously and illustrated in FIGS. 5A and 5B. Then the dummy gates may be replaced as described previously and illustrated in FIG. 8A.

Figure 8A:
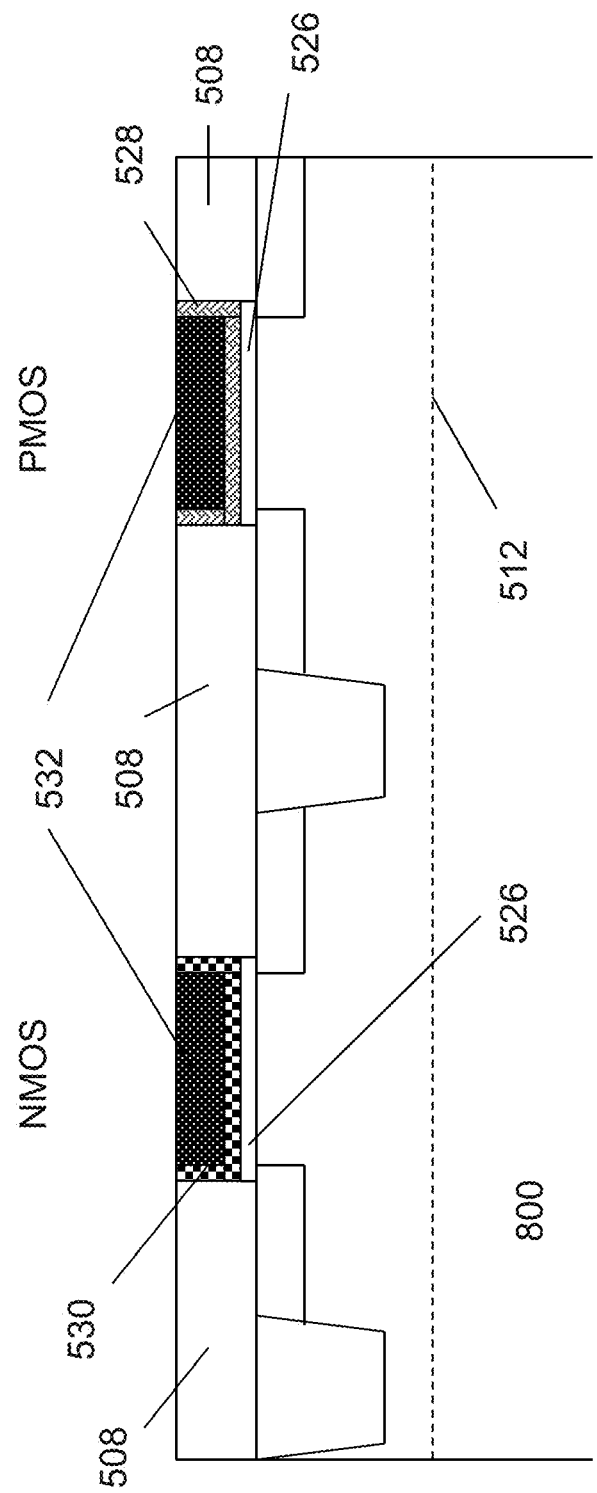
Figure 8B:
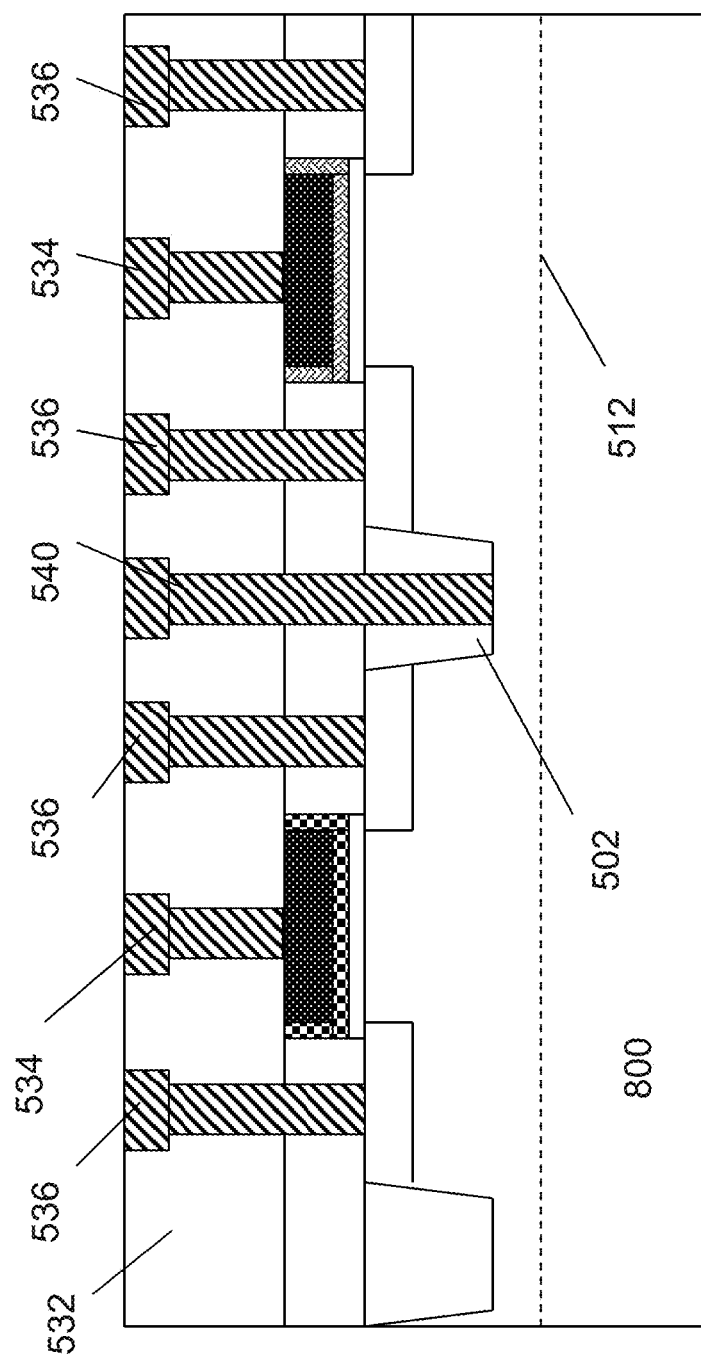

The contact and metallization steps may be performed as illustrated in FIG. 8B to allow future connections to the transistors once they are face down.

Figure 8C:
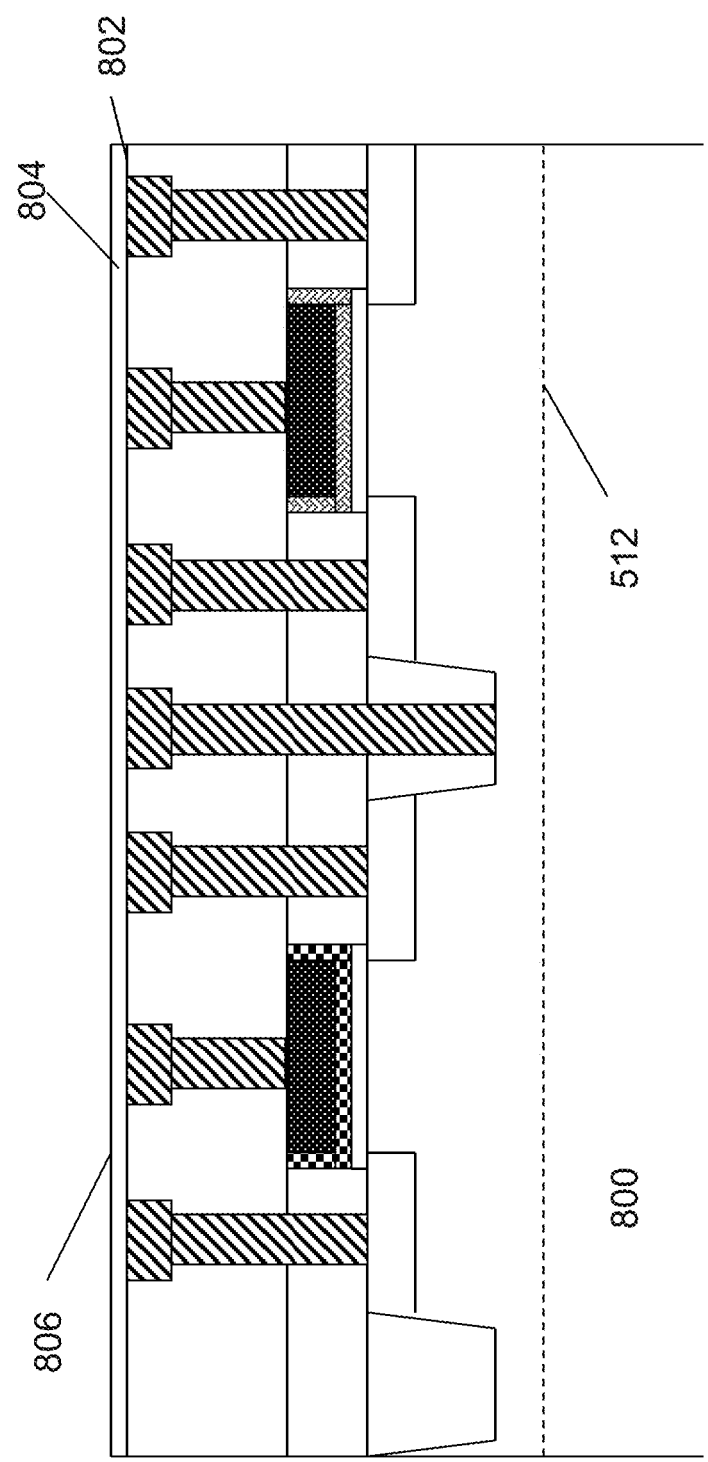

The face 802 of donor wafer 800 may be prepared for bonding by deposition of an oxide 804, and plasma or other surface treatments to prepare the oxide surface 806 for wafer-to-wafer oxide-to-oxide bonding as illustrated in FIG. 8C.

Similar surface preparation may be performed on the 108 acceptor wafer in preparation for the oxide-to-oxide bonding. Now a low temperature (e.g., less than about 400° C.) layer transfer flow may be performed, as illustrated in FIG. 8D, to transfer the prepared donor wafer 800 with oxide surface 806 to the acceptor wafer 108. Acceptor wafer 108 may be preprocessed with transistor circuitry and metal interconnect layers and may have a top metallization layer or layers that may include metal landing strips 824 to act as landing pads for connection between the circuits formed on the transferred layer with the underlying circuit layers in house 108. For FIGS. 8D to 8F, an additional STI (shallow trench isolation) isolation 830 without via 540 may be added to the illustration.

The donor wafer 800 may then be cleaved at the cleave plane 512 and may be thinned by chemical mechanical polishing (CMP) so that the transistor isolations 502 and 830 may be exposed as illustrated in FIG. 8E. Alternatively, the CMP could continue to the bottom of the junctions to create a fully depleted SOI layer.

Figure 8F:
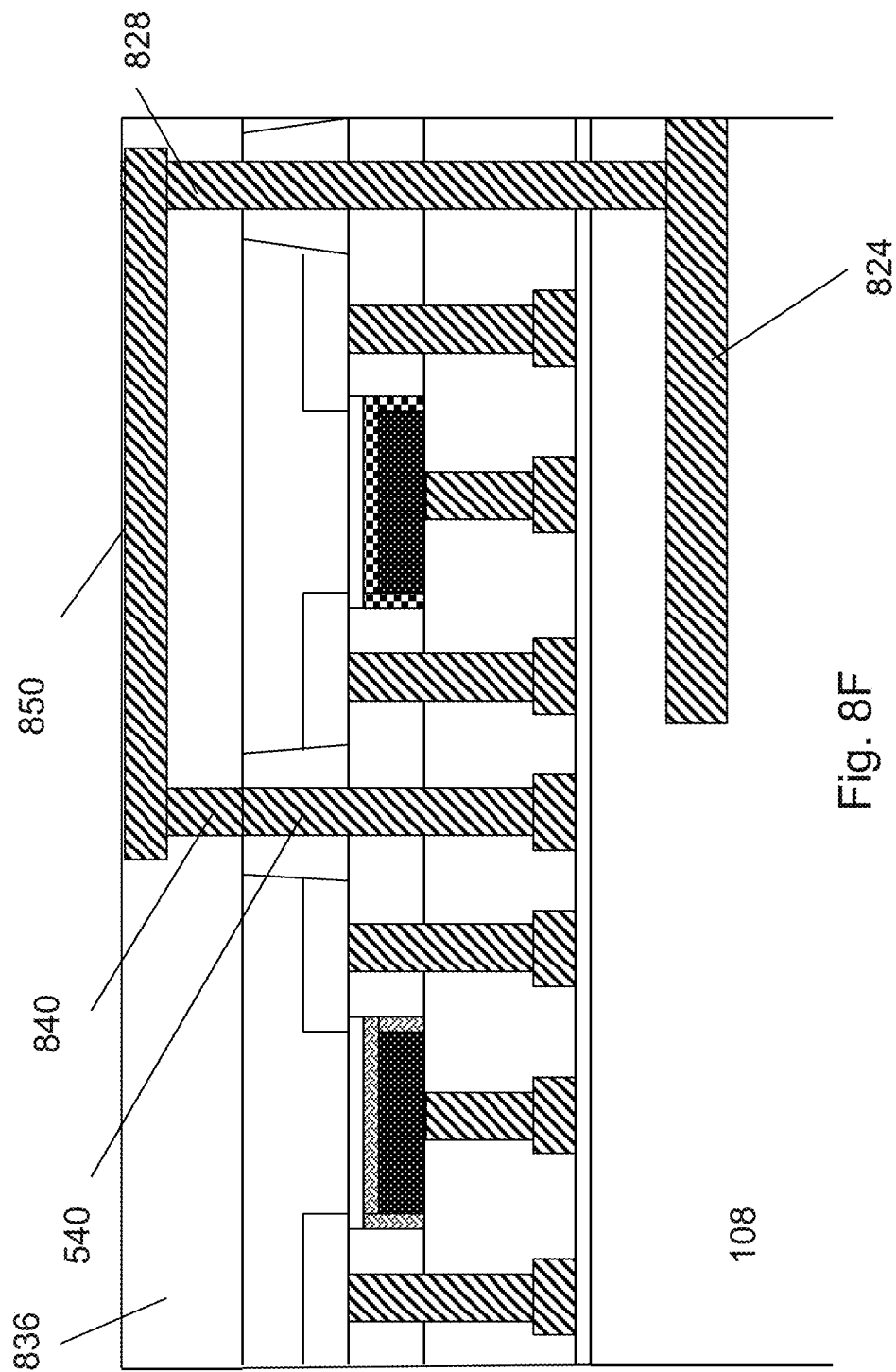
Figures 1, 8F:
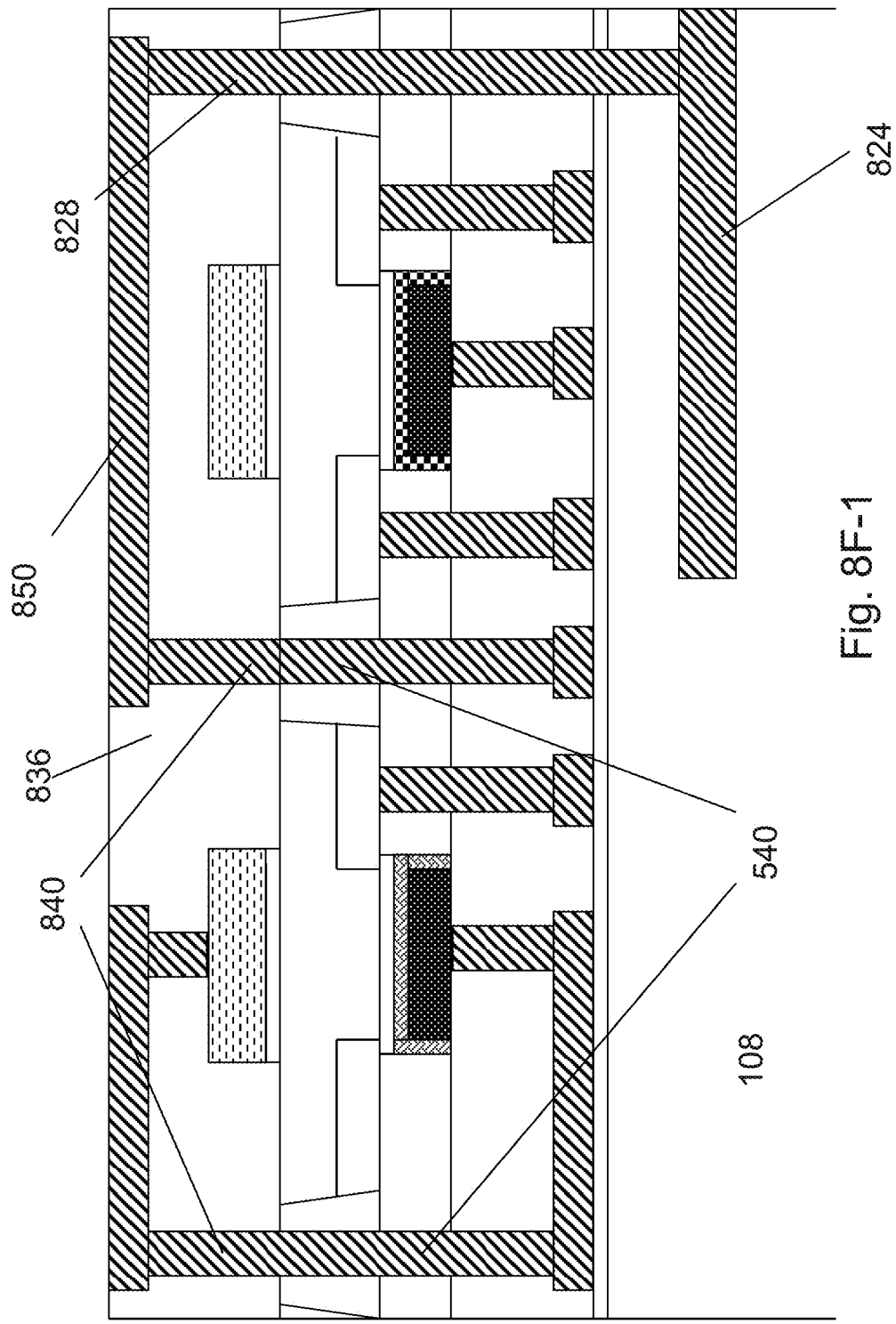

As illustrated in FIG. 8F, a low-temperature oxide or low-k dielectric 836 may be deposited and planarized. The through via 828 to house 108 acceptor wafer landing strip 824 and contact 840 to through via 540 may be etched, metalized, and connected by metal line 850 to provide electrical connection from the donor wafer transistors to the acceptor wafer. The length of landing strips 824 may be at least the repeat width W plus margin per the proper via design rules as shown in FIGS. 32 and 33A of incorporated parent specification. The landing zone strip extension for proper via design rules may include angular misalignment of the wafer-to-wafer bonding that is not compensated for by the stepper overlay algorithms, and may include uncompensated donor wafer bow and warp.

The face down flow has some advantages such as, for example, enabling double gate transistors, back biased transistors, or access to the floating body in memory applications. For example, a back gate for a double gate transistor may be constructed as illustrated in FIG. 8E-1. A low temperature gate oxide 860 with gate material 862 may be grown or deposited and defined by lithographic and etch processes as described previously.

The metal hookup may be constructed as illustrated in FIG. 8F-1.

As illustrated in FIG. 8F-2, fully depleted SOI transistors with junctions 870 and 871 may be alternatively constructed in this flow as described in respect to CMP thinning illustrated in FIG. 8E.

Figure 9A:
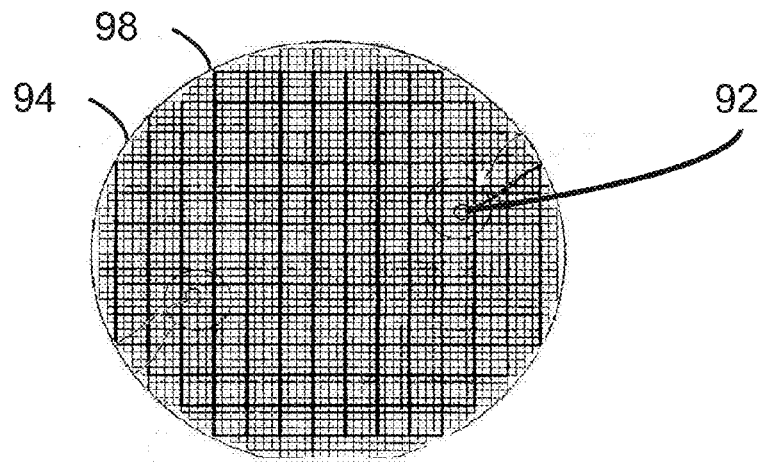
FIG. 9A is a drawing illustration of continuous array wafer of a prior art.
Figure 9B:
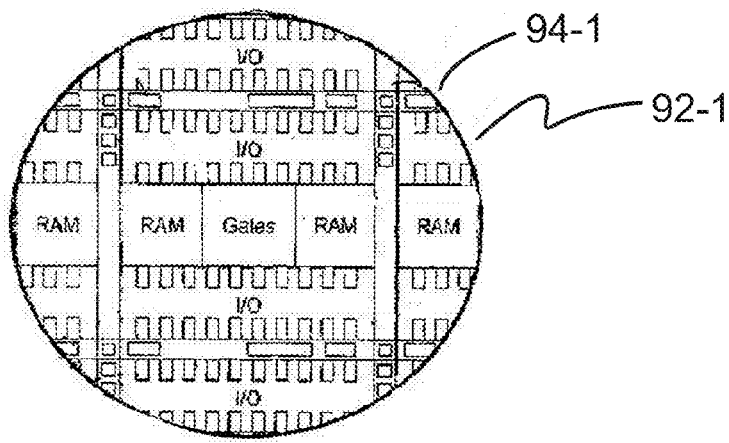
FIG. 9B is a drawing illustration of continuous array portion of wafer of a prior art.
Figure 9C:
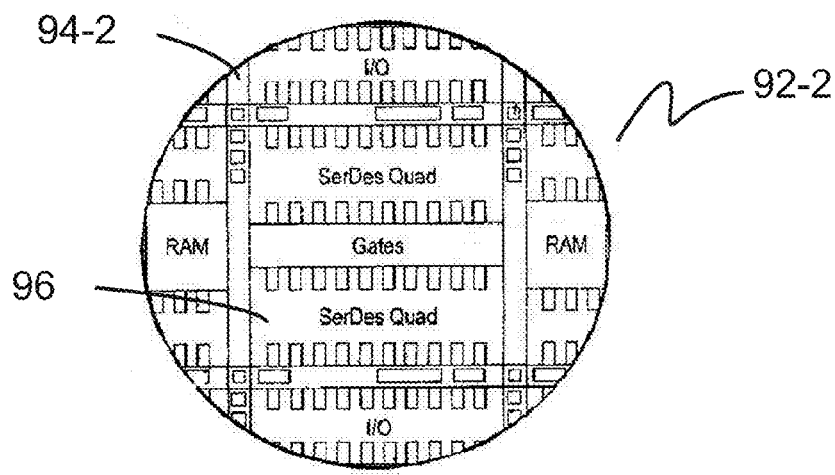
FIG. 9C is a drawing illustration of continuous array portion of wafer of a prior art.

FIG. 9A is a drawing illustration of a continuous array wafer of a prior art U.S. Pat. No. 7,337,425. The bubble 92 may show the repeating tile of the continuous array, and the lines 94 are the horizontal and vertical potential dicing lines. The tile 92 could be constructed as in FIG. 9B 92-1 with potential dicing line 94-1 or as in FIG. 9C with SerDes Quad 96 as part of the tile 92-2 and potential dicing lines 94-2.

In general logic devices may include varying quantities of logic elements, varying amounts of memories, and varying amounts of I/O. The continuous array of the prior art may allow defining various die sizes out of the same wafers and accordingly varying amounts of logic, but it may be far more difficult to vary the three-way ratio between logic, I/O, and memory. In addition, there may exist different types of memories such as SRAM, DRAM, Flash, and others, and there may exist different types of I/O such as SerDes. Some applications might need still other functions such as processor, DSP, analog functions, and others.

Some embodiments of the invention may enable a different approach. Instead of trying to put substantially all of these different functions onto one programmable die, which may need a large number of very expensive mask sets, it may use Through-Silicon Via to construct configurable systems. The technology of "Package of integrated circuits and vertical integration" has been described in U.S. Pat. No. 6,322,903 issued to Oleg Siniaguine and Sergey Savastiouk on Nov. 27, 2001.

Accordingly some embodiments of the invention may suggest the use of a continuous array of tiles focusing each one on a single, or very few types of, function. The target system may then be constructed using desired number of tiles of desired type stacked on top of each other and electrically connected with TSVs or monolithic 3D approaches, thus, a 3D Configurable System may result.

Figure 10A:
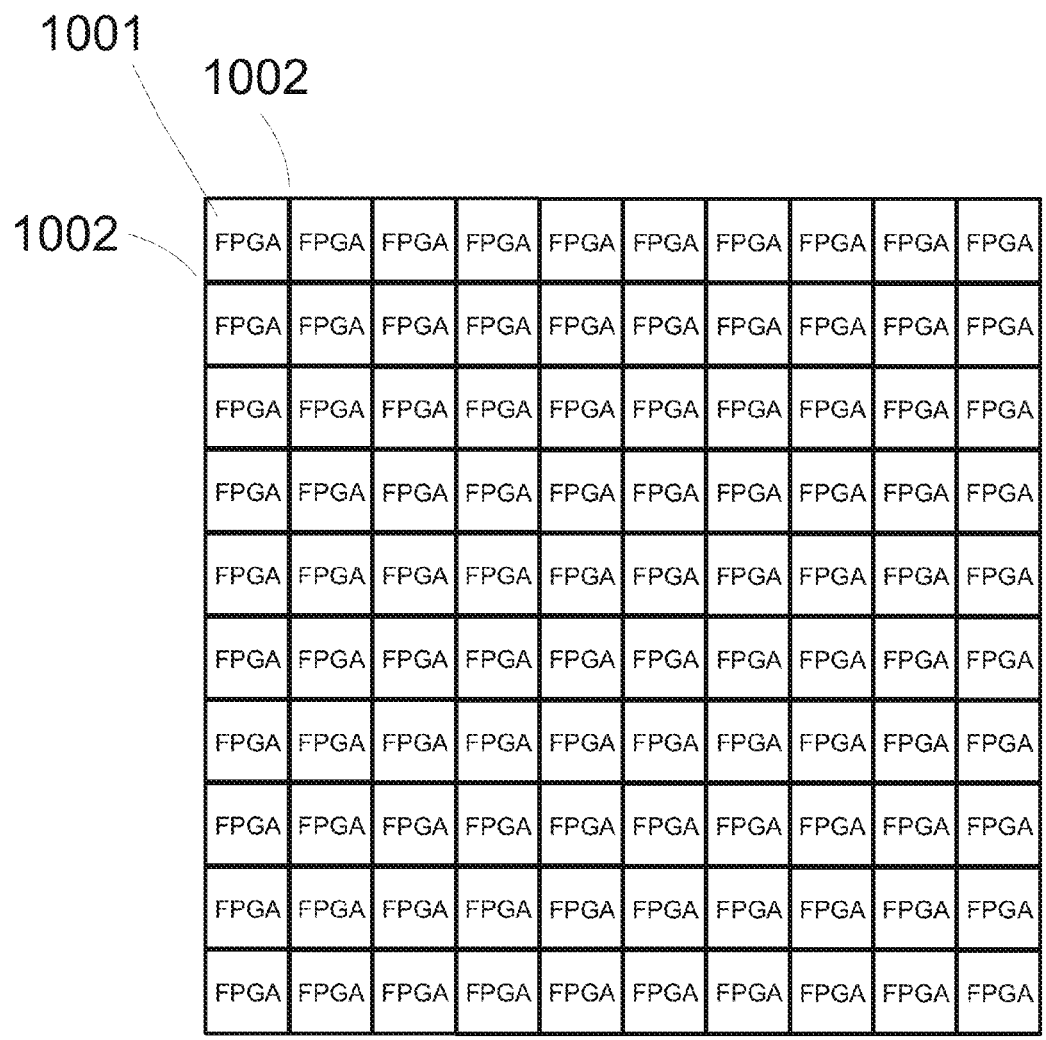
FIGS. 10A-10F are exemplary drawing illustrations of one reticle site on a wafer.

FIG. 10A is a drawing illustration of one reticle site on a wafer comprising tiles of programmable logic 1001 denoted FPGA. Such wafer may be a continuous array of programmable logic. 1002 are potential dicing lines to support various die sizes and the amount of logic to be constructed from one mask set. This die could be used as a base 1102A, 1102B, 1102C or 1102D of the 3D system as in FIG. 11. In one embodiment of this invention these dies may carry mostly logic, and the desired memory and I/O may be provided on other dies, which may be connected by means of Through-Silicon Via. It should be noted that in some cases it may be desired not to have metal lines, even if unused, in the dicing streets 1008. In such case, at least for the logic dies, one may use dedicated masks to allow connection over the unused potential dicing lines to connect the individual tiles according to the desired die size. The actual dicing lines may also be called streets.

It should be noted that in general the lithography projected over surface of the wafer may be done by repeatedly projecting a reticle image over the wafer in a "step-and-repeat" manner. In some cases it might be possible to consider differently the separation between repeating tile 1001 within a reticle image vs. tiles that relate to two projections. For simplicity this description will use the term wafer but in some cases it will apply, for example, only to tiles with one reticle.

The repeating tile 1001 could be of various sizes. For FPGA applications it may be reasonable to assume tile 1001 to have an edge size between about 0.5 mm to about 1 mm which may allow good balance between the end-device size and acceptable relative area loss due to the unused potential dice lines 1002. Potential dice lines may be area regions of the processed wafer where the layers and structures on the wafer may be arranged such that the wafer dicing process may optimally proceed. For example, the potential dice lines may be line segments that surround a desired potential product die wherein the majority of the potential dice line may have no structures and may have a die seal edge structure to protect the desired product die from damages as a result of the dicing process. The dicing process can be accomplished by scribing and breaking, by mechanical sawing (normally with a machine called a dicing saw) or by laser cutting.

There may be many illustrative advantages for a uniform repeating tile structure of FIG. 10A where a programmable device could be constructed by dicing the wafer to the desired size of programmable device. Yet it may be still helpful that the end-device may act as a complete integrated device rather than just as a collection of individual tiles 1001.

Figure 15:
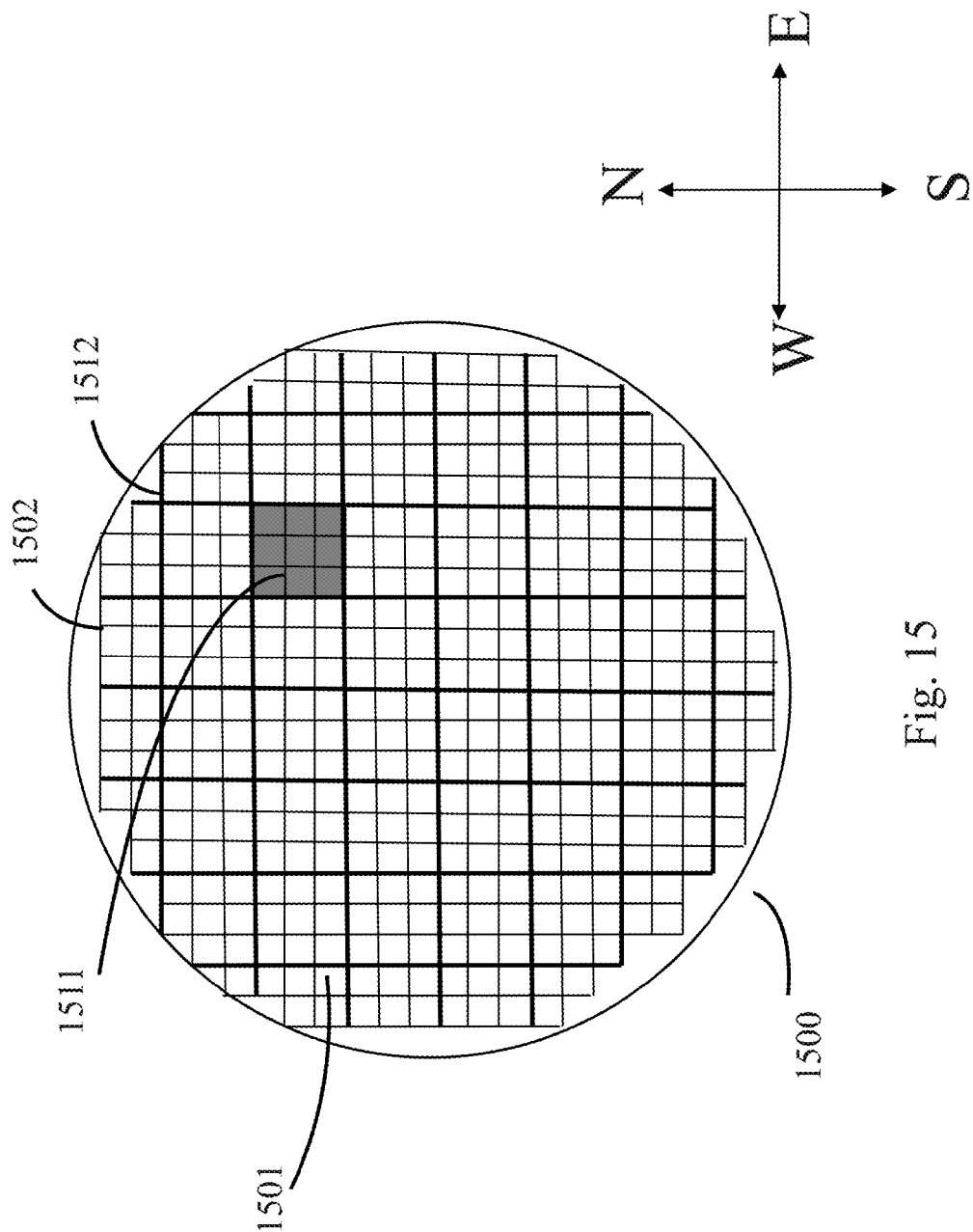
FIG. 15 is an exemplary drawing illustration of a tile array wafer.

FIG. 15 illustrates a wafer 1500 carrying an array of tile 1501 with potential dice lines 1502 to be diced along actual dice lines 1512 to construct an end-device 1511 of 3×3 tiles. The end-device 1511 may be bounded by the actual dice lines 1512.

Figure 10B:
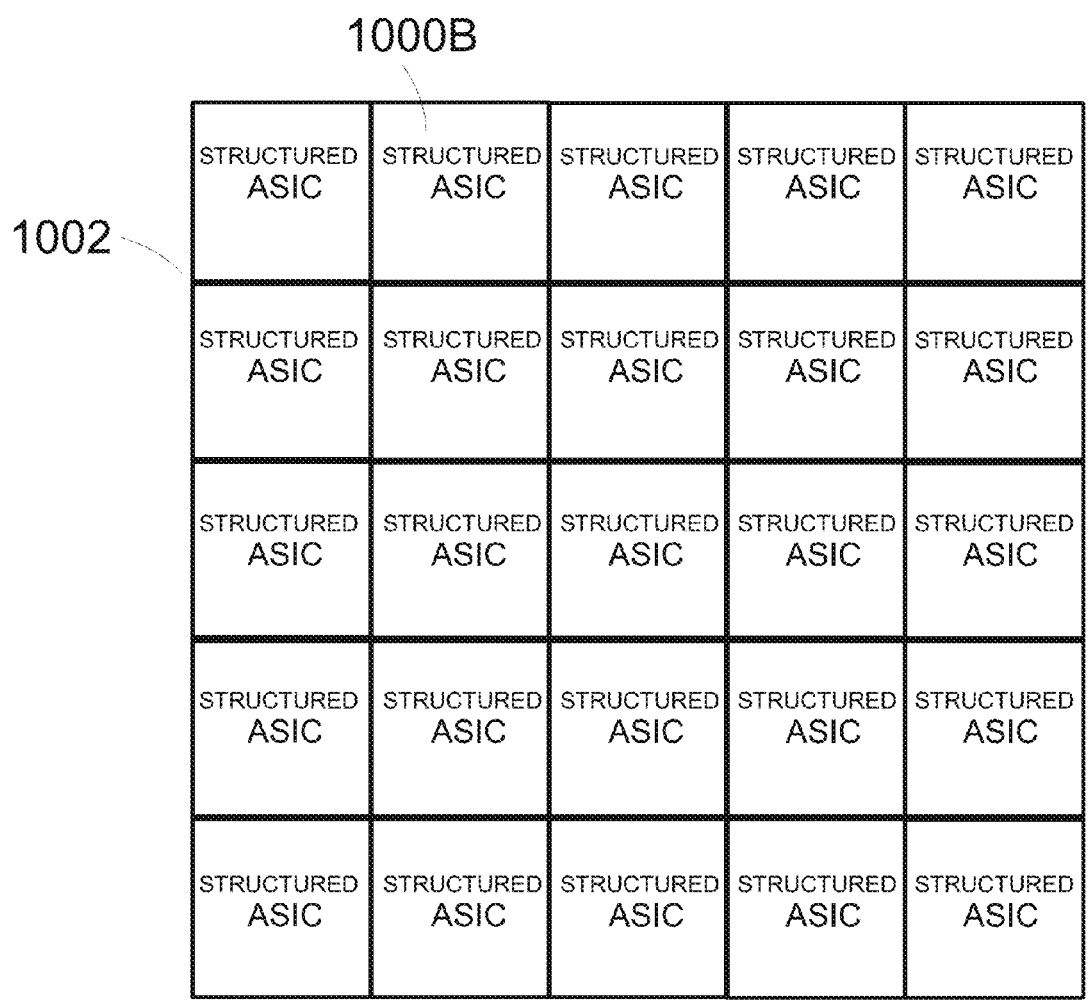

FIG. 10B is a drawing illustration of an alternative reticle site on a wafer comprising tiles of Structured ASIC 1000B. Such wafer may be, for example, a continuous array of configurable logic. 1002 are potential dicing lines to support various die sizes and the amount of logic to be constructed. This die could be used as a base 1102A, 1102B, 1102C or 1102D of the 3D system as in FIG. 11.

Figure 10C:
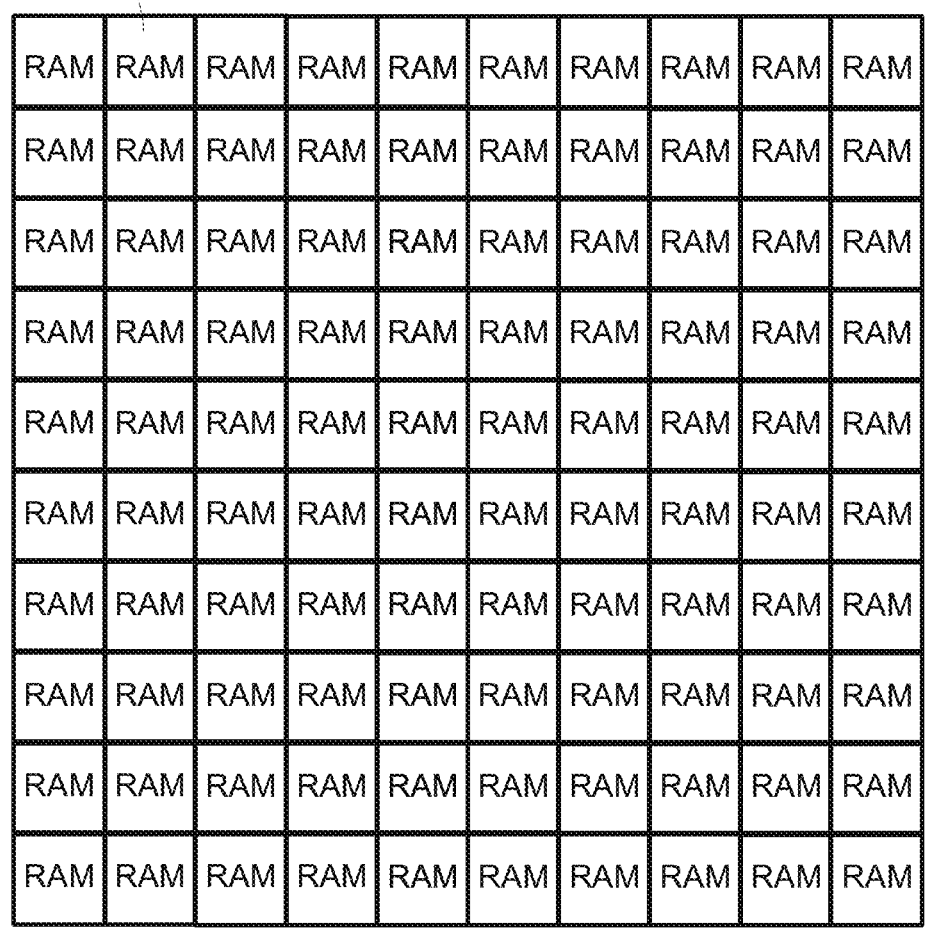

FIG. 10C is a drawing illustration of another reticle site on a wafer comprising tiles of RAM 1000C. Such wafer may be a continuous array of memories. The die diced out of such wafer may be a memory die component of the 3D integrated system. It might include, for example, an antifuse layer or other form of configuration technique to function as a configurable memory die. Yet it might be constructed as a multiplicity of memories connected by a multiplicity of Through Silicon Vias to the configurable die, which may also be used to configure the raw memories of the memory die to the desired function in the configurable system.

Figure 10D:
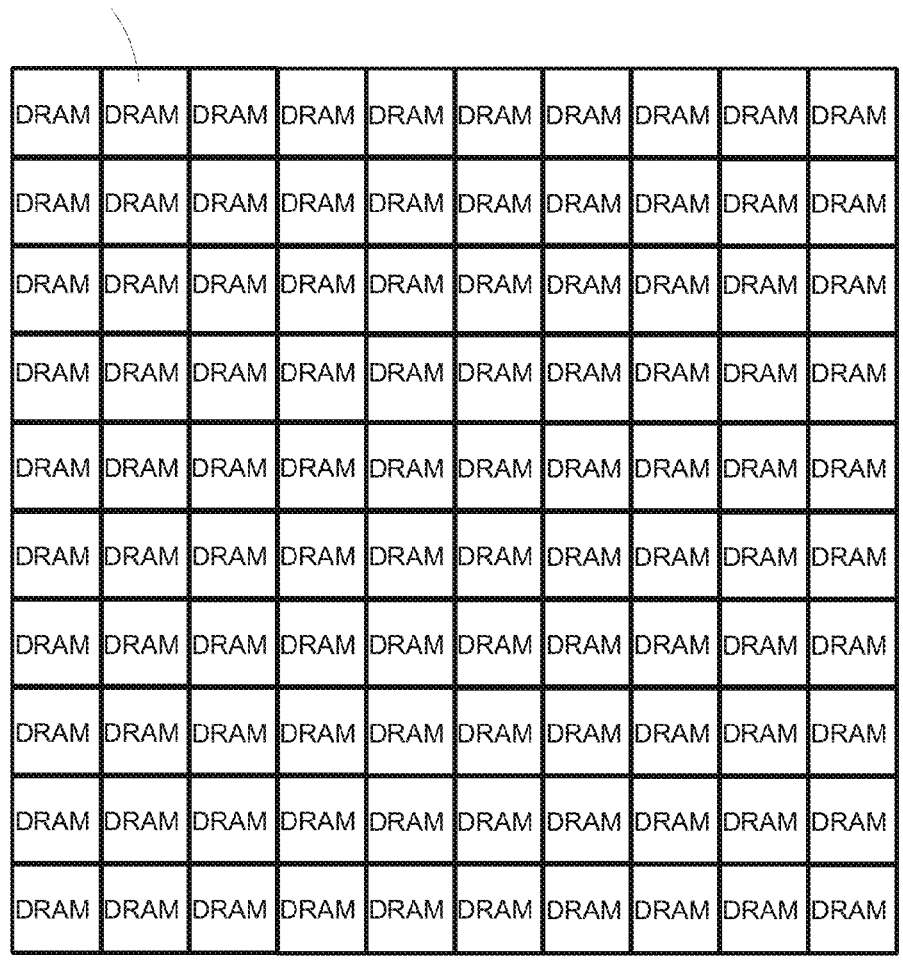

FIG. 10D is a drawing illustration of another reticle site on a wafer including tiles of DRAM 1000D. Such wafer may be a continuous array of DRAM memories.

Figure 10E:

FIG. 10E is a drawing illustration of another reticle site on a wafer comprising tiles of microprocessor or microcontroller cores 1000E. Such wafer may be a continuous array of Processors.

Figure 10F:
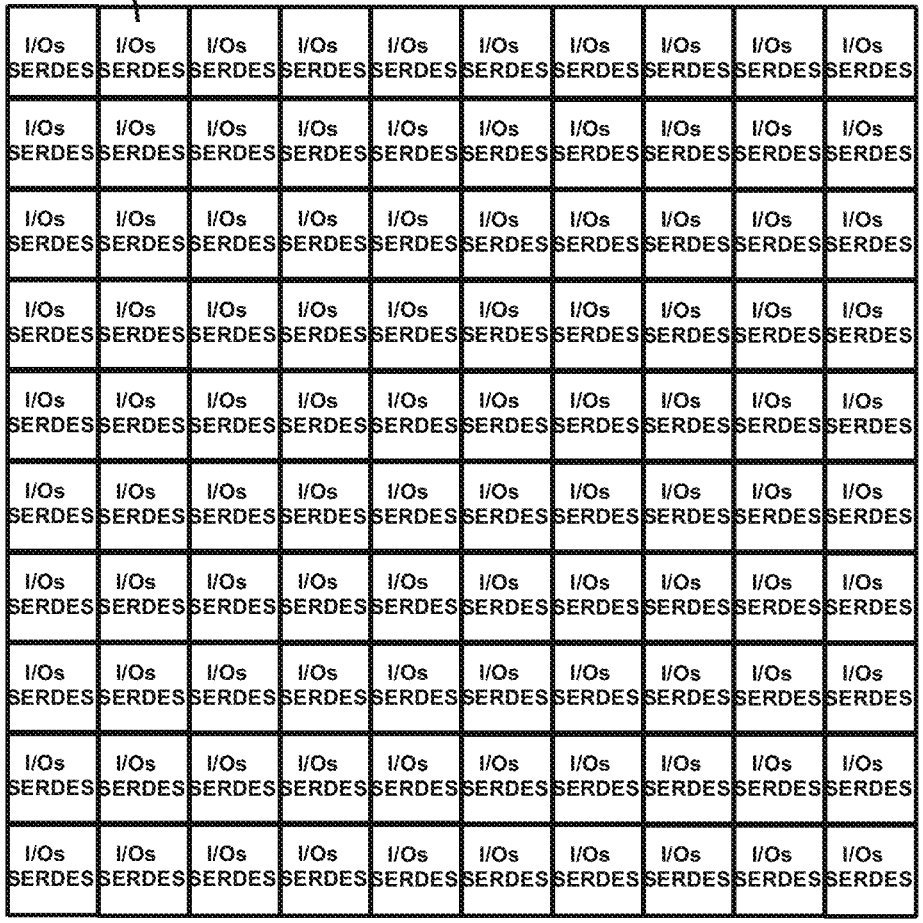

FIG. 10F is a drawing illustration of another reticle site on a wafer including tiles of I/Os 1000F. This could include groups of SerDes. Such a wafer may be a continuous tile of I/Os. The die diced out of such wafer may be an I/O die component of a 3D integrated system. It could include an antifuse layer or other form of configuration technique such as SRAM to configure these I/Os of the configurable I/O die to their function in the configurable system. Yet it might be constructed as a multiplicity of I/O connected by a multiplicity of Through Silicon Vias to the configurable die, which may also be used to configure the raw I/Os of the I/O die to the desired function in the configurable system.

Figure 11A:
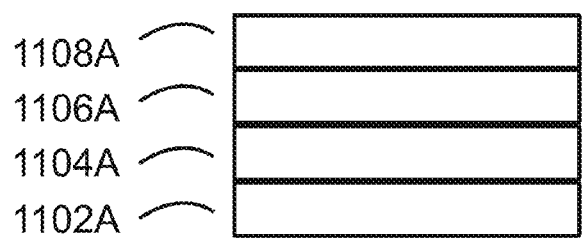
FIGS. 11A-11E are exemplary drawing illustrations of a Configurable system.
Figure 11B:
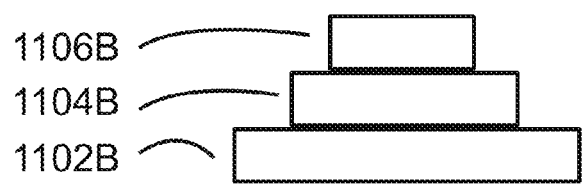
Figure 11C:
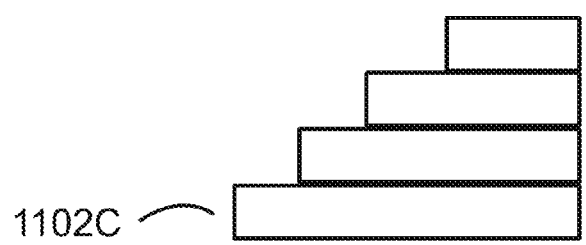
Figure 11D:
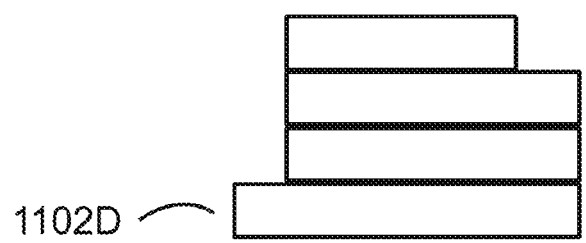
Figure 11E:
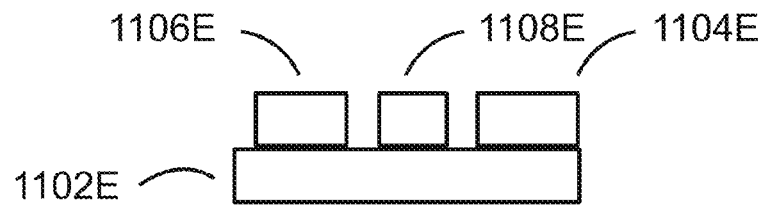

FIGS. 11A through 11E illustrate integrated circuit systems. An integrated circuit system that may include configurable die could be called a Configurable System. FIG. 11A through 11E are drawings illustrating integrated circuit systems or Configurable Systems with various options of die sizes within the 3D system and alignments of the various dies. FIG. 11E presents a 3D structure with some lateral options. In such case a few dies 1104E, 1106E, 1108E may be placed on the same underlying die 1102E allowing relatively smaller die to be placed on the same mother die. For example die 1104E could be a SerDes die while die 1106E could be an analog data acquisition die. It could be advantageous to fabricate these die on different wafers using different process and then integrate them into one system. When the dies are relatively small then it might be useful to place them side by side (such as FIG. 11E) instead of one on top of the other (FIGS. 11A-D).

The Through Silicon Via technology is constantly evolving. In the early generations such via would be 10 microns in diameter. Advanced work now demonstrating Through Silicon Via with less than a about 1-micron diameter. Yet, the density of connections horizontally within the die may typically still be far denser than the vertical connection using Through Silicon Via.

In another alternative of the present invention the logic portion could be broken up into multiple dies, which may be of the same size, to be integrated to a 3D configurable system. Similarly it could be advantageous to divide the memory into multiple dies, and so forth, with other functions.

Recent work on 3D integration may show effective ways to bond wafers together and then dice those bonded wafers.

This kind of assembly may lead to die structures such as shown in FIG. 11A or FIG. 11D. Alternatively for some 3D assembly techniques it may be better to have dies of different sizes. Furthermore, breaking the logic function into multiple vertically integrated dies may be used to reduce the average length of some of the heavily loaded wires such as clock signals and data buses, which may, in turn, improve performance.

Figure 12A:
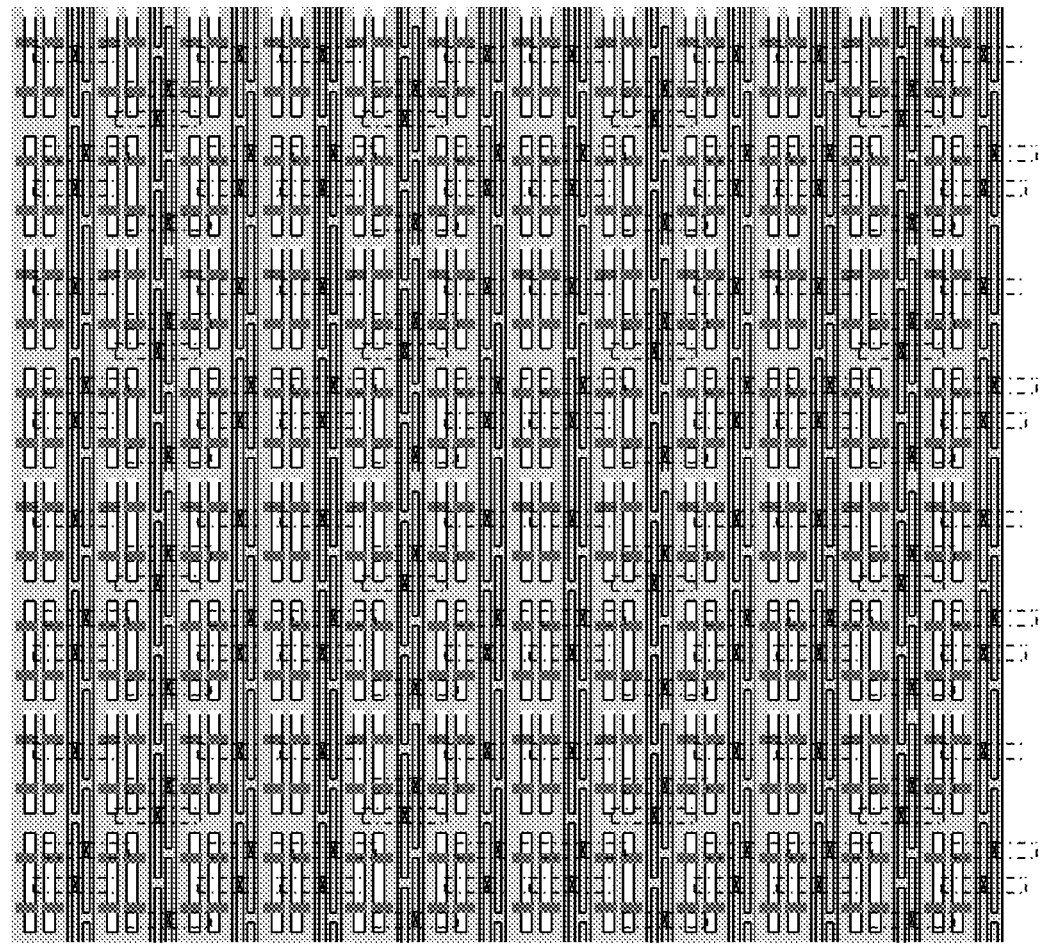
FIGS. 12A-12G are exemplary drawing illustrations of continuous transistor arrays.
Figure 12B:
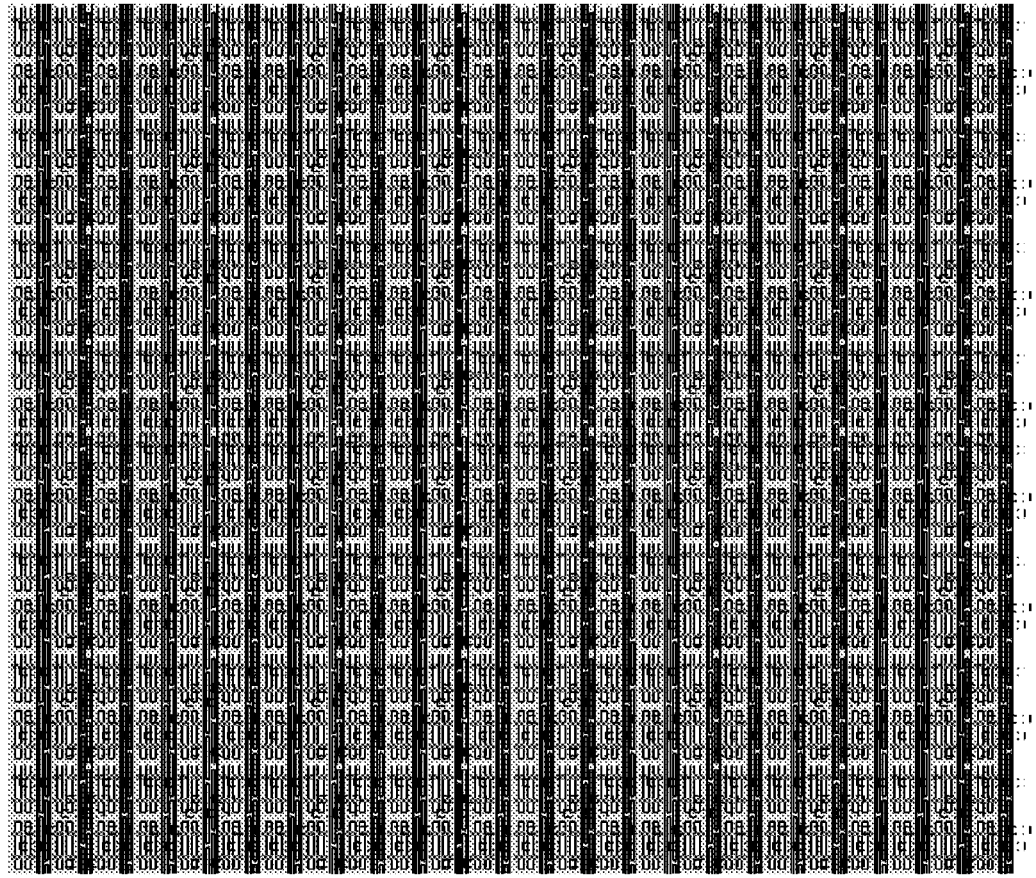
Figure 12C:
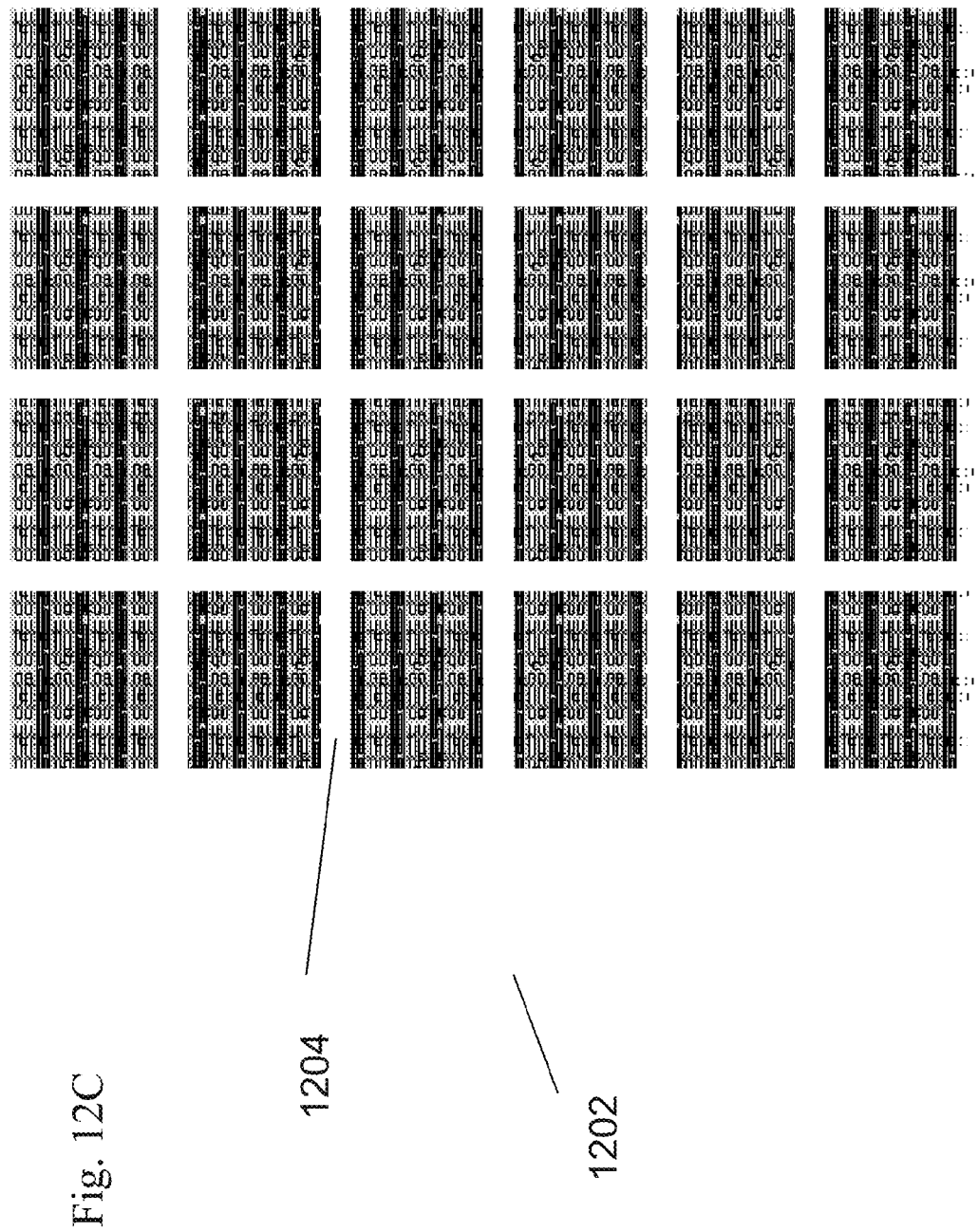

An additional variation of the present invention may be the adaptation of the continuous array (presented in relation to FIGS. 9 and 10) to the general logic device and even more so for the 3D IC system. Lithography limitations may pose considerable concern to advanced device design. Accordingly regular structures may be highly desirable and layers may be constructed in a mostly regular fashion and in most cases with one orientation at a time. Additionally, highly vertically-connected 3D IC system could be most efficiently constructed by separating logic memories and I/O into dedicated layers. For a logic-only layer, the structures presented in FIG. 76 or FIG. 78A-C of the incorporated parent specification could be used extensively, as illustrated in FIG. 12. In such a case, the repeating logic pattern 1202 could be made full reticle size. FIG. 12A illustrates a repeating pattern of the logic cells of FIG. 78B wherein the logic cell is repeating 8×12 times. FIG. 12B illustrates the same logic repeating many more times to fully fill a reticle. The multiple masks used to construct the logic terrain could be used for multiple logic layers within one 3D IC and for multiple ICs. Such a repeating structure may include the logic P and N transistors, their corresponding contact layers, and even the landing strips for connecting to the underlying layers. The interconnect layers on top of these logic terrain could be made custom per design or partially custom depending on the design methodology used. The custom metal interconnect may leave the logic terrain unused in the dicing streets area. Alternatively a dicing-streets mask could be used to etch away the unused transistors in the streets area 1204 as illustrated in FIG. 12C.

The continuous logic terrain could use any transistor style including the various transistors previously presented. An additional advantage to some of the 3D layer transfer techniques previously presented may be the option to pre-build, in high volume, transistor terrains for further reduction of 3D custom IC manufacturing costs.

Similarly a memory terrain could be constructed as a continuous repeating memory structure with a fully populated reticle. The non-repeating elements of most memories may be the address decoder and sometimes the sense circuits. Those non repeating elements may be constructed using the logic transistors of the underlying or overlying layer.

Figure 12D:
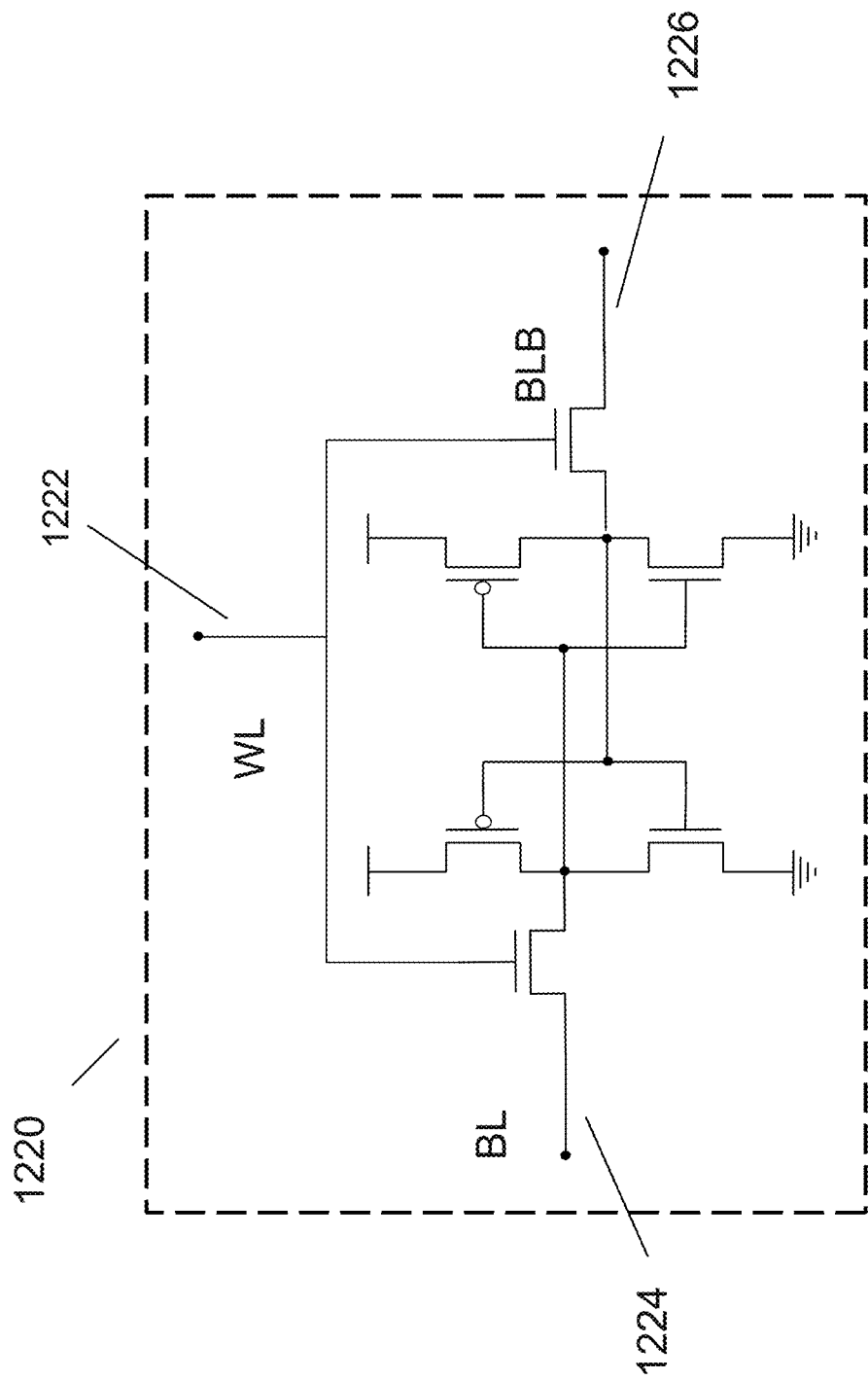

FIGS. 12D-G are drawing illustrations of an SRAM memory terrain. FIG. 12D illustrates a conventional 6 transistor SRAM bit cell 1220 controlled by Word Line (WL) 1222 and Bit Lines (BL, BLB) 1224, 1226. The SRAM bit cell may be specially designed to be very compact.

Figure 12E:
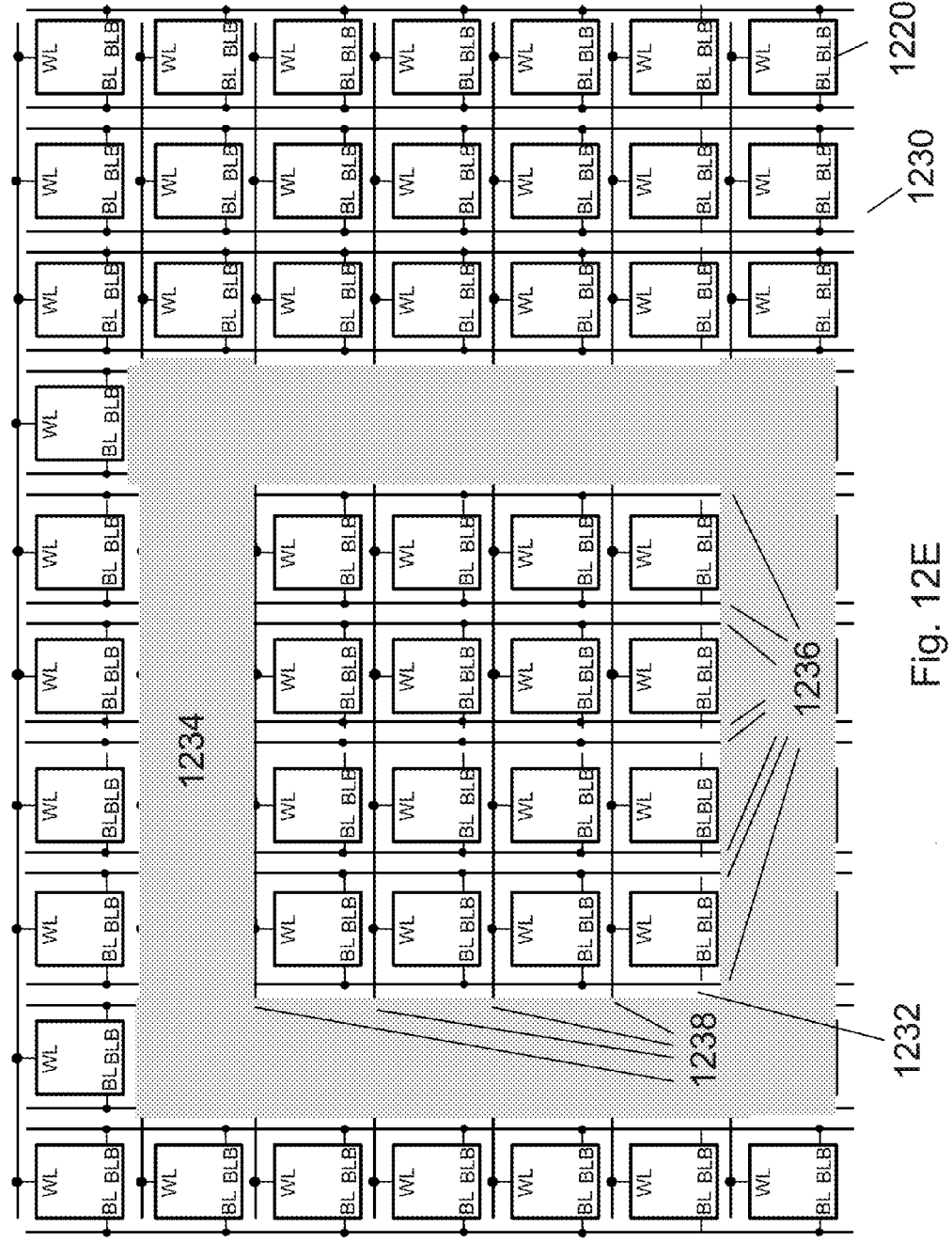

The generic continuous array 1230 may be a reticle step field sized terrain of SRAM bit cells 1220 wherein the transistor layers and even the Metal 1 layer may be used by substantially all designs. FIG. 12E illustrates such continuous array 1230 wherein a 4×4 memory block 1232 may be defined by custom etching the cells around it 1234. The memory may be customized by custom metal masks such metal 2 and metal 3. To control the memory block the Word Lines 1238 and the Bit Lines 1236 may be connected by through layer vias to the logic terrain underneath or above it.

Figure 12F:
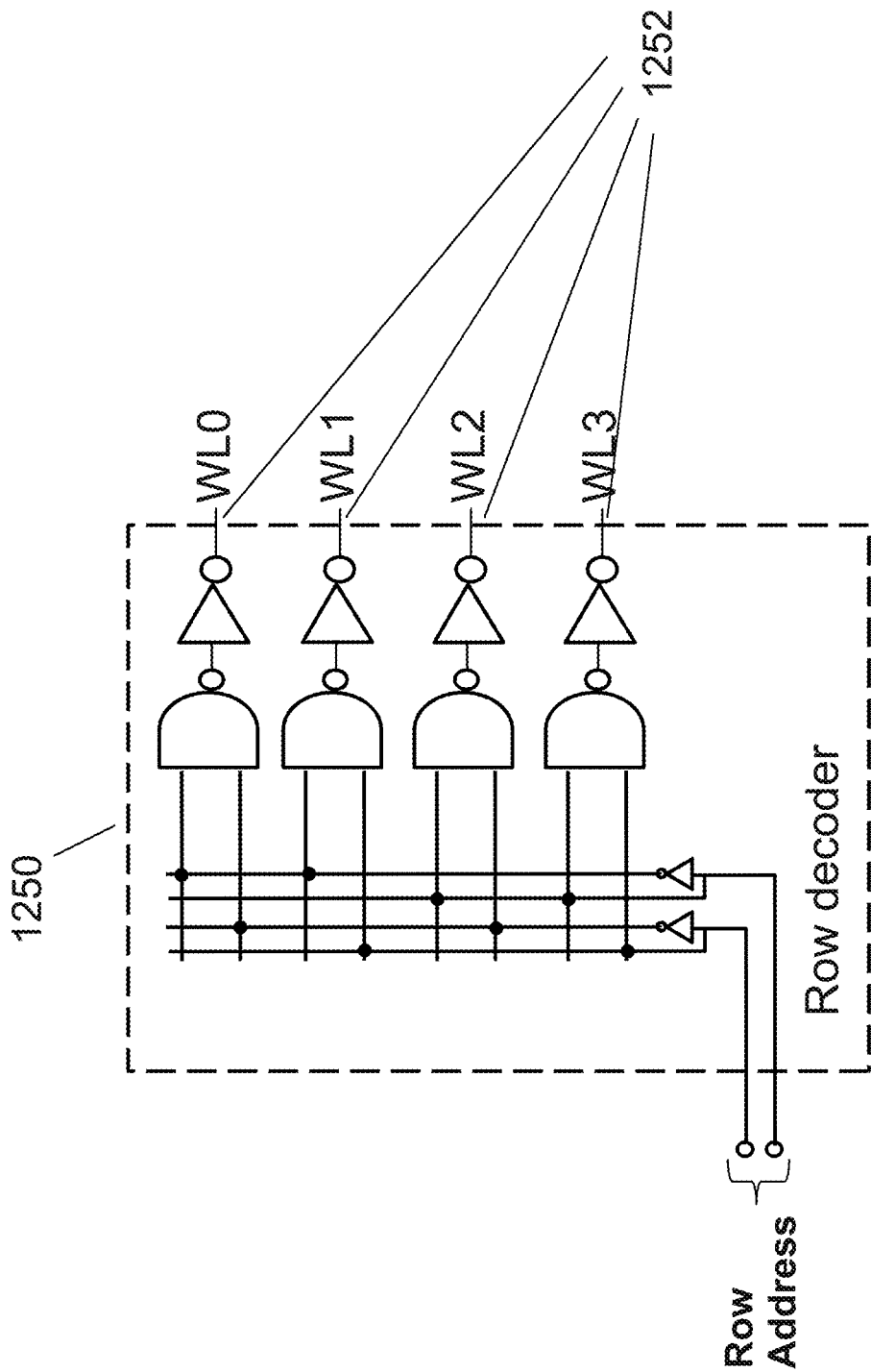
Figure 12G:
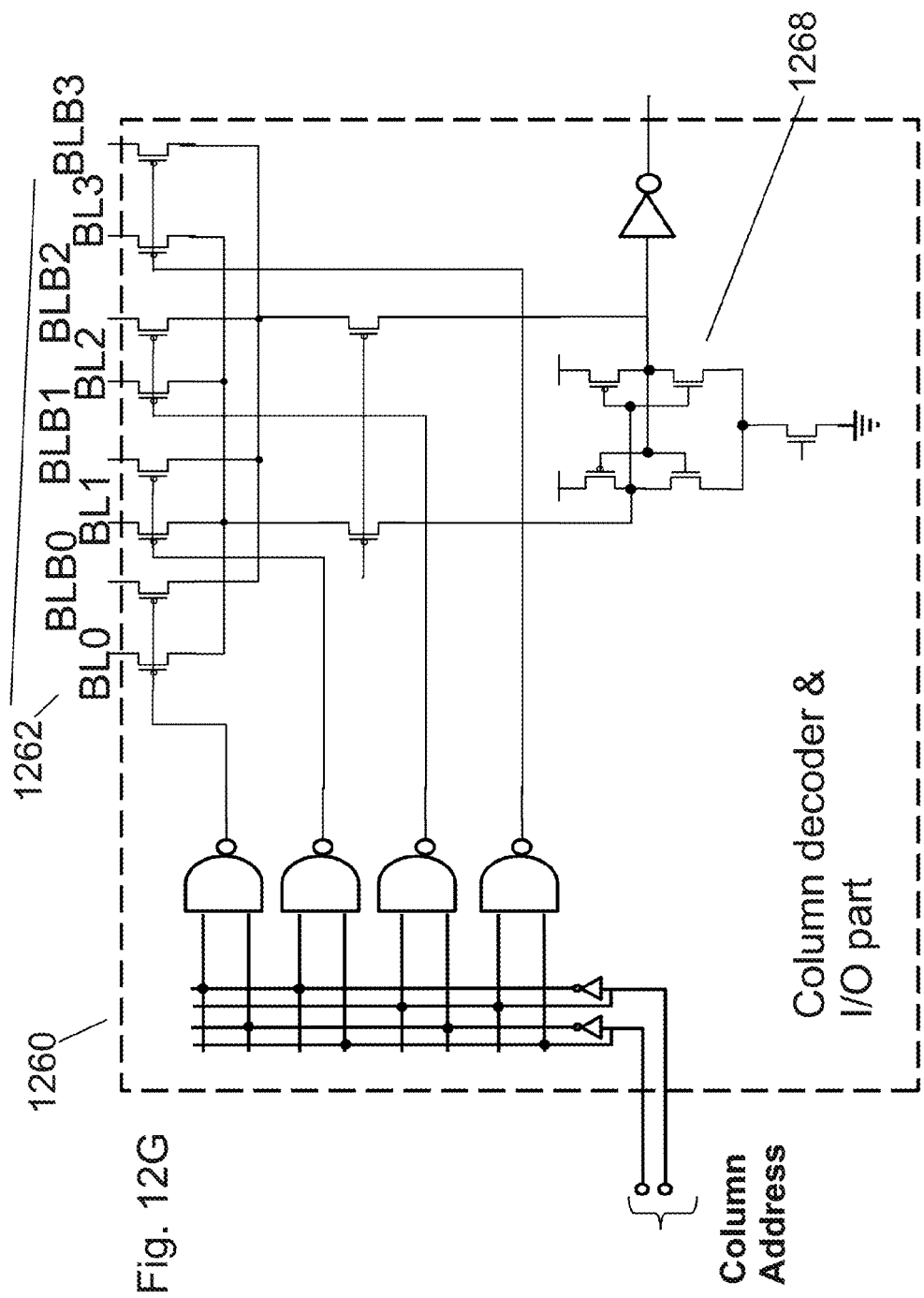

FIG. 12F illustrates a logic structure 1250 that may be constructed on the logic terrain to drive the Word Lines 1252. FIG. 12G illustrates the logic structure 1260 that may be constructed on the logic terrain to drive the Bit Lines 1262. FIG. 12G also illustrates the read sense circuit 1268 that may read the memory content from the bit lines 1262. In a similar fashion, other memory structures may be constructed from the uncommitted memory terrain using the uncommitted logic terrain close to the intended memory structure. In a similar fashion, other types of memory, such as flash or DRAM, may include the memory terrain. Furthermore, the memory terrain may be etched away at the edge of the projected die borders to define dicing streets similar to that indicated in FIG. 12C for a logic terrain.

As illustrated in FIG. 183A, the custom dicing line masking and etch referred to in the FIG. 84C discussion to create multiple thin strips of streets area 8404 for etching may be shaped to created chamfered block corners 18302 of custom blocks 18304 to relieve stress. Custom blocks 18304 may include functions, blocks, arrays, or devices of architectures such as logic, FPGA, I/O, or memory.

Figures 13A, 13B, 13C:
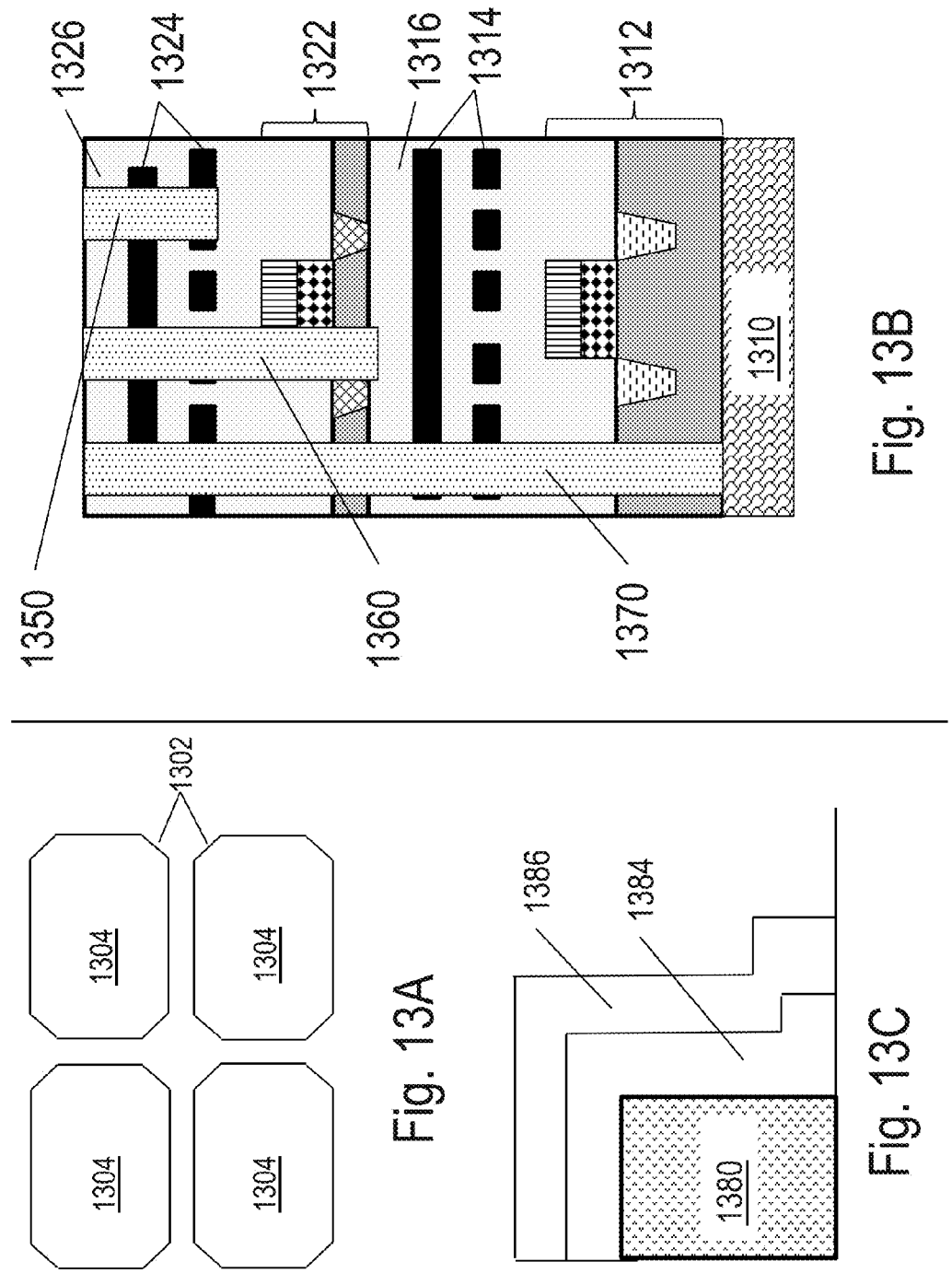
FIG. 13A is an exemplary drawing illustration of chamfering the custom function etching shape for stress relief.
FIG. 13B is an exemplary drawing illustration of potential depths of custom function etching a continuous array in 3DIC.
FIG. 13C is an exemplary drawing illustration of a method to passivate the edge of a custom function etch of a continuous array in 3DIC.

As illustrated in FIG. 13B, this custom function etching and chamfering may extend through the BEOL metallization of one device layer of the 3DIC stack as shown in first structure 1350, or extend through the entire 3DIC stack to the bottom substrate and shown in second structure 1370, or may truncate at the isolation of any device layer in the 3D stack as shown in third structure 1360. The cross sectional view of an exemplary 3DIC stack may include second layer BEOL dielectric 1326, second layer interconnect metallization 1324, second layer transistor layer 1322, substrate layer BEOL dielectric 1316, substrate layer interconnect metallization 1314, substrate transistor layer 1312, and substrate 1310.

Passivation of the edge created by the custom function etching may be accomplished as follows. If the custom function etched edge is formed on a layer or strata that is not the topmost one, then it may be passivated or sealed by filling the etched out area with dielectric, such as a Spin-On-Glass (SOG) method, and CMPing flat to continue to the next 3DIC layer transfer. As illustrated in FIG. 13C, the topmost layer custom function etched edge may be passivated with an overlapping layer or layers of material including, for example, oxide, nitride, or polyimide. Oxide may be deposited over custom function etched block edge 1380 and may be lithographically defined and etched to overlap the custom function etched block edge 1380 shown as oxide structure 1384. Silicon nitride may be deposited over wafer and oxide structure 1384, and may be lithographically defined and etched to overlap the custom function etched block edge 1380 and oxide structure 1384, shown as nitride structure 1386.

In such way a single expensive mask set can be used to build many wafers for different memory sizes and finished through another mask set that is used to build many logic wafers that can be customized by few metal layers.

Person skilled in the art will recognize that it is now possible to assemble a true monolithic 3D stack of monocrystalline silicon layers or strata with high performance devices using advanced lithography that repeatedly reuse same masks, with only few custom metal masks for each device layer. Such person will also appreciate that one can stack in the same way a mix of disparate layers, some carrying transistor array for general logic and other carrying larger scale blocks such as memories, analog elements, Field Programmable Gate Array (FPGA), and I/O. Moreover, such a person would also appreciate that the custom function formation by etching may be accomplished with masking and etching processes such as, for example, a hard-mask and Reactive Ion Etching (RIE), or wet chemical etching, or plasma etching. Furthermore, the passivation or sealing of the custom function etching edge may be stair stepped so to enable improved sidewall coverage of the overlapping layers of passivation material to seal the edge In this document, various terms may have been used while generally referring to the element. For example, "house" may refer to the first mono-crystalline layer with its transistors and metal interconnection layer or layers. This first mono-crystalline layer may have also been referred to as the main wafer and sometimes as the acceptor wafer and sometimes as the base wafer.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems, such as, for example, mobile phones, smart phone, and cameras. For example, incorporating the 3D IC semiconductor devices according to some embodiments of the invention within these mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention.

In U.S. application Ser. No. 12/903,862, filed by some of the inventors and assigned to the same assignee, a 3D micro display and a 3D image sensor are presented. Integrating one or both of these with complex logic and or memory could be very effective for mobile system. Additionally, mobile systems could be customized to some specific market applications by integrating some embodiments of the invention.

Moreover, utilizing 3D programmable logic or 3D gate array as had been described in some embodiments of the invention could be very effective in forming flexible mobile systems.

The need to reduce power to allow effective use of limited battery energy and also the lightweight and small form factor derived by highly integrating functions with low waste of interconnect and substrate could be highly benefited by the redundancy and repair idea of the 3D monolithic technology as has been presented in embodiments of the invention. This unique technology could enable a mobile device that would be lower cost to produce or would require lower power to operate or would provide a lower size or lighter carry weight, and combinations of these 3D monolithic technology features may provide a competitive or desirable mobile system.

Another unique market that may be addressed by some of the embodiments of the invention could be a street corner camera with supporting electronics. The 3D image sensor described in the Ser. No. 12/903,862 application would be very effective for day/night and multi-spectrum surveillance applications. The 3D image sensor could be supported by integrated logic and memory such as, for example, a monolithic 3D IC with a combination of image processing and image compression logic and memory, both high speed memory such as 3D DRAM and high density non-volatile memory such as 3D NAND or RRAM or other memory, and other combinations. This street corner camera application would require low power, low cost, and low size or any combination of these features, and could be highly benefited from the 3D technologies described herein.

3D ICs according to some embodiments of the invention could enable electronic and semiconductor devices with much a higher performance as a result from the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These potential advantages could lead to more powerful computer systems and improved systems that have embedded computers.

Some embodiments of the invention may enable the design of state of the art electronic systems at a greatly reduced non-recurring engineering (NRE) cost by the use of high density 3D FPGAs or various forms of 3D array base ICs with reduced custom masks as described previously. These systems could be deployed in many products and in many market segments. Reduction of the NRE may enable new product family or application development and deployment early in the product lifecycle by lowering the risk of upfront investment prior to a market being developed. The above potential advantages may also be provided by various mixes such as reduced NRE using generic masks for layers of logic and other generic masks for layers of memories and building a very complex system using the repair technology to overcome the inherent yield limitation. Another form of mix could be building a 3D FPGA and add on it 3D layers of customizable logic and memory so the end system could have field programmable logic on top of the factory customized logic. There may be many ways to mix the many innovative elements to form 3D IC to support the need of an end system, including using multiple devices wherein more than one device incorporates elements of embodiments of the invention. An end system could benefit from a memory device utilizing embodiments of the invention 3D memory integrated together with a high performance 3D FPGA integrated together with high density 3D logic, and so forth. Using devices that can use one or multiple elements according to some embodiments of the invention may allow for better performance or lower power and other illustrative advantages resulting from the use of some embodiments of the invention to provide the end system with a competitive edge. Such end system could be electronic based products or other types of systems that may include some level of embedded electronics, such as, for example, cars, and remote controlled vehicles.

Commercial wireless mobile communications have been developed for almost thirty years, and play a special role in today's information and communication technology Industries. The mobile wireless terminal device has become part of our life, as well as the Internet, and the mobile wireless terminal device may continue to have a more important role on a worldwide basis. Currently, mobile (wireless) phones are undergoing much development to provide advanced functionality. The mobile phone network is a network such as a GSM, GPRS, or WCDMA, 3G and 4G standards, and the network may allow mobile phones to communicate with each other. The base station may be for transmitting (and receiving) information to the mobile phone.

A typical mobile phone system may include, for example, a processor, a flash memory, a static random access memory, a display, a removable memory, a radio frequency (RF) receiver/transmitter, an analog base band (ABB), a digital base band (DBB), an image sensor, a high-speed bi-directional interface, a keypad, a microphone, and a speaker. A typical mobile phone system may include a multiplicity of an element, for example, two or more static random access memories, two or more displays, two or more RF receiver/transmitters, and so on.

Conventional radios used in wireless communications, such as radios used in conventional cellular telephones, typically may include several discrete RF circuit components. Some receiver architectures may employ superheterodyne techniques. In a superheterodyne architecture an incoming signal may be frequency translated from its radio frequency (RF) to a lower intermediate frequency (IF). The signal at IF may be subsequently translated to baseband where further digital signal processing or demodulation may take place. Receiver designs may have multiple IF stages. The reason for using such a frequency translation scheme is that circuit design at the lower IF frequency may be more manageable for signal processing. It is at these IF frequencies that the selectivity of the receiver may be implemented, automatic gain control (AGC) may be introduced, etc.

A mobile phone's need of a high-speed data communication capability in addition to a speech communication capability has increased in recent years. In GSM (Global System for Mobile communications), one of European Mobile Communications Standards, GPRS (General Packet Radio Service) has been developed for speeding up data communication by allowing a plurality of time slot transmissions for one time slot transmission in the GSM with the multiplexing TDMA (Time Division Multiple Access) architecture. EDGE (Enhanced Data for GSM Evolution) architecture provides faster communications over GPRS.

4th Generation (4G) mobile systems aim to provide broadband wireless access with nominal data rates of 100 Mbit/s. 4G systems may be based on the 3GPP LTE (Long Term Evolution) cellular standard, WiMax or Flash-OFDM wireless metropolitan area network technologies. The radio interface in these systems may be based on all-IP packet switching, MIMO diversity, multi-carrier modulation schemes, Dynamic Channel Assignment (DCA) and channel-dependent scheduling.

Prior art such as U.S. application Ser. No. 12/871,984 may provide a description of a mobile device and its block-diagram.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following terms are generally defined:

(1) Mobile computing/communication device (MCD): is a device that may be a mobile communication device, such as a cell phone, or a mobile computer that performs wired and/or wireless communication via a connected wireless/wired network. In some embodiments, the MCD may include a combination of the functionality associated with both types of devices within a single standard device (e.g., a smart phones or personal digital assistant (PDA)) for use as both a communication device and a computing device.

Some embodiments of the invention may include alternative techniques to build IC (Integrated Circuit) devices including techniques and methods to construct 3D IC systems. Some embodiments of the invention may enable device solutions with far less power consumption than prior art, or with more functionality in a smaller physical footprint. These device solutions could be very useful for the growing application of Autonomous in vivo Electronic Medical (AEM) devices and AEM systems such as ingestible "camera pills," implantable insulin dispensers, implantable heart monitoring and stimulating devices, and the like. One such ingestible "camera pill" is the Philips' remote control "iPill". For example, incorporating the 3D IC semiconductor devices according to some embodiments of the invention within these AEM devices and systems could provide superior autonomous units that could operate much more effectively and for a much longer time than with prior art technology. Sophisticated AEM systems may be greatly enhanced by complex electronics with limited power budget. The 3D technology described in many of the embodiments of the invention would allow the construction of a low power high complexity AEM system. For example it would be possible to integrate into a small form function a complex logic circuit with high density high speed memory utilizing some of the 3D DRAM embodiments herein and to add some non-volatile 3D NAND charge trap or RRAM described in embodiments herein. Also in another application Ser. No. 12/903,862 filed by some of the inventors and assigned to the same assignee a 3D micro display and a 3D image sensor are presented. Integrating one or both to complex logic and or memory could be very effective for retinal implants. Additional AEM systems could be customized to some specific market applications. Utilizing 3D programmable logic or 3D gate array as has been described in some embodiments herein could be very effective. The need to reduce power to allow effective use of battery and also the light weight and small form factor derived by highly integrating functions with low waste of interconnect and substrate could benefit from the redundancy and repair idea of the 3D monolithic technology as has been presented in some of the inventive embodiments herein. This unique technology could enable disposable AEM devices that would be at a lower cost to produce and/or would require lower power to operate and/or would require lower size and/or lighter to carry and combination of these features to form a competitive or desirable AEM system.

3D ICs according to some embodiments of the invention could also enable electronic and semiconductor devices with a much higher performance due to the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These advantages could lead to more powerful computer systems and improved systems that have embedded computers.

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm, employ nickel silicides to improve deep submicron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et. al., IMEC ESS Circuits, 2003; and "65 and 45-nm Devices—an Overview", D. James, Semicon West, July 2008, ctr_024377. To achieve the lowest nickel silicide contact and source/drain resistances, the nickel on silicon can be heated to about 450° C.

Thus it may be desirable to enable low resistances for process flows in this document where the post layer transfer temperature exposures may remain under about 400° C. due to metallization, such as, for example, copper and aluminum, and low-k dielectrics being present.

For junction-less transistors (JLTs), in particular, forming contacts can be a challenge. This may be because the doping of JLTs should be kept low (below about $0.5-5\times10^{19}/cm^3$ or so) to enable good transistor operation but should be kept high (above about $0.5-5\times10^{19}/cm^3$ or so) to enable low contact resistance. A technique to obtain low contact resistance at lower doping values may therefore be desirable. One such embodiment of the invention may be by utilizing silicides with different work-functions for n type JLTs than for p type JLTs to obtain low resistance at lower doping values. For example, high work function materials, including, such materials as, Palladium silicide, may be used to make contact to p-type JLTs and lower work-function materials, including, such as, Erbium silicide, may be used to make contact to n-type JLTs. These types of approaches are not generally used in the manufacturing of planar inversion-mode MOSFETs. This may be due to separate process steps and increased cost for forming separate contacts to n type and p type transistors on the same device layer. However, for 3D integrated approaches where p-type JLTs may be stacked above n-type JLTs and vice versa, it can be not costly to form silicides with uniquely optimized work functions for n type and p type transistors. Furthermore, for JLTs where contact resistance may be an issue, the additional cost of using separate silicides for n type and p type transistors on the same device layer may be acceptable.

The example process flow shown below may form a Recessed Channel Array Transistor (RCAT) with low contact resistance, but this or similar flows may be applied to other process flows and devices, such as, for example, S-RCAT, JLT, V-groove, JFET, bipolar, and replacement gate flows.

Figure 14A:
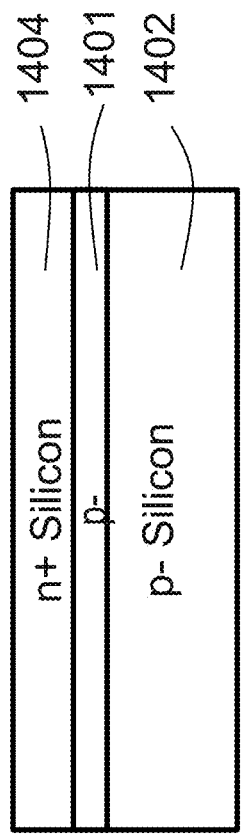
FIGS. 14A-14I are exemplary drawing illustrations of formation of a recessed channel array transistor with source and drain silicide.

A planar n-channel Recessed Channel Array Transistor (RCAT) with metal silicide source & drain contacts suitable for a 3D IC may be constructed. As illustrated in FIG. 14A, a P− substrate donor wafer 1402 may be processed to include wafer sized layers of N+ doping 1404, and P− doping 1401 across the wafer. The N+ doped layer 1404 may be formed by ion implantation and thermal anneal. In addition, P− doped layer 1401 may have additional ion implantation and anneal processing to provide a different dopant level than P− substrate donor wafer 1402. P− doped layer 1401 may also have graded P− doping to mitigate transistor performance issues, such as, for example, short channel effects, after the RCAT may be formed. The layer stack may alternatively be formed by successive epitaxially deposited doped silicon layers of P− doping 1401 and N+ doping 1404, or by a combination of epitaxy and implantation. Annealing of implants and doping may utilize optical annealing techniques or types of Rapid Thermal Anneal (RTA or spike) or flash anneal.

Figure 14B:
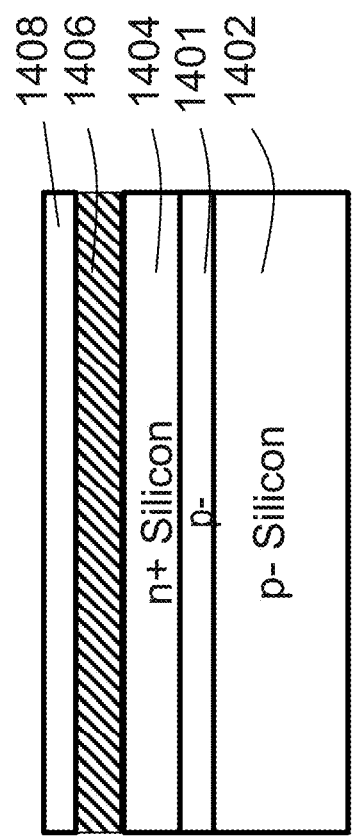

As illustrated in FIG. 14B, a silicon reactive metal, such as, for example, Nickel or Cobalt, may be deposited onto N+ doped layer 1404 and annealed, utilizing anneal techniques such as, for example, RTA, flash anneal, thermal, or optical, thus forming metal silicide layer 1406. The top surface of P− substrate donor wafer 1402 may be prepared for oxide wafer bonding with a deposition of an oxide to form oxide layer 1408.

Figure 14C:
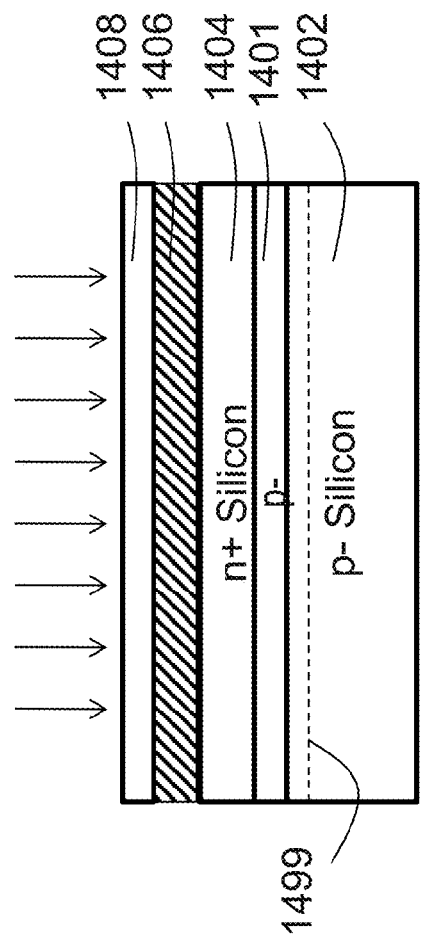

As illustrated in FIG. 14C, a layer transfer demarcation plane (shown as dashed line) 1499 may be formed by hydrogen implantation or other methods as previously described.

Figure 14D:
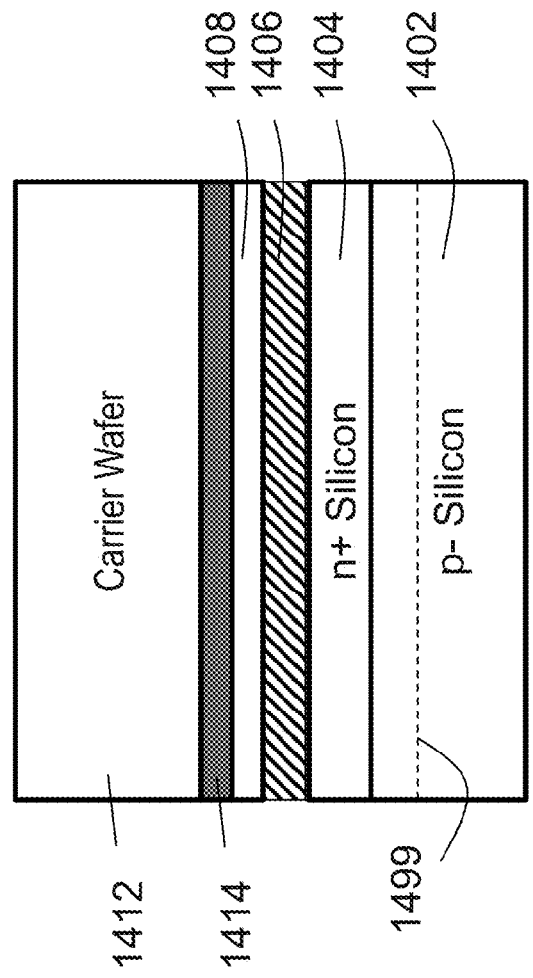

As illustrated in FIG. 14D P− substrate donor wafer 1402 with layer transfer demarcation plane 1499, P− doped layer 1401, N+ doped layer 1404, metal silicide layer 1406, and oxide layer 1408 may be temporarily bonded to carrier or holder substrate 1412 with a low temperature process that may facilitate a low temperature release. The carrier or holder substrate 1412 may be a glass substrate to enable state of the art optical alignment with the acceptor wafer. A temporary bond between the carrier or holder substrate 1412 and the P− substrate donor wafer 1402 may be made with a polymeric material, such as, for example, polyimide DuPont HD3007, which can be released at a later step by laser ablation, Ultra-Violet radiation exposure, or thermal decomposition, shown as adhesive layer 1414 in the incorporated parent specification. Alternatively, a temporary bond may be made with uni-polar or bi-polar electrostatic technology such as, for example, the Apache tool from Beam Services Inc.

Figure 14E:
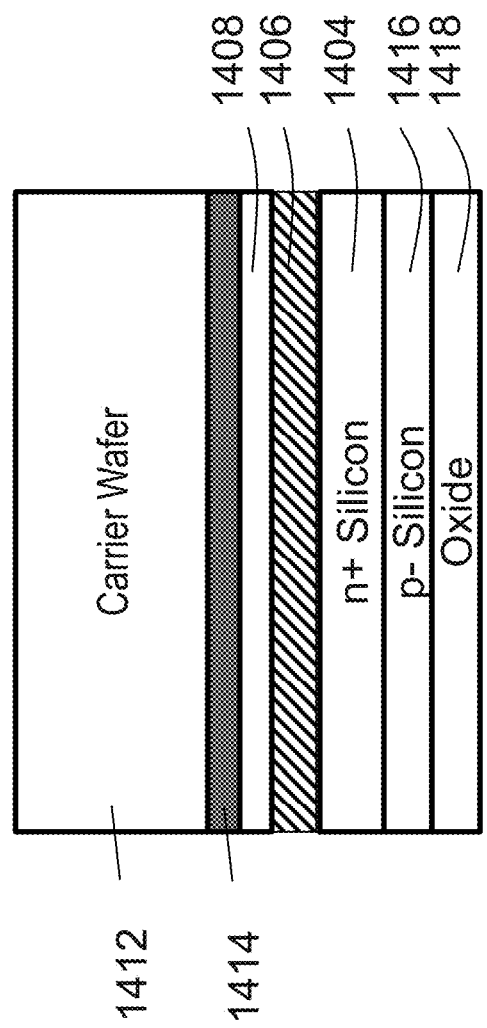

As illustrated in FIG. 14E, the portion of the P− substrate donor wafer 1402 that is below the layer transfer demarcation plane 1499 may be removed by cleaving or other processes as previously described, such as, for example, ion-cut or other methods. The remaining donor wafer P− doped layer 1401 may be thinned by chemical mechanical polishing (CMP) so that the P− layer 1416 may be formed to the desired thickness. Oxide layer 1418 may be deposited on the exposed surface of P− layer 1416.

Figure 14F:
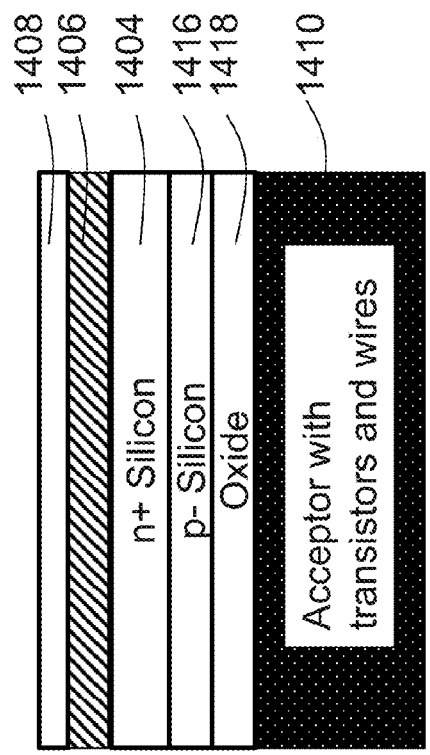

As illustrated in FIG. 14F, both the P− substrate donor wafer 1402 and acceptor substrate 1410 or wafer may be prepared for wafer bonding as previously described and then low temperature (less than about 400° C.) aligned and oxide to oxide bonded. Acceptor substrate 1410, as described previously, may include, for example, transistors, circuitry, metal, such as, for example, aluminum or copper, interconnect wiring, and through layer via metal interconnect strips or pads. The carrier or holder substrate 1412 may then be released using a low temperature process such as, for example, laser ablation. Oxide layer 1418, P− layer 1416, N+ doped layer 1404, metal silicide layer 1406, and oxide layer 1408 may have been layer transferred to acceptor substrate 1410. The top surface of oxide layer 1408 may be chemically or mechanically polished. Now RCAT transistors can be formed with low temperature (less than about 400° C.) processing and aligned to the acceptor substrate 1410 alignment marks (not shown).

Figure 14G:
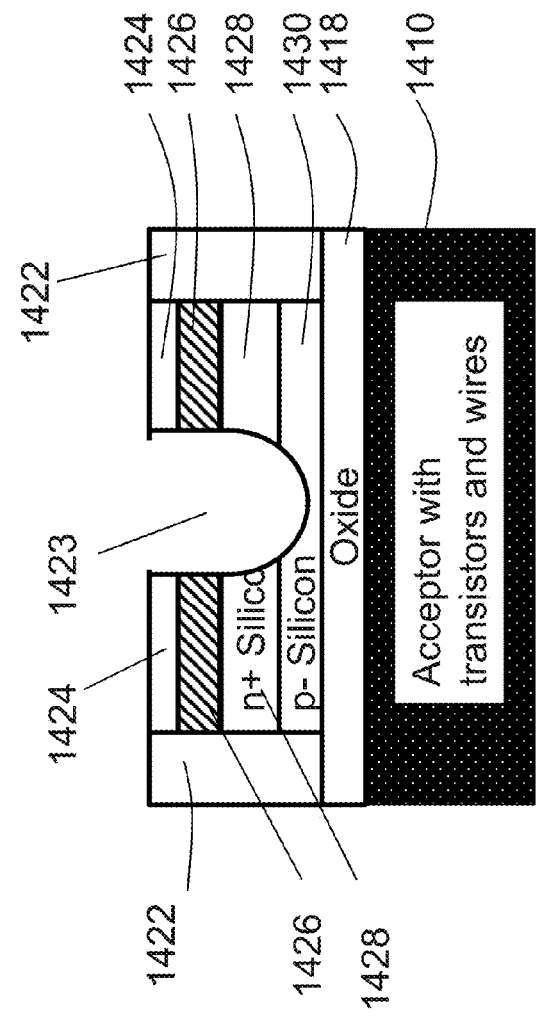

As illustrated in FIG. 14G, the transistor isolation regions 1422 may be formed by mask defining and then plasma/RIE etching oxide layer 1408, metal silicide layer 1406, N+ doped layer 1404, and P− layer 1416 to the top of oxide layer 1418. A low-temperature gap fill oxide may be deposited and chemically mechanically polished, with the oxide remaining in isolation regions 1422. Then the recessed channel 1423 may be mask defined and etched. The recessed channel surfaces and edges may be smoothed by wet chemical or plasma/RIE etching techniques to mitigate high field effects. These process steps may form oxide regions 1424, metal silicide source and drain regions 1426, N+ source and drain regions 1428 and P− channel region 1430.

Figure 14H:
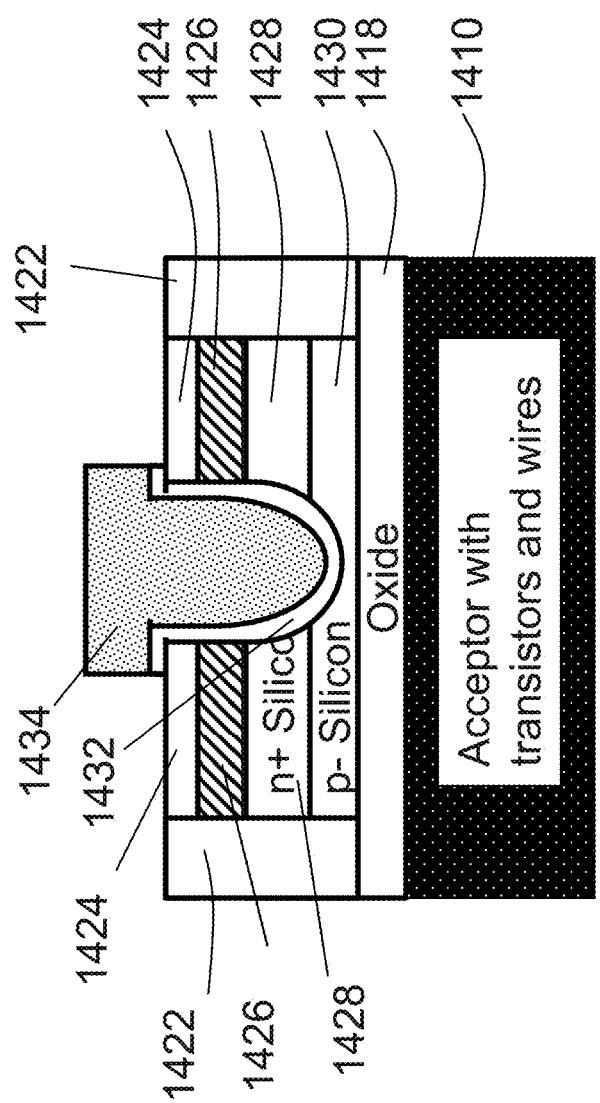

As illustrated in FIG. 14H, a gate dielectric 1432 may be formed and a gate metal material may be deposited. The gate dielectric 1432 may be an atomic layer deposited (ALD) gate dielectric that may be paired with a work function specific gate metal in the industry standard high k metal gate process schemes described previously. Or the gate dielectric 1432 may be formed with a low temperature oxide deposition or low temperature microwave plasma oxidation of the silicon surfaces and then a gate material such as, for example, tungsten or aluminum, may be deposited. The gate material may be chemically mechanically polished, and the gate area defined by masking and etching, thus forming gate electrode 1434.

Figure 14I:
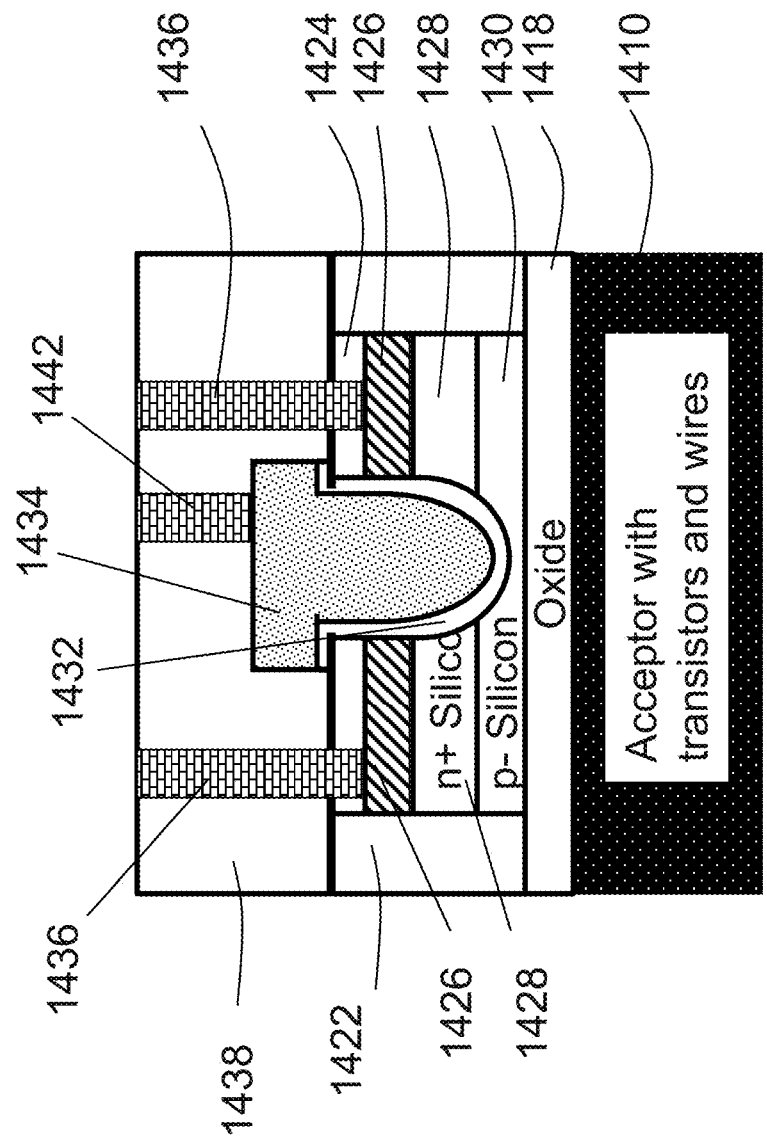

As illustrated in FIG. 14I, a low temperature thick oxide 1438 may be deposited and source, gate, and drain contacts, and through layer via (not shown) openings may be masked and etched preparing the transistors to be connected via metallization. Thus gate contact 1442 may connect to gate electrode 1434, and source & drain contacts 1436 may connect to metal silicide source and drain regions 1426.

Persons of ordinary skill in the art will appreciate that the illustrations in FIGS. 14A through 14I are exemplary only and are not drawn to scale. Such skilled persons will further appreciate that many variations may be possible such as, for example, the temporary carrier substrate may be replaced by a carrier wafer and a permanently bonded carrier wafer flow such as described in at least FIG. 40 of the incorporated parent specification may be employed. Many other modifications within the scope of illustrated embodiments of the invention will suggest themselves to such skilled persons after reading this specification. Thus the invention is to be limited only by the appended claims.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Rather, the scope of the invention includes both combinations and sub-combinations of the various features described herein above as well as modifications and variations which would occur to such skilled persons upon reading the foregoing description. Thus the invention is to be limited only by the appended claims.

What is claimed is:

1. A 3D semiconductor device, comprising:
   a first layer comprising first transistors;
   a first interconnection layer interconnecting at least said first transistors; and
   a second layer comprising second transistors,
      wherein said second layer thickness is less than 2 microns and greater than 5 nm,
      wherein said second layer is overlying said first layer,
      wherein said second layer comprises dice lines formed by an etch step, said dice lines form regions comprising portions of said second transistors, and
      wherein said first transistors each have a gate that is positioned below a first gate dielectric and said second transistors each have a gate that is positioned above a second gate dielectric,
      wherein at least two of said second transistors have a common shared diffusion, and
      wherein said first interconnection layer comprises copper or aluminum.

2. A 3D semiconductor device according to claim 1, wherein said etch step comprises an etch of a prior structure defined by a prior etch step.

3. A 3D semiconductor device according to claim 1, further comprising:
   a heat-spreader layer disposed between said first layer and said second layer.

4. A 3D semiconductor device according to claim 1, further comprising:
   at least one thermally conductive and electrically non-conducting contact to said second layer.

5. A 3D semiconductor device, comprising:
   a first layer comprising first transistors;
   a first interconnection layer interconnecting at least said first transistors; and
   a second layer comprising second transistors, and
   a conductive layer disposed underneath said second layer,
      wherein said second layer thickness is less than 2 microns and greater than 5 nm,
      wherein said second layer is overlying said first layer,
      wherein said second layer comprises dice lines formed by an etch step, said dice lines form regions comprising portions of said second transistors, and
      wherein said first transistors each have a gate that is positioned below a first gate dielectric and said second transistors each have a gate that is positioned above a second gate dielectric,
      wherein at least two of said second transistors have a common shared diffusion,
      wherein said first interconnection layer comprises copper or aluminum, and
      wherein said conductive layer provides power to at least one of said second transistors.

6. A 3D semiconductor device, comprising:
   a first layer comprising first transistors;
   a first interconnection layer interconnecting at least said first transistors; and
   a second layer comprising second transistors,
      wherein said second layer thickness is less than 2 microns and greater than 5 nm,
      wherein said second layer is overlying said first layer,
      wherein said second layer comprises dice lines formed by an etch step, said dice lines form regions comprising portions of said second transistors, and
      wherein said first transistors each have a gate that is positioned below a first gate dielectric and said second transistors each have a gate that is positioned above a second gate dielectric,
      wherein at least two of said second transistors have a common shared diffusion,
      wherein said first interconnection layer comprises copper or aluminum, and
      wherein at least one of said second transistors comprise a back-bias structure.

* * * * *